United States Patent
Murayama et al.

(10) Patent No.: US 11,175,585 B2
(45) Date of Patent: Nov. 16, 2021

(54) TREATMENT LIQUID AND TREATMENT LIQUID HOUSING BODY

(71) Applicant: FUJIFILM Corporation, Tokyo (JP)

(72) Inventors: Satoru Murayama, Haibara-gun (JP); Tetsuya Shimizu, Haibara-gun (JP); Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 71 days.

(21) Appl. No.: 16/172,027

(22) Filed: Oct. 26, 2018

(65) Prior Publication Data
US 2019/0064672 A1  Feb. 28, 2019

Related U.S. Application Data

(63) Continuation of application No. PCT/JP2017/016479, filed on Apr. 26, 2017.

(30) Foreign Application Priority Data

Apr. 28, 2016 (JP) .............................. JP2016-092057
Apr. 21, 2017 (JP) .............................. JP2017-084479

(51) Int. Cl.
*G03F 7/32* (2006.01)
*H01L 21/027* (2006.01)
(Continued)

(52) U.S. Cl.
CPC ............ *G03F 7/322* (2013.01); *G03F 7/0397* (2013.01); *G03F 7/325* (2013.01); *G03F 7/40* (2013.01);
(Continued)

(58) Field of Classification Search
CPC ................... G03F 7/322; H01L 21/0274
See application file for complete search history.

(56) References Cited

U.S. PATENT DOCUMENTS 5,580,700 A    12/1996  Rahman
6,896,927 B2 *  5/2005  Muraoka ................ B08B 17/02
                                                    257/E21.228
(Continued)

FOREIGN PATENT DOCUMENTS

JP       8-503983 A    4/1996
JP    2006-505132 A    2/2006
(Continued)

OTHER PUBLICATIONS

Office Action dated Jul. 27, 2020, from the Taiwanese Intellectual Property Office in Taiwan application No. 106114017.
(Continued)

*Primary Examiner* — Nicole M. Buie-Hatcher
*Assistant Examiner* — M. Reza Asdjodi
(74) *Attorney, Agent, or Firm* — Sughrue Mion, PLLC

(57) ABSTRACT

An object of the present invention is to provide a treatment liquid which is capable of suppressing the generation of defects of a semiconductor device and has excellent corrosion resistance and wettability. The treatment liquid of the present invention is a treatment liquid for a semiconductor device, containing at least one organic solvent selected from the group consisting of ethers, ketones, and lactones, water, and a metal component including at least one metal element selected from the group consisting of Na, K, Ca, Fe, Cu, Mg, Mn, Li, Al, Cr, Ni, Ti, and Zn, in which the content of water in the treatment liquid is 100 ppb by mass to 100 ppm by mass and the content of the metal component in the treatment liquid is 10 ppq by mass to 10 ppb by mass.

18 Claims, 1 Drawing Sheet

(51) Int. Cl.
*G03F 7/039* (2006.01)
*G03F 7/40* (2006.01)

(52) U.S. Cl.
CPC ...... *H01L 21/0271* (2013.01); *H01L 21/0274* (2013.01)

(56) References Cited

U.S. PATENT DOCUMENTS

| | | | | |
|---|---|---|---|---|
| 7,671,001 | B2 * | 3/2010 | Skee | C11D 3/0073 |
| | | | | 510/175 |
| 2001/0034312 | A1 * | 10/2001 | Imai | C01B 21/14 |
| | | | | 510/175 |
| 2005/0020463 | A1 * | 1/2005 | Ikemoto | C11D 1/72 |
| | | | | 510/175 |
| 2005/0170981 | A1 * | 8/2005 | Mun | C11D 11/0047 |
| | | | | 510/201 |
| 2006/0025320 | A1 | 2/2006 | Borner et al. | |
| 2007/0099810 | A1 * | 5/2007 | Matsunaga | C11D 3/044 |
| | | | | 510/302 |
| 2009/0142931 | A1 * | 6/2009 | Wang | H01L 21/02063 |
| | | | | 438/734 |
| 2010/0167972 | A1 * | 7/2010 | Kawase | H01L 21/02074 |
| | | | | 510/175 |
| 2012/0172273 | A1 | 7/2012 | Mizuniwa et al. | |
| 2015/0114429 | A1 * | 4/2015 | Jenq | C11D 7/3209 |
| | | | | 134/2 |
| 2016/0026088 | A1 * | 1/2016 | Yamanaka | G03F 7/0397 |
| | | | | 355/27 |
| 2016/0252819 | A1 * | 9/2016 | Sugishima | H01L 29/0847 |
| | | | | 430/258 |
| 2016/0272924 | A1 * | 9/2016 | Kajikawa | C11D 7/3209 |
| 2016/0342083 | A1 | 11/2016 | Ueba et al. | |
| 2019/0064672 | A1 * | 2/2019 | Murayama | H01L 21/0274 |
| 2019/0079409 | A1 * | 3/2019 | Takahashi | C11D 7/20 |

FOREIGN PATENT DOCUMENTS

| | | |
|---|---|---|
| JP | 2011-082261 A | 4/2011 |
| JP | 2013-045086 A | 3/2013 |
| JP | 2015-166848 A | 9/2015 |

OTHER PUBLICATIONS

International Search Report dated Jul. 25, 2017 in International Application No. PCT/JP2017/016479.
Written Opinion of the International Searching Authority dated Jul. 25, 2017 in International Application No. PCT/JP2017/016479.
International Preliminary Report on Patentability dated Oct. 30, 2018 in International Application No. PCT/JP2017/016479.

* cited by examiner

TREATMENT LIQUID AND TREATMENT LIQUID HOUSING BODY

CROSS-REFERENCE TO RELATED APPLICATIONS

This application is a Continuation of PCT International Application No. PCT/JP2017/016479 filed on Apr. 26, 2017, which claims priority under 35 U.S.C. § 119(a) to Japanese Patent Application No. 2016-092057 filed on Apr. 28, 2016 and Japanese Patent Application No. 2017-084479 filed on Apr. 21, 2017. Each of the above applications is hereby expressly incorporated by reference, in its entirety, into the present application.

BACKGROUND OF THE INVENTION

1. Field of the Invention

The present invention relates to a treatment liquid for a semiconductor device and a treatment liquid housing body.

2. Description of the Related Art

A semiconductor device such as a charge-coupled device (CCD) and a memory are known to be manufactured by forming fine electronic circuit patterns on a substrate, using a photolithographic technique.

In the production of such an electronic circuit pattern, for example, contact holes and trench patterns are formed in an insulating film formed on a substrate in some cases. Specifically, a photoresist film is formed on an insulating film and then subjected to various treatments such as an exposure treatment of irradiating the photoresist film with light, a developing treatment using a developer, and a rinsing treatment using a rinsing liquid, thereby obtaining a patternwise photoresist film. The insulating film is subjected to an etching treatment using the patternwise photoresist film thus obtained as a mask, thereby obtaining a substrate having contact holes or trench patterns formed therein.

As described above, various treatment liquids such as a developer and a rinsing liquid are used in the manufacture of a semiconductor device, and for example, JP2013-045086A discloses a developer containing various organic solvents such as ethers and ketones (claim 21 and the like).

In addition, as a treatment liquid other than the developer and the rinsing liquid, there are, for example, a pre-wet liquid for improving the coatability of a photoresist film, a remover for removing a photoresist film, and the like.

SUMMARY OF THE INVENTION

As high integration and miniaturization of semiconductor devices have recently proceeded, there is an increasing demand for, for example, further miniaturization (for example, a node of 30 nm or lower, and furthermore, a node of 10 nm or lower) of contact holes and trench patterns formed in a substrate (for example, an insulating film).

Here, the present inventors have used a treatment liquid having an organic solvent as described in JP2013-045086A as a main component in the manufacture of a semiconductor device, and as a result, they have discovered that impurities adhere to materials used for the manufacture of the semiconductor device, and thus, defects are generated.

A reason therefor is considered to be that impurities such as a metal component included in the treatment liquid become a nucleus, and particles thus formed inhibit the formation of patterns or remain in the patterns. Such a problem caused by the impurities becomes more remarkable as high integration and miniaturization of semiconductor devices have proceeded. The manufacture of a semiconductor device with a node of 30 nm or lower (furthermore, a node of 10 nm or lower) as described above has been studied, and in this case, the problem becomes more remarkable.

However, the treatment liquid used for the manufacture of a semiconductor device is used in a treatment for a metal material (for example, a metal wire) and the like. For this reason, it has been considered that a use of a treatment liquid having an organic solvent as a main component can suppress the corrosion of a metal material, but a trace amount of moisture is included in the organic solvent, which causes the corrosion of the metal material in some cases.

Therefore, the present inventors have discovered that in a case where a treatment liquid obtained by removing water from an organic solvent as described in JP2013-045086A as much as possible is used in the manufacture of a semiconductor device, the wettability of the treatment liquid is lowered. In a case where water is removed too much, the wettability of the treatment liquid for the materials used in the manufacture of a semiconductor device (for example, a substrate, an insulating film, and a resist film) becomes insufficient, and thus, the performance for the treatment liquid cannot be sufficiently exhibited.

As described above, it was difficult to satisfy corrosion resistance and wettability simultaneously.

Therefore, an object of the present invention is to provide a treatment liquid which is capable of suppressing the generation of defects of a semiconductor device, and thus, has excellent corrosion resistance and wettability. Further, another object of the present invention is to provide a treatment liquid housing body.

The present inventors have conducted extensive studies on the objects, and as a result, they have discovered that by adjusting each of the content of the specific metal component and the content of water in a treatment liquid containing a specific organic solvent to a predetermined range, generation of defects of a semiconductor device can be suppressed, and thus the corrosion resistance and the wettability are excellent, thereby leading to the present invention.

That is, the present inventors have discovered that the objects can be accomplished by the following configurations.

[1] A treatment liquid for a semiconductor device, comprising:

at least one organic solvent selected from the group consisting of ethers, ketones, and lactones;

water; and a metal component including at least one metal element selected from the group consisting of Na, K, Ca, Fe, Cu, Mg, Mn, Li, Al, Cr, Ni, Ti, and Zn, in which the content of the water in the treatment liquid is 100 ppb by mass to 100 ppm by mass, and the content of the metal component in the treatment liquid is 10 ppq by mass to 10 ppb by mass.

[2] The treatment liquid as described in [1], in which the metal component includes a particulate metal component and the content of the particulate metal component in the treatment liquid is 1 ppq by mass to 1 ppb by mass.

[3] The treatment liquid as described in [1] or [2], which is used in at least one of a rinsing liquid or a pre-wet liquid.

[4] The treatment liquid as described in any one of [1] to [3], in which the ethers are at least one selected from the group consisting of diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate.

[5] The treatment liquid as described in any one of [1] to [4], in which the ketones are at least one selected from the group consisting of methyl ethyl ketone, cyclohexanone, cyclopentanone, 2-heptanone, 3-heptanone, 4-heptanone, N-methyl-2-pyrrolidone, methyl propyl ketone, methyl-n-butyl ketone, and methyl isobutyl ketone.

[6] The treatment liquid as described in any one of [1] to [5], in which the lactones are at least one selected from the group consisting of β-propiolactone, γ-butyrolactone, γ-valerolactone, δ-valerolactone, γ-caprolactone, and ε-caprolactone.

[7] The treatment liquid as described in any one of [1] to [6], further comprising:

alkenes in a case where the organic solvent includes ethers, in which the content of the alkenes in the treatment liquid is 0.1 ppb by mass to 100 ppb by mass.

[8] The treatment liquid as described in any one of [1] to [7], further comprising:

at least one acid component selected from an inorganic acid or an organic acid in a case where the organic solvent includes lactones, in which the content of the acid component in the treatment liquid is 0.1 ppb by mass to 100 ppb by mass.

[9] The treatment liquid as described in any one of [1] to [8], in which the content of the water in the treatment liquid is 100 ppb by mass to 10 ppm by mass.

[10] The treatment liquid as described in any one of [1] to [9], in which the content of the water in the treatment liquid is 100 ppb by mass to 1 ppm by mass.

[11] The treatment liquid as described in any one of [1] to [10], in which the organic solvent includes at least ethers. [12] A treatment liquid housing body comprising:

a container; and the treatment liquid as described in any one of [1] to [11] housed in the container.

[13] The treatment liquid housing body as described in [12], in which the inner wall of the container is formed of at least one material selected from a fluorine-based resin, quartz, or an electropolished metal material.

As described below, according to the present invention, it is possible to provide a treatment liquid which is capable of suppressing the generation of defects of a semiconductor device, and thus, has excellent corrosion resistance and wettability. Further, according to the present invention, it is also possible to provide a treatment liquid housing body.

In particular, according to the present invention, it is possible to provide a treatment liquid which is capable of suppressing the generation of defects even in the formation of semiconductor devices with ultrafine patterns (for example, a node of 30 nm or lower, and furthermore a node of 10 nm or lower) in recent years, and thus, have excellent corrosion resistance and wettability, and a housing body for housing the treatment liquid.

DESCRIPTION OF THE PREFERRED EMBODIMENTS

Figure 1:
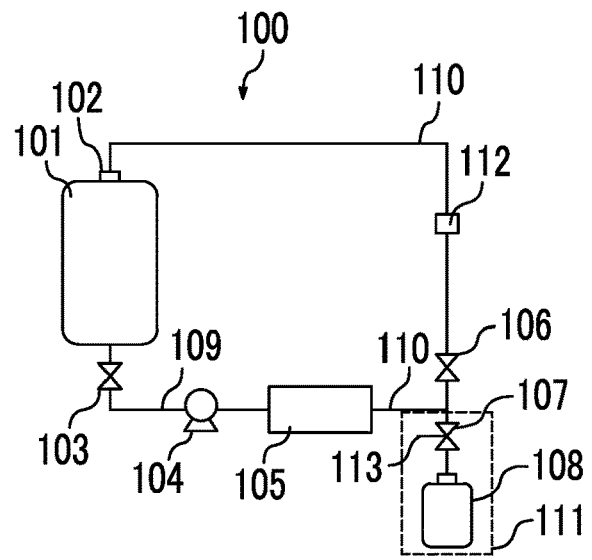
FIG. 1 is a schematic view showing an aspect of a production device which can be used in a method for producing a treatment liquid according to an embodiment of the present invention.

Hereinafter, the present invention will be described.

Furthermore, the numerical value ranges shown using "to" in the present specification mean ranges including the numerical values indicated before and after "to" as the lower limit value and the upper limit value, respectively.

Moreover, a reference to "preparation" in the present specification is meant to encompass delivering a predetermined material by purchases or the like, in addition to comprising specific materials by synthesis, combination, or the like.

In addition, in the present specification, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

[Treatment Liquid]

The treatment liquid according to the embodiment of the present invention is a treatment liquid for a semiconductor device, including at least one organic solvent selected from the group consisting of ethers, ketones, and lactones (hereinafter also referred to as a "specific organic solvent"), water, and a metal component including at least one metal element selected from the group consisting of Na, K, Ca, Fe, Cu, Mg, Mn, Li, Al, Cr, Ni, Ti, and Zn (hereinafter also referred to as a "specific metal component"), in which the content of the water in the treatment liquid is 100 ppb by mass to 100 ppm by mass, and the content of the metal component in the treatment liquid is 10 ppq by mass to 10 ppb by mass.

The treatment liquid according to the embodiment of the present invention is capable of suppressing the generation of defects of a semiconductor device, and thus, has excellent corrosion resistance and wettability. Some of the details of the reasons thereof are not still clear, but are presumed to be as follows.

In a case where the content of the specific metal component in the treatment liquid is high, there are some aspects in which the specific metal component serves as a nucleus (for example, particle states of a solid) upon the applications of the treatment liquid in semiconductor devices in some cases, and thus, defects of a semiconductor device are likely to be generated.

As a result, it is thought that as the contents of the metal elements constituting the specific metal component in the treatment liquid are lower, defects of a semiconductor device can be further suppressed, but after further studies, the present inventors have discovered that in a case where the content of the specific metal component is less than a predetermined amount, defects of a semiconductor device cannot be suppressed.

The details of the reasons thereof are not clear, but it is thought that, for example, in a case where a treatment liquid provided for a substrate is removed, the treatment liquid is likely to be removed under the condition where the specific metal component is in the crystallized state, whereas in a case where the content of the specific metal component is too low, it is difficult for the specific metal component to be in a crystallized state, and thus, the specific metal component is present in a state of adhering to the substrate.

For such a reason, it is presumed that generation of defects of a semiconductor device can be suppressed by adjusting the content of the specific metal component in the treatment liquid to be in a predetermined range.

Furthermore, in a case of using a treatment liquid having an organic solvent as a main component, from the viewpoint of suppressing the corrosion of a metal material such as a metal wire, removal of water included in an organic solvent used as a raw material as much as possible is usually carried out. However, after the studies conducted by the present inventors, it becomes apparent that in a case where water is removed too much, the wettability of the treatment liquid for materials (for example, a substrate, an insulating film, and a resist film) used during the manufacture of a semiconductor device becomes insufficient.

Moreover, in a case where water is removed too much, the wettability of the treatment liquid for the materials used during the manufacture of a semiconductor device is lowered and wet non-uniformity of the treatment liquid occurs. Examples of this phenomenon include a phenomenon in which in a case where the treatment liquid is provided for the Si substrate, an interaction between the treatment liquid and an ultratrace amount of a silanol group present on the surface of a Si substrate hardly occurs, and thus, wet non-uniformity occurs.

Based on this, it is thought that removal properties of particles adhering to an area where the materials used during the manufacture of a semiconductor device are hardly wet are lowered, and thus, generation of defects of a semiconductor device easily occurs.

Therefore, by adjusting the content of water in the treatment liquid to be in a predetermined range, the corrosion resistance and the wettability of the treatment liquid become excellent, and thus, generation of defects of a semiconductor device can also be suppressed.

Hereinafter, the components that are included or can be included in the treatment liquid according to the embodiment of the present invention will be described.

<Specific Organic Solvent>

The treatment liquid according to the embodiment of the present invention contains a specific organic solvent. The specific organic solvent is at least one organic solvent selected from the group consisting of ethers, ketones, and lactones as described above.

The specific organic solvent may be used singly or in combination of two or more kinds thereof.

The ethers are a generic name of organic solvents having an ether bond. As the ethers, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, or the like is preferably used.

Among the ethers, from the viewpoint of improvement of the residues, propylene glycol monomethyl ether acetate, propylene glycol monomethyl ether, diethylene glycol monomethyl ether, diethylene glycol monoethyl ether, and diethylene glycol monobutyl ether are preferable, and propylene glycol monomethyl ether acetate, propylene glycol monomethyl ether, and diethylene glycol monobutyl ether are more preferable.

The ethers may be used singly or in combination of two or more kinds thereof.

The ketones are a generic name of organic solvents having a ketone structure. As the ketones, methyl ethyl ketone (2-butanone), cyclohexanone, cyclopentanone, 2-heptanone, 3-heptanone, 4-heptanone, N-methyl-2-pyrrolidone, methyl propyl ketone (2-pentanone), methyl-n-butyl ketone (2-hexanone), methyl isobutyl ketone (4-methyl-2-pentanone), or the like is preferably used.

Among the ketones, from the viewpoint that generation of defects of a semiconductor device can be further reduced, methyl ethyl ketone, methyl propyl ketone, methyl isobutyl ketone, and cyclohexanone are preferable, and methyl ethyl ketone, methyl propyl ketone, and cyclohexanone are more preferable.

The ketones may be used singly or in combination of two or more kinds thereof.

The lactones refer to aliphatic cyclic esters having 3 to 12 carbon atoms. As the lactones, for example, β-propiolactone, γ-butyrolactone, γ-valerolactone, δ-valerolactone, γ-caprolactone and ε-caprolactone, or the like is preferably used.

Among the lactones, from the viewpoint that generation of defects of a semiconductor device can be further modified, γ-butyrolactone and γ-caprolactone are preferable, and γ-butyrolactone is more preferable.

The lactones may be used singly or in combination of two or more kinds thereof.

Among these organic solvents, from the viewpoint that generation of defects of a semiconductor device can be further reduced, at least one kind of the ethers is preferably used, and a combination of two or more kinds the ethers is more preferably used.

In a case of using a combination of two or more kinds of the ethers, propylene glycol monomethyl ether acetate, propylene glycol monomethyl ether, diethylene glycol monomethyl ether, diethylene glycol monoethyl ether, and diethylene glycol monobutyl ether are preferable as the ethers to be combined.

Among those, a combination (mixed solvent) of propylene glycol monomethyl ether acetate and propylene glycol monomethyl ether is preferable. In this case, the mixing ratio of propylene glycol monomethyl ether acetate to propylene glycol monomethyl ether is preferably in the range of 1:5 to 5:1.

<Water>

The treatment liquid according to the embodiment of the present invention contains water. Water may be a moisture inevitably included in the respective components (raw materials) included in the treatment liquid or a moisture inevitably included during the production of the treatment liquid, or may be water to be intentionally added.

The content of water in the treatment liquid is 100 ppb by mass to 100 ppm by mass, preferably 100 ppb by mass to 10 ppm by mass, and more preferably 100 ppb by mass to 1 ppm by mass. In a case where the content of water is 100 ppb by mass or more, the wettability of the treatment liquid becomes good, and thus, generation of defects of a semiconductor device can also be suppressed. In addition, in a case where the content of water is 100 ppm by mass or less, the corrosion resistance of the treatment liquid becomes good.

The content of water in the treatment liquid is measured by the method described in the section of Examples which will be described later, using a device based on a Karl Fischer moisture measurement method (coulometric titration) as a measurement principle.

As one of methods for adjusting the content of water in the treatment liquid to be in the range, a method in which a treatment liquid is placing in a desiccator substituted with nitrogen gas, and the treatment liquid is heated in the desiccator while maintaining the inside desiccator at a positive pressure. In addition, also by the method mentioned in the purifying step which will be described below, the water in the treatment liquid can be adjusted to be within a desired range.

<Specific Metal Components>

The treatment liquid according to the embodiment of the present invention contains a specific metal component. The specific metal component is a metal component including at least one metal element selected from the group consisting of Na, K, Ca, Fe, Cu, Mg, Mn, Li, Al, Cr, Ni, Ti, and Zn, as described above.

One kind or two or more kinds of the specific metal components may be included.

Here, the specific metal component may be in any form of an ion, a complex compound, a metal salt, an alloy, and the like. In addition, the specific metal component may be in a particle state.

The specific metal component may be a metal component inevitably included in the respective components (raw materials) included in the treatment liquid or a metal component inevitably included during the production of the treatment liquid, or may be a metal component to be intentionally added.

The content of the specific metal component in the treatment liquid is 10 ppq by mass to 10 ppb by mass, preferably 10 ppq by mass to 300 ppt by mass, more preferably 10 ppq by mass to 100 ppt by mass, and still more preferably 20 ppt by mass to 100 ppt by mass. In a case where the content of the specific metal component is in the range, generation of defects of a semiconductor device can be suppressed.

In addition, in a case where the treatment liquid contains two or more kind of the specific metal components, the content of the specific metal component means a total content of the two or more kind of the specific metal components.

The content of the specific metal component in the treatment liquid is measured by an inductively coupled plasma mass spectrometry (ICP-MS) method. Measurement of the content of the specific metal component by the ICP-MS method can be performed, for example, by using a device in accordance with NexION350 (trade name, manufactured by Perkin Elmer, Inc.).

Furthermore, the content of the specific metal component in the treatment liquid can be measured using Agilent 8800 triple quadrupole ICP-MS (inductively coupled plasma mass spectrometry, for analysis of a semiconductor, Option #200) manufactured by Agilent Technologies, Inc., in addition to the above device. In addition, the content of the specific metal component in the treatment liquid can also be measured using Agilent 8900 Agilent Technologies, Inc.

Here, in the ICP-MS method, the content is quantified as a total mass (also referred to as a "total metal amount") of the specific metal component in the treatment liquid, that is, ionic metals (metal ions) and non-ionic metals (specific particulate metal components, that is, metal particles). Accordingly, in the present invention, a simple reference to "the content of the specific metal component in the treatment liquid" indicates the total content (total metal amount) of the specific metal component in the treatment liquid, regardless of the forms of the above-mentioned specific metal component.

The specific metal component in the treatment liquid may include a specific particulate metal component. In this case, the content of the specific particulate metal component (metal particles) in the treatment liquid is preferably 1 ppq by mass to 1 ppb by mass, more preferably 1 ppq by mass to 30 ppt by mass, still more preferably 1 ppq by mass to 10 ppt by mass, and particularly preferably 2 ppt by mass to 10 ppt by mass. In a case where the content of the specific particulate metal component is in the range, generation of defects of a semiconductor device is further reduced.

Here, according to the measurement by a recently developed single particle-inductively coupled plasma mass spectrometry (SP-ICP-MS) method, it is possible to measure the amount of the metal elements present in the solution after separating them into two portions, metal ions (ionic metals) and metal particles (non-ionic metals). The metal particles (non-ionic metals) are components that are not dissolved in a solution (treatment liquid) and are present as a solid.

The content of the specific particulate metal component (metal particles) in the treatment liquid is measured by the device mentioned for the above-mentioned ICP-MS method by modifying the software to be operated by the SP-ICP-MS method. That is, the ICP-MS method and the SP-ICP-MS method are only different in data analysis, but are carried out using the same device.

In addition, by the device, not only the total content of the specific metal component but also the contents of each type of the metal elements constituting the specific metal component can also be measured.

A method for adjusting the content of the specific metal component in the treatment liquid to be in the range will be described later.

<Alkenes>

In a case where the organic solvent includes ethers, the treatment liquid may further contain alkenes. The alkenes may be incorporated into ethers as a by-product during the production of the ethers in the above-mentioned organic solvent. Thus, in a case of using the ethers as an organic solvent, alkenes incorporated into the ethers may be included in the treatment liquid in some cases.

Examples of the alkenes include ethylene, propylene, butene, pentene, heptene, octene, nonene, and decene. One kind or two or more kinds of the alkenes may be included.

In a case where the alkenes are included in the treatment liquid, the content of the alkenes in the treatment liquid is preferably 0.1 ppb by mass to 100 ppb by mass, and more preferably 0.1 ppb by mass to 10 ppb by mass. In a case where the content of the alkenes is in the range, the interaction between the metal component and the alkenes can be suppressed, and thus, better performance of the treatment liquid is exhibited.

Furthermore, in a case where two or more kinds of the alkenes are contained in the treatment liquid, the content of the alkenes means a total content of the two or more kinds of alkenes.

The content of the alkenes in the treatment liquid can be measured by gas chromatography mass spectrometry (GC-MS).

In addition, a method for adjusting the content of the alkenes in the treatment liquid to be in the range will be described later.

<Acid Components>

In a case where the organic solvent includes lactones, the treatment liquid may further contain at least one acid component selected from an inorganic acid or an organic acid.

Since the acid component is used as an acid catalyst during the production of lactones among the above-mentioned organic solvents, they may be incorporated in the lactones in some cases. As a result, in a case of using the lactones as the organic solvent, the acid component incorporated in the lactones may be included in the treatment liquid in some cases.

Examples of the acid component include at least one selected from an inorganic acid or an organic acid. Examples of the inorganic acid include, but are not limited to, hydrochloric acid, phosphoric acid, sulfuric acid, and perchloric acid. Examples of the organic acid include, but are not limited to, formic acid, methanesulfonic acid, trifluoroacetic acid, and p-toluenesulfonic acid.

In a case where the acid component is contained in the treatment liquid, the content of the acid component in the treatment liquid is preferably 0.1 ppb by mass to 100 ppb by mass, more preferably 0.1 ppb by mass to 10 ppb by mass, and still more preferably 0.1 ppb by mass to 1 ppb by mass. In a case where the content of the acid component is in the range, the interaction between the metal component and the acid component can be suppressed, and thus, better performance of the treatment liquid is exhibited.

Furthermore, in a case where two or more kinds of the acid components are contained in the treatment liquid, the content of the acid component means a total content of the two or more kinds of acid components.

The content of the acid component in the treatment liquid is measured by a neutralization titration method. Measurement by the neutralization titration method is carried out, specifically using an automatic potentiometric titrator (trade name "MKA-610", manufactured by Kyoto Electronics Manufacturing Co., Ltd.).

In addition, examples of a method for adjusting the content of the acid component in the treatment liquid to be in the range include repetition of electric deionization and a distillation treatment in the purifying step which will be described later.

<Other Components>

The treatment liquid according to the embodiment of the present invention may contain components (hereinafter also referred to as "other components") other than the above-mentioned components, depending on applications. Examples of such other additives include a surfactant, an antifoaming agent, and a chelating agent.

<Coarse Particles>

It is preferable that the treatment liquid according to the embodiment of the present invention substantially does not include coarse particles.

The coarse particles refer to particles having a diameter of 0.2 μm or more, for example, in a case of considering the shapes of the particles as spheres. Further, the expression, substantially not including coarse particles, indicates that the number of particles in a size of 0.2 μm or more in 1 mL of the treatment liquid in a case where measurement of the treatment liquid using a commercially available measuring device in a light scattering type in-liquid particle measurement method system is carried out is 10 or less.

Furthermore, the coarse particles included in the treatment liquid are particles of dusts, organic solids, inorganic solids, or the like which are included as impurities in raw materials, or particles of dusts, organic solids, inorganic solids, or the like which are incorporated as a contaminant during the preparation of a treatment liquid, and correspond to the particles which are not ultimately dissolved in the treatment liquid and present as particles.

The amount of the coarse particles present in the treatment liquid can be measured in the liquid phase, using a commercially available measuring device in a light scattering type in-liquid particle measurement system, in which laser is used as a light source.

Examples of a method for removing the coarse particles include a treatment such as filtering which will be described later.

<Organic Impurities>

The treatment liquid according to the embodiment of the present invention may contain organic impurities in some cases, but from the viewpoints of capability of further suppressing the generation of defects of a semiconductor device, or the like, the content of the organic impurities in the treatment liquid is preferably 10 ppb by mass to 0.5% by mass.

Here, the organic impurities refer to organic substances other than organic solvents. Specifically, examples of the organic impurities include a stabilizer and unreacted raw materials used for the production of an organic solvent, structural isomers and by-products generated in the production of an organic solvent, and eluates (for example, a plasticizer eluted from rubber members such as an O ring) from members constituting a production device used for the production of an organic solvent. Thus, the definitions of the organic impurities include the above-mentioned alkenes.

Furthermore, for the measurement of the content of the organic impurities, gas chromatograph mass spectrometry (trade name "GCMS-2020", manufactured by Shimadzu Corporation) can be used. Further, in a case where the organic impurities are high-molecular-weight compounds, identification and quantification of the concentration of a structure may be performed from decomposition products by techniques such as pyrolyzer quadrupole time-of-flight mass spectrometry (Py-QTOF/MS), pyrolyzer ion trap mass spectrometry (Py-IT/MS), pyrolyzer magnetic sector mass spectrometry (Py-Sector/MS), pyrolyzer Fourier transform ion cyclotron mass spectrometry (Py-FTICR/MS), pyrolyzer quadrupole mass spectrometry (Py-Q/MS), and pyrolyzer ion trap time-of-flight mass spectrometry (Py-iT-TOF/MS), but the techniques are not limited thereto. For example, for Py-QTOF/MS, a device manufactured by Shimadzu Corporation, or the like can be used.

Examples of a method for removing the organic impurities include a treatment using an organic impurity adsorbing filter which will be described later.

[Method for Producing Treatment Liquid]

The treatment liquid according to the embodiment of the present invention is obtained by carrying out the following purifying step in order to adjust the contents of the metal component and water to be in desired ranges.

<Purifying Step>

A purifying step is a step of purifying the components (for example, the metal component, water, the alkenes, and the acid component) incorporated during the production of the respective components and the mixing of the respective components to the above-mentioned desired contents.

The purifying step may be carried out at any timing. Examples of the purifying step include the following purifying treatments I to IV.

That is, the purifying treatment I is a treatment of subjecting raw materials (for example, raw materials used for the production of a specific organic solvent) to purification before the production of the components (for example, a specific organic solvent) used for the production of the treatment liquid.

Furthermore, the purifying treatment II is a treatment of subjecting components (for example, a specific organic solvent) used for the production of the treatment liquid to purification during and/or after the production of the components.

Moreover, the purifying treatment III is a treatment of subjecting each of the components to purification before mixing two or more kinds of components (for example, two or more kinds of specific organic solvents) in the production of the treatment liquid.

In addition, the purifying treatment IV is a treatment of subjecting a mixture after mixing two or more kinds of components (for example, two or more kinds of specific organic solvents) to purification in the production of the treatment liquid.

In a case of using two or more kinds of components during the production of the treatment liquid, it is preferable to carry out at least both of the purifying treatment III and the purifying treatment IV; it is more preferable to carry out at least all of the purifying treatment I, the purifying treatment III, and the purifying treatment IV; and it is still more preferable to carry out all of the purifying treatment I to the purifying treatment IV, among the purifying treatments I to IV.

The purifying treatments I to IV may be carried out once or twice or more times, respectively.

As the components (for example, a specific organic solvent) used for the production of the treatment liquid and the raw materials for the components used for the production of the treatment liquid (for example, a specific organic solvent), high-purity grade products (in particular, having low contents of the specific metal component, water, the alkenes, and the acid component) may be purchased, and further subjected to the above-mentioned purifying treatment and used.

Hereinafter, an example of the purifying step will be presented. In the following description, targets to be purified (that is, each of the components used for the production of the treatment liquid, a mixed liquid obtained by mixing the components used for the production of the treatment liquid, or the like) in the purifying step are simply collectively referred to as "a liquid to be purified".

Examples of the purifying step include an aspect of carrying out a first ion exchange treatment for performing an ion exchange treatment of a liquid to be purified, a dehydration treatment for performing dehydration of the liquid to be purified after the first ion exchange treatment, a distillation treatment for performing distillation of the liquid to be purified after the dehydration treatment, and a second ion exchange treatment for performing an ion exchange treatment of the liquid to be purified after the distillation treatment in this order.

According to the first ion exchange treatment, it is possible to remove the ion components (for example, the metal component) in the liquid to be purified.

In the first ion exchange treatment, the first ion exchange means such as an ion exchange resin is used. The ion exchange resins may be any of those having a cation exchange resin or an anion exchange resin provided on a single bed, those having a cation exchange resin and an anion exchange resin provided on a double bed, or those having a cation exchange resin and an anion exchange resin provided on a mixed bed. Examples of the ion exchange resin include DIAION (trade name) series manufactured by Mitsubishi Chemical Corporation.

Incidentally, in order to reduce elution of moisture from the ion exchange resin, it is preferable to use a dry resin that includes moisture as least as possible as the ion exchange resin. As such a dry resin, commercially available products can be used, and examples thereof include 15JS-HG•DRY (trade name, dry cation exchange resin, moisture content of 2% or less) and MSPS2-1•DRY (trade name, mixed-bed resin, moisture content of 10% or less), manufactured by Organo Corporation.

By the dehydration treatment, it is possible to remove water in the liquid to be purified. Further, in a case where zeolite which will be described later (in particular, Molecular Sieve (trade name) manufactured by Union Showa K. K., or the like) is used in the dehydration treatment, olefins can also be removed.

Examples of the dehydrating means used for the dehydration treatment include a dehydrating film, a water adsorbent that is insoluble in the liquid to be purified, an aeration replacement device using a dry inert gas, and a heating or vacuum heating device.

In a case of using the dehydrating film, film dehydration is performed by pervaporation (PV) or vapor permeation (VP). The dehydrating film is constituted as, for example, a water-permeable film module. As the dehydrating film, a film formed of polymers such as a polyimide-based polymer, a cellulose-based polymer, and a polyvinyl alcohol-based polymer, or inorganic materials such as zeolite can be used.

The water adsorbent is used after being added to the liquid to be purified. Examples of the water adsorbent include zeolite, diphosphorus pentaoxide, silica gel, calcium chloride, sodium sulfate, magnesium sulfate, anhydrous zinc chloride, fumed sulfuric acid, and soda lime.

According to the distillation treatment, it is possible to remove impurities eluted from the dehydrating film, the metal component in the liquid to be purified, which is hardly removed in the first ion exchange treatment, fine particles (in a case where the metal component is a fine particle, it is also included), and water in the liquid to be purified.

The distillation means is formed of, for example, a single-stage distillation device. Although the impurities are concentrated in a distillation device or the like by a distillation treatment, it is preferable to provide a means that discharges a part of the liquid having concentrated impurities to the outside periodically or constantly in the distillation means in order to prevent some of the concentrated impurities from being flowed out.

By the second ion exchange treatment, it is possible to remove impurities in a case where the impurities accumulated within the distillation device are flowed out or to remove eluates from pipes of stainless steel (SUS) or the like, used as a liquid feeding line.

Examples of the second ion exchange means include those having a column-shaped container filled with an ion exchange resin, and an ion adsorption film, and the ion adsorption film is preferable in view of its capability of performing a treatment at a high flow rate. Examples of the ion adsorption film include NEOSEPTA (trade name, manufactured by ASTOM Corporation).

Each of the above-mentioned treatments is preferably performed in an inert gas atmosphere which is in a closed state and has a low potential of incorporation of water into the liquid to be purified.

In order to suppress the incorporation of moisture as much as possible, each of the treatments is preferably performed in an inert gas atmosphere at a dew point temperature of −70° C. or lower. Since the moisture concentration in the gas phase is 2 ppm by mass or less in the inert gas atmosphere at −70° C. or lower, and thus, there is a lower potential of incorporation of moisture into the treatment liquid (liquid to be purified).

Examples of the purifying step include a treatment for absorbing and purifying the metal component using silicon carbide, described in WO2012/043496A, in addition to the above treatment.

The liquid to be purified obtained through such each of the treatments can be used in the production of the treatment liquid according to the embodiment of the present invention or can be used as the treatment liquid according to the embodiment of the present invention as it is.

In addition, as an example of the above-mentioned purifying step, a case where the respective treatments are all performed is presented, but the present invention is limited thereto. The respective treatments may be performed singly or in combination of a plurality of the treatments. In addition, the respective treatments may be performed once or a plurality of times.

In addition to the purifying step, examples of the method for adjusting the contents of the metal component and water included in the treatment liquid to be in desired ranges include a use of a container having little elution of impurities, as described for a housing container housing the treatment liquid according to the embodiment of the present invention which will be described later as a "container" housing the raw materials used for the production of the treatment liquid. Other examples of the method include a method in which a lining of a fluorine-based resin is carried out on the inner wall of a pipe so as to prevent the elution of metal fractions from the "pipe" or the like during the production of the treatment liquid.

<Production Device>

FIG. 1 is a schematic view showing an aspect of a production device which can be used in the method for producing the treatment liquid according to the embodiment of the present invention. The production device 100 comprises a tank 101, and the tank 101 includes a supply port 102 for supplying a washing liquid which will be described later and/or an organic solvent. The production device 100 comprises a filtering device 105, and the tank 101 and the filtering device 105 are connected to a supply conduit 109, and can transport a fluid (a washing liquid, an organic solvent, a treatment liquid, or the like) between the tank 101 and the filtering device 105. In the supply conduit 109, a valve 103, and a pump 104 are disposed.

In FIG. 1, although the production device 100 comprises the tank 101 and the filtering device 105, the production device used for the method for producing the treatment liquid according to the embodiment of the present invention is not limited thereto. For example, the production device may further comprise one or more filtering devices, in addition to the filtering device 105. In this case, the positions at which filtering devices other than the filtering device 105 are installed are not particularly limited.

In the production device 100, the fluid supplied from the supply port 102 flows into the filtering device 105 via the valve 103 and the pump 104. The fluid discharged from the filtering device 105 is housed in the tank 101 via the circulation conduit 110.

The production device 100 comprises a discharge unit 111 that discharges a treatment liquid into a circulation conduit 110. The discharge unit 111 comprises a valve 107 and a container 108, and the produced treatment liquid can be housed in the container 108 by switching a valve 106 provided in the circulation conduit 110 and the valve 107. Further, a switchable conduit 113 is connected with the valve 107, and the washing liquid after the circulation washing can be discharged to the outside of the production device 100 via the conduit 113. The washing liquid after the circulation washing may contain impurities and the like in some cases, and the filled portion or the like of the container 108 is not contaminated since the production device 100 comprises the conduit 113 that discharges the washing liquid to the outside of the device, whereby a treatment liquid having more excellent defect suppressing performance can be obtained.

Moreover, the production device 100 comprises a washing liquid monitoring unit 112 in the circulation conduit 110. In FIG. 1, the production device 100 comprises the washing liquid monitoring unit 112 in the circulation conduit 110, but a production device that can be used for the method for producing the treatment liquid according to the embodiment of the present invention is not limited thereto. The washing liquid monitoring unit 112 may be comprised in the supply conduit 109, or may also be comprised in the supply conduit 109 and the circulation conduit 110. Further, in the production device 100, the washing liquid monitoring unit 112 is directly comprised in the circulation conduit 110, but the production device that can be used in the method for producing the treatment liquid according to the embodiment of the present invention is not limited thereto. The washing liquid monitoring unit 112 may be comprised in a temporary housing tank (different from the tank 101) for a fluid not shown, comprised in the conduit.

Figure 2:
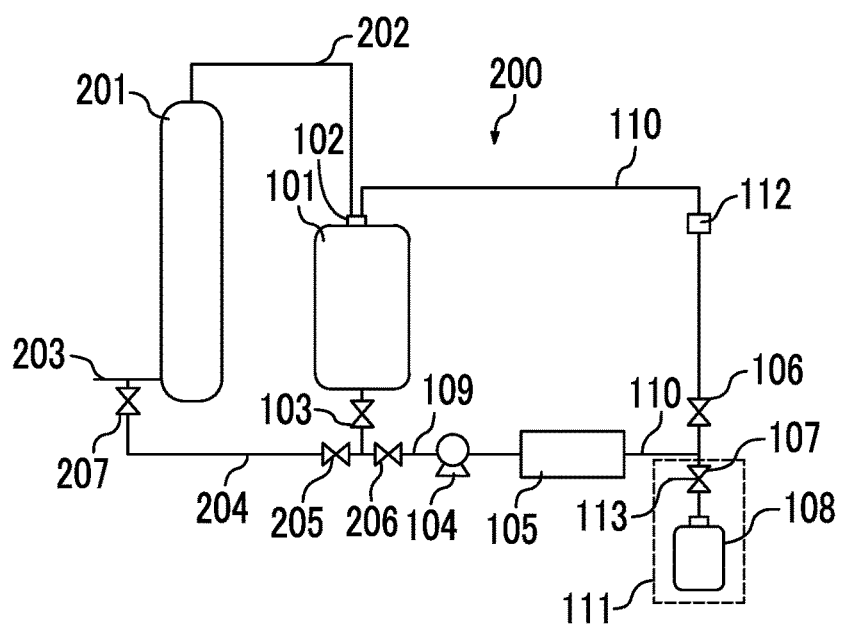
FIG. 2 is a schematic view showing another aspect of the production device which can be used in the method for producing the treatment liquid according to the embodiment of the present invention.

FIG. 2 is a schematic view showing another aspect of the production device that can be used in the method for producing the treatment liquid according to the embodiment of the present invention. A production device 200 comprises a tank 101 and a filtering device 105, and further comprises a distillation column 201 which is connected with the tank 101, a conduit 202, a conduit 204, and a conduit 203, and disposed to be capable of transporting a fluid between the tank 101 and the distillation column 201 through each of the conduits. Further, the production device that can be used in the method for producing the treatment liquid according to the embodiment of the present invention does not necessarily comprise the filtering device 105 and/or the distillation column 201, while it may further comprise a reaction vessel connected with the distillation column 201 in the conduit 203.

In the production device 200, the fluid supplied to the distillation column 201 via the conduit 203 is distilled in the distillation column 201. The distilled fluid is housed in the tank 101 via the conduit 202. The supply conduit 109 comprises the valve 103 and the valve 206, and the fluid discharged from the tank 101 is designed to flow into the filtering device 105 by switching the valve 205 comprised in the conduit 204.

Furthermore, in the production device 200, the fluid discharged from the tank 101 can also flow into the distillation column 201 again. In such a case, by switching the valve 103, the valve 206, and the valve 205, the fluid flows into the distillation column 201 from the conduit 204 via the valve 207 and the conduit 203.

The production device 200 may further comprise, in addition to the filtering device 105, one or more filtering devices (not shown). In this case, the positions where filtering devices other than the filtering device 105 are installed are not particularly limited, but the filtering devices can be installed, for example, on the upstream side of the conduit 203.

A case where the production device 200 has two filtering devices on the upstream side of the conduit 203 will be specifically described.

First, the fluid is supplied to a first filtering device (for example, a first ion exchange means, not shown) disposed on the upstream side of the conduit 203. Next, the fluid flowed out of the first filtering device is on the upstream side of the conduit 203, and supplied to a second filtering device (for example, a dehydrating means, not shown) installed on the downstream side of the first filtering device. Next, the fluid flowed out of the second filtering device is supplied to the distillation column 201 via the conduit 203. The fluid distilled in the distillation column 201 is supplied to the filtering device 105 (for example, a second ion exchange means) via the tank 101, as described above. In this manner, a treatment liquid according to the embodiment of the present invention can be obtained.

Incidentally, the fluid supplied to the filtering device 105 may be supplied onto the upstream side of the first filtering device via the tank 101, the conduit 204, and a conduit not shown, or may also be on the downstream side of the first filtering device and supplied onto the upstream side of the second filtering device.

In addition, an example in which the fluid flowed out of the first filtering device is supplied to the second filtering device is presented, but the present invention is not limited thereto. For example, the fluid flowed out of the first filtering device may be supplied to the first filtering device again, using a conduit, a valve, or the like, not shown. Similarly, an example in which the fluid flowed out of the second filtering device is supplied to the distillation column 201 is presented, but the fluid flowed out of the second filtering device may also be supplied to the second filtering device again via a conduit, a valve, or the like, not shown.

Materials of the liquid contact portion (the definition of the liquid contact portion will be described later) of the production device are not particularly limited, but in view of obtaining a treatment liquid having more excellent defect suppressing performance, the liquid contact portion is preferably formed of at least one selected from the group consisting of a non-metal material and an electropolished metal material. Incidentally, in the present specification, the "liquid contact portion" is meant to be a site having a possibility that a fluid is in contact (for example, an inner surface of a tank and an inner surface of a conduit), and intended to represent an area having a thickness from the surface of 100 nm.

The non-metal material is not particularly limited, but is preferably a polyethylene resin, a polypropylene resin, a polyethylene-polypropylene resin, or a fluorine-containing resin material such as a perfluoro resin, and from the viewpoint of less elution of metal atoms, the fluorine-containing resin is preferable.

Examples of the fluorine-containing resin include a perfluoro resin, and also include a tetrafluoroethylene resin (PTFE), a tetrafluoroethylene.perfluoroalkyl vinyl ether copolymer resin (PFA), a tetrafluoroethylene-hexafluoropropylene copolymer resin (FEP), a tetrafluoroethylene-ethylene copolymer resin (ETFE), a trifluoroethylene chloride-ethylene copolymer resin (ECTFE), a polyvinylidene fluoride resin (PVDF), a trifluoroethylene chloride resin (PCTFE), and a polyvinyl fluoride resin (PVF).

Particularly preferred examples of the fluorine-containing resin include a tetrafluoroethylene resin, a tetrafluoroethylene.perfluoroalkyl vinyl ether copolymer resin, and a tetrafluoroethylene-hexafluoropropylene copolymer resin.

The metal material is not particularly limited, and known materials can be used.

Examples of the metal material include a metal material having a total content of chromium and nickel of more than 25% by mass, and among these, more preferably 30% by mass, with respect to the total mass of the metal material. The upper limit value of the total content of chromium and nickel in the metal material is not particularly limited, but generally, it is preferably 90% by mass or less.

Examples of the metal material include stainless steel, carbon steel, alloy steel, nickel-chromium-molybdenum steel, chromium steel, chromium molybdenum steel, manganese steel, and a nickel-chromium alloy.

The stainless steel is not particularly limited, and known stainless steel can be used. Among those, an alloy containing 8% by mass or more of nickel is preferable, and austenitic stainless steel containing 8% by mass or more of nickel is more preferable. Examples of the austenitic stainless steel include steel use stainless (SUS), 304 (Ni content of 8% by mass, Cr content of 18% by mass), SUS304L (Ni content of 9% by mass, Cr content of 18% by mass), SUS316 (Ni content of 10% by mass, Cr content of 16% by mass), and SUS316L (Ni content of 12% by mass, Cr content of 16% by mass).

The nickel-chromium alloy is not particularly limited, and known nickel-chromium alloys can be used. Among those, a nickel-chromium alloy having a nickel content of 40% to 75% by mass and a chromium content of 1% to 30% by mass is preferable.

Examples of the nickel-chromium alloy include Hastelloy (trade name, hereinafter, the same shall apply), Monel (trade name, hereinafter, the same shall apply), and Inconel (trade name, hereinafter, the same shall apply). More specific examples thereof include Hastelloy C-276 (Ni content of 63% by mass, Cr content of 16% by mass), Hastelloy-C(Ni content of 60% by mass, Cr content of 17% by mass), and Hastelloy C-22 (Ni content of 61% by mass, Cr content of 22% by mass).

In addition, the nickel-chromium alloy may further contain, in addition to the above-mentioned alloys, boron, silicon, tungsten, molybdenum, copper, cobalt, or the like, as desired.

A method of electropolishing the metal materials is not particularly limited, and known methods can be used. For example, the methods described in paragraphs 0011 to 0014 of JP2015-227501A, paragraphs 0036 to 0042 of JP2008-264929A, or the like can be used.

It is presumed that due to the metal materials being electropolished, the content of chromium in the passivation layer on the surface is larger than the content of chromium in the parent phase. By this, metal impurities containing a metal atom in an organic solvent are hardly flowed out of the distillation column in which the liquid contact portion is formed of an electropolished metal material, and as a result, an organic solvent having a reduced content of impurities, which has been completely distilled, is obtained.

Furthermore, the metal material may be buffed. A buffing method is not particularly limited, and known methods can be used. The size of the abrasive grain used for the finishing of buffing is not particularly limited, but in view that the unevenness of the surface of the metal material is more likely to be reduced, the size is preferably #400 or less. In addition, the buffing is preferably performed before the electropolishing.

In view of obtaining a treatment liquid having more excellent defect suppressing performance, it is preferable that the liquid contact portion is formed of electropolished stainless steel. In particular, in a case where the production device comprises a tank, it is more preferable that the liquid contact portion of the tank is formed of electropolished stainless steel. The content ratio of the content of Cr to the content of Fe in the liquid contact portion (hereinafter also referred to as "Cr/Fe") is not particularly limited, but generally, the content ratio is preferably 0.5 to 4, and among the values, in view that the metal impurities and/or the organic impurities are more hardly eluted in the treatment liquid, the content ratio is more preferably more than 0.5 and less than 3.5, and still more preferably 0.7 or more and 3.0 or less. In a case where Cr/Fe is more than 0.5, the elution of metals from the inside of the tank can be suppressed, and in a case where Cr/Fe is less than 3.5, peeling of the liquid contact portion, or the like, which can cause particles, hardly occurs.

A method for adjusting Cr/Fe in the metal material is not particularly limited, and examples thereof include a method of adjusting the content of Cr atoms in the metal material, and a method of increasing the content of chromium in a passivation layer of a polished surface to more than the content of chromium in the parent phase by electropolishing.

Film Coating Techniques May be Applied to the Metal Material.

The film coating technique is largely divided into three kinds of coatings such as metal coating (various platings), inorganic coating (various chemical conversion treatments, glass, concrete, ceramics, and the like), and organic coating (rust preventive oils, paints, rubber, or plastics).

Preferred examples of the film coating techniques include a surface treatment with a rust-preventing oil, a rust inhibitor, a corrosion inhibitor, a chelate compound, a peelable plastic, or a lining agent.

Among those, corrosion inhibitors, such as various chromates, nitrites, silicates, phosphates, oleic acid, dimer acid, carboxylic acids such as naphthenic acid, carboxylic acid metal soaps, sulfonates, amine salts, and esters (glycerol esters of higher fatty acids and phosphoric acid esters); chelate compounds such as ethylenediaminetetraacetic acid, gluconic acid, nitrilotriacetic acid, hydroxyethyl ethylene diamine triacetic acid, and diethylenetriamine pentaacetic acid; and fluorine resin lining are preferable. Particularly preferred are a phosphate treatment and fluorine resin lining.

A filtering member contained in the filtering device of the production device is not particularly limited, but examples thereof include the above-mentioned first ion exchange means (for example, an ion exchange resin), the above-mentioned dehydrating means (for example, a dehydrating film and a water adsorbent), and the above-mentioned second ion exchange means (for example, an ion exchange resin and an ion adsorption film), two or more of which may be combined. Further, for the filtering member, at least one selected from the group consisting of a filter having a particle removal diameter of 20 nm or less and a metal ion adsorption member.

The metal ion adsorption member may be used as the first ion exchange means and the second ion exchange means.

(Filter Having Particle Removal Diameter of 20 nm or Less)

The filter having a particle removal diameter of 20 nm or less has a function of efficiently removing particles having a diameter of 20 nm or more from an organic solvent or the like as a raw material for a treatment liquid.

Furthermore, the particle removal diameter of the filter is preferably 1 to 15 nm, and more preferably 1 to 12 nm. In a case where the particle removal diameter is 15 nm or less, finer particles can be removed, whereas in a case where the particle removal diameter is 1 nm or more, the filtering efficiency is improved.

Here, the particle removal diameter means a minimum size of particles that can be removed by a filter. For example, in a case were the particle removal diameter of the filter is 20 nm, particles having a diameter of 20 nm or more can be removed.

Examples of the material of the filter include nylons such as 6-nylon and 6,6-nylon, polyethylene, polypropylene, polystyrene, polyimide, polyamide-imide, and a fluorine resin. The polyimide and/or polyamide-imide may have at least one selected from the group consisting of a carboxy group, a salt type carboxy group, and a —NH— bond. In view of solvent resistance, a fluorine resin, polyimide, and/or polyamide-imide are excellent. In addition, from the viewpoint of adsorbing metal ions, nylons such as 6-nylon and 6,6-nylon are particularly preferable.

The filtering device may contain a plurality of the filters. In a case where the filtering device contains the plurality of the filters, the other filter is not particularly limited, but a filter having a particle removal diameter of 50 nm or more (for example, a microfiltration film for removing fine particles having a pore diameter of 50 nm or more) is preferable. In a case where in addition to colloidized impurities, in particular, colloidized impurities containing metal atoms such as iron and aluminum, fine particles are present in materials to be purified, the filtering efficiency of a filter having a particle removal diameter of 20 nm or less (for example, a microfiltration film having a pore diameter of 20 nm or less) is improved and the particle removal performance is further improved, by carrying out the filtering of the materials to be purified using a filter having a particle removal diameter of 50 nm or more (for example, a microfiltration film for removing fine particles, having a pore diameter of 50 nm or more) before performing filtering using a filter having a particle removal diameter of 20 nm or less (for example, a microfiltration film having a pore diameter of 20 nm or less).

In addition, the filtering device may have a filter described in the section of "Filtering" which will be described later, and the "filter having a particle removal diameter of 20 nm or less" may also serve as the filter described in the section of "Filtering" which will be described later.

(Metal Ion Adsorption Filter)

The metal ion adsorption filter is not particularly limited, and examples thereof include known metal ion adsorption filters.

Among those, as the metal ion adsorption filter, an ion exchangeable filter is preferable. Here, from the viewpoint of metal ions to be adsorbed can easily cause defects of a semiconductor device, the specific metal component is preferable.

The metal ion adsorption filter preferably contains an acid group on the surface from the viewpoint that the adsorption performance of the metal ions is improved. Examples of the acid group include a sulfo group and a carboxy group.

Examples of a base material (material) constituting the metal ion adsorption filter include cellulose, diatomaceous earth, nylon, polyethylene, polypropylene, polystyrene, and a fluorine resin. From the viewpoint of efficiency in adsorbing metal ions, nylons are particularly preferred.

In addition, the metal ion adsorption filter may be formed of a material containing polyimide and/or polyamide-imide. Examples of the metal ion adsorption filter include the polyimide and/or polyamide-imide porous films described in JP2016-155121A.

The polyimide and/or polyamide-imide porous film may contain at least one selected from the group consisting of a carboxy group, a salt type carboxy group, and a —NH— bond. In a case where the metal ion adsorption filter is formed of a fluorine resin, polyimide, and/or polyamide-imide, it has better solvent resistance.

(Organic Impurity Adsorbing Filter)

The filtering device may further have an organic impurity adsorbing filter.

The organic impurity adsorbing filter is not particularly limited, and examples thereof include known organic impurity adsorbing filters.

Among those, in view of improving the performance for adsorbing organic impurities, an organic impurity adsorbing filter having an organic skeleton capable of interacting with organic impurities on a surface thereof (in other words, having a surface modified with an organic skeleton capable of interacting with organic impurities) is preferable as the organic impurity adsorbing filter. Examples of the organic skeleton capable of interacting with organic impurities include a chemical structure in which organic impurities can be trapped onto organic impurity adsorbing filter by a reaction with the organic impurities. More specifically, in a case where an n-long-chain alkyl alcohol (a structural isomer in a case of using a 1-long-chain alkyl alcohol as an organic solvent) is included as the organic impurities, an alkyl group may be mentioned as the organic skeleton. Further, in a case where the dibutylhydroxytoluene (BHT) is included as the organic impurities, a phenyl group may be mentioned as the organic skeleton.

Examples of the base material (material) constituting the organic impurity adsorbing filter include activated carbon-carried cellulose, diatomaceous earth, nylon, polyethylene, polypropylene, polystyrene, and a fluorine resin.

In addition, for the organic impurity adsorbing filter, the filters having activated carbon fixed in nonwoven fabric described in JP2002-273123A and JP2013-150979A can also be used.

To the organic impurity adsorbing filter, a physical adsorption method can be applied, in addition to chemisorption shown above (adsorption using an organic impurity adsorbing filter having an organic skeleton capable of interacting with organic impurities on a surface thereof).

For example, in a case where BHT is included as organic impurities, the structure of BHT is larger than 10 angstroms (=1 nm). As a result, by using organic impurity adsorbing filter having a pore diameter of 1 nm, BHT cannot pass through the pore of the filter. That is, since BHT is physically trapped by the filter, they are removed from materials to be purified. Thus, for the removal of the organic impurities, physical removal methods as well as chemical interaction can be applied.

The treatment liquid according to the embodiment of the present invention may be a treatment liquid obtained through a step of washing a production device using a washing liquid. In the example of FIG. 1, the step of washing the production device is carried out by supplying a washing liquid from the supply port 102 of the tank 101. The supply amount of the washing liquid is not particularly limited, but is preferably an amount enough to sufficiently wash the liquid contact portion of the tank 101, and the volume of the washing liquid supplied is preferably at least 30% by volume with respect to the capacity of the tank 101. While supplying the washing liquid from the supply port 102, the valve 103 may be closed or open, but in view that it is easier to wash the tank 101, it is preferable to close the valve 103 so as to supply the washing liquid from the supply port 102.

The washing liquid supplied to the tank 101 may be immediately transported to the inside of the production device, or may be transported to the inside of the production device (for example, via the supply conduit 109) after washing the tank 101. A method for washing the tank 101 with the washing liquid is not particularly limited, but examples thereof include a method of performing washing by rotating a stirring blade (not shown) comprised in the tank 101. The time for washing the tank with the washing liquid is not particularly limited, and may be appropriately selected depending on the materials for the liquid contact portion of the tank 101, the types of the treatment liquid to be produced, a potential of contamination, or the like. In general, the time is preferably approximately 0.1 seconds to 48 hours. Further, in a case of washing only the tank 101, for example, the washing liquid after the washing may be discharged from the outlet not shown, provided in the bottom of the tank.

A method for washing the supply conduit 109 of the production device 100 using a washing liquid is not particularly limited, but a method (hereinafter also referred to as "circulation washing") in which the valve 103 and the valve 106 are opened, the valve 107 is closed, and then the pump 104 is operated to circulate the washing liquid within the production device through the supply conduit 109 and the circulation conduit 110 is preferable. In the manner described above, while transporting the washing liquid, foreign matters adhering to the liquid contact portions of the tank 101, the filtering device 105, the supply conduit 109, or the like can be efficiently dispersed by the washing liquid, and/or can be dissolved more efficiently.

In particular, in a case where the production device comprises a filtering device, the circulation washing is more preferable as the washing method. An example of the circulation washing will be described with reference to FIG. 1. First, the washing liquid supplied into the production device from the tank 101 via the valve 103 passes through the supply conduit 109 (via the filtering device 105, the circulation conduit 110, and the valve 106) returns to the tank 101 (is circulated). At this time, the washing liquid is filtered by the filtering device 105 to remove the particles and the like dissolved and dispersed in the washing liquid, thereby further enhancing a washing effect.

As another aspect of the washing method, for example, a method (in the present specification, the method is hereinafter also referred to "disposal washing") in which the valve 103 and the valve 107 are opened, the valve 106 is closed, the pump 104 is then operated to make the washing liquid supplied into the production device from the supply port 102 of the tank 101 flow into the filtering device 105 via the valve 103 and the pump 104, and thereafter, be discharged to the outside of the production device through the valve 107 while not circulating the washing liquid, may be used. In this case, as described above, the washing liquid may be supplied intermittently into the production device or may be supplied continuously into the production device.

(Washing Liquid)

The washing liquid used in a case of washing the production device is not particularly limited, and known washing liquids can be used.

Examples of the washing liquid include water, alkylene glycol monoalkyl ether carboxylate, alkylene glycol monoalkyl ether, alkyl lactate, alkyl alkoxyalkyl propionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

In addition, as the washing liquid, for example, those described in JP2016-057614A, JP2014-219664A, JP2016-138219A, and JP2015-135379A may be used.

As the washing liquid, a washing liquid containing at least one selected from the group consisting of propylene glycol monomethyl ether (PGME), cyclopentane (CyPe), cyclopentanone (CyPn), butyl acetate (nBA), propylene glycol monomethyl ether acetate (PGMEA), cyclohexanone (CyHe), ethyl lactate (EL), methyl 2-hydroxyisobutyrate (HBM), cyclopentanonedimethyl acetal (DBCPN), γ-butyrolactone (γBL), dimethyl sulfoxide (DMSO), ethylene carbonate (EC), propylene carbonate (PC), 1-methyl-2-pyrrolidone (NMP), isoamyl acetate (iAA), 2-propanol (IPA), methyl ethyl ketone (MEK), and 4-methyl-2-pentanol (MIBC) is preferable, a washing liquid containing at least one selected from the group consisting of PGMEA, NMP, PGME, nBA, PC, CyHe, γBL, MIBC, EL, DMSO, iAA, MEK, PC, and CyPe is more preferable, and a washing liquid containing at least one selected from the group consisting of PGMEA, NMP, PGME, nBA, PC, CyHe, γBL, MIBC, EL, DMSO, iAA, MEK, PC, and CyPe is still more preferable.

In addition, the washing liquid may be used singly or in combination of two or more kinds thereof.

In addition to the above, examples of the washing liquid include alcohols such as methanol, ethanol, propanol, butanol, methoxyethanol, butoxyethanol, methoxypropanol, and ethoxypropanol; ketones such as acetone; ethers such as tetrahydrofuran, dioxane, ethylene glycol dimethyl ether, and diethylene glycol dimethyl ether; esters such as ethyl acetate and ethyl cellosolve acetate; aromatic compounds such as benzene, toluene, and xylene; and chlorinated hydrocarbons such as dichloromethane, dichloroethane, dichloroethylene, and trichloroethylene.

[Kit]

The treatment liquid according to the embodiment of the present invention may be used in a form of a kit to which other raw materials are separately added. In this case, such other raw materials which are separately added during the use can be used in mixture with an organic solvent, and compounds varying depending on the applications. From the viewpoint that the effects of the present invention can be remarkably obtained, in a case where an organic solvent usable in this case has a content of each of the metal component and water included therein are in the range of the specific values of the present invention as described above, desired effects of the present invention are remarkably obtained.

[Container (Housing Container)]

The treatment liquid according to the embodiment of the present invention can fill any container to be stored, transported, and then used as long as a corrosion property is not a problem (regardless of the container being a kit or not). As the container, a container whose cleanliness is high and in which the amount of impurities to be eluted is small is preferable for the purpose of using the container for a semiconductor.

Examples of a usable container include, but are not limited to, "CLEAN BOTTLE" series (manufactured by Aicello Chemical Co., Ltd.) or "PURE BOTTLE" (manufactured by Kodama Plastics Co., Ltd.).

The inner wall (that is, the liquid contact portion in contact with the treatment liquid) of the container is preferably formed of a non-metal material (for example, one or more resins that are selected from the group consisting of a polyethylene resin, a polypropylene resin, and a polyethylene-polypropylene resins, and other resins), stainless steel, Hastelloy, Inconel, Monel, and a metal material which has been subjected to a metal elution prevention treatment.

As such other resins, a fluorine-based resin (perfluoro resin) can be preferably used. In this manner, by using a container having an inner wall which is a fluorine-based resin, occurrence of a problem of elution of ethylene or propylene oligomers can be suppressed, as compared with a case of using a container having an inner wall which is a polyethylene resin, a polypropylene resin, or a polyethylene-polypropylene resin.

Specific examples of the fluorine-based resin include the "fluorine-containing resins" described in the liquid contact portions of the production device as described above.

Specific examples of such a container having an inner wall which is a fluorine-based resin include a Fluoro-PurePFA composite drum manufactured by Entegris Inc. Further, the containers described in page 4 of JP1991-502677A (JP-H03-502677A), page 3 of WO2004/016526A, pages 9 and 16 of WO99/046309A, or the like can also be used. In addition, in a case where a non-metal material is used for the inner wall, it is preferable to suppress the elution of the non-metal material into the treatment liquid.

Moreover, for the inner wall of the container, the quartz and the electropolished metal material (that is, the metal material which has been completely electropolished) are also preferably used, in addition to the above-mentioned fluorine-based resin. In a case of using a container having such an inner wall, it is difficult for the specific metal component and/or the organic impurities to be eluted in the treatment liquid stored in the container.

The metal material used for the production of the electropolished metal materials is preferably a metal material which contains at least one selected from the group consisting of chromium and nickel, and has a total content of chromium and nickel of more than 25% by mass with respect to the total mass of the metal material. Examples of the metal material include stainless steel and a nickel-chromium alloy.

The total content of chromium and nickel in the metal material is preferably 25% by mass or more, and more preferably 30% by mass or more, with respect to the total mass of the metal material.

In addition, the upper limit value of the total content of chromium and nickel in the metal material is not particularly limited, but in general, it is preferably 90% by mass or less.

The stainless steel is not particularly limited, and known stainless steel can be used. Among those, an alloy containing 8% by mass or more of nickel is preferable, and austenitic stainless steel containing 8% by mass or more of nickel is more preferable. Examples of the austenitic stainless steel include Steel Use Stainless (SUS) 304 (Ni content of 8% by mass, Cr content of 18% by mass), SUS 304L (Ni content of 9% by mass, Cr content of 18% by mass), SUS 316 (Ni content of 10% by mass, Cr content of 16% by mass), and SUS 316L (Ni content of 12% by mass, Cr content of 16% by mass).

The nickel-chromium alloy is not particularly limited, and a known nickel-chromium alloy can be used. Among those, a nickel-chromium alloy having a nickel content of 40% to 75% by mass and a chromium content of 1% to 30% by mass is preferable.

Examples of the nickel-chromium alloy include Hastelloy (trade name, hereinafter, the same shall apply), Monel (trade name, hereinafter, the same shall apply), and Inconel (trade name, hereinafter, the same shall apply), and more specifically, include Hastelloy C-276 (Ni content of 63% by mass, Cr content of 16% by mass), Hastelloy-C(Ni content of 60% by mass, Cr content of 17% by mass), and Hastelloy C-22 (Ni content of 61% by mass, Cr content of 22% by mass).

In addition, the nickel-chromium alloy may further contain boron, silicon, tungsten, molybdenum, copper, cobalt, or the like, as desired, in addition to the above-mentioned alloys.

The method of electropolishing the metal material is not particularly limited, and known methods can be used. For example, the methods described in paragraphs [0011] to [0014] of JP2015-227501A, paragraphs [0036] to [0042] of JP2008-264929A, or the like can be used.

It is presumed that the metal material has a larger content of chromium in the passivation layer on the surface than the content of chromium in the parent phase by electropolishing the metal material. As a result, it is presumed that since it is difficult for the metal component to flow into the treatment liquid from the inner wall coated with the electropolished metal material, it is possible to obtain a treatment liquid for a semiconductor having a reduced amount of the specific metal component.

In addition, it is preferable that the metal material is buffed. The buffing method is not particularly limited, and known methods can be used. The size of the abrasive grain used to finish the buffing is not particularly limited, but is preferably #400 or less in view that the unevenness of the surface of the metal material is likely to be smaller.

Incidentally, buffing is preferably performed before the electropolishing.

In addition, the metal material may be subjected to a treatment including one of buffing, acid washing, magnetic fluid polishing, and the like or a combination of two or more thereof in a plurality of steps that are performed by changing the number of a size or the like of the abrasive grains.

In the present invention, the container and the treatment liquid housed in the container may be referred to as a treatment liquid housing body in some cases.

For the container, it is preferable to wash the inside of the container before filling. The metal component included in the liquid used for washing is preferably present in the amount in the range of the content of the metal component in the treatment liquid. The liquid may be appropriately selected depending on the application, but as long as the liquid is a liquid having a content of the metal component adjusted to be in the same range to that of the treatment liquid by purifying other organic solvents; the treatment liquid according to the embodiment of the present invention as it is; a dilution of the treatment liquid according to the embodiment of the present invention; or a liquid including at least one of the components added to the treatment liquid according to the embodiment of the present invention, the effects of the present invention are remarkably obtained.

The inside of the container is preferably washed before housing the treatment liquid. The liquid used for the washing is preferably the washing liquid, the treatment liquid itself, or a dilution of the treatment liquid.

Incidentally, lids of various containers are washed with an acid or an organic solvent before washing the containers, or the like to remove foreign matters adhering to the lids, thereby preventing the incorporation of the foreign matters from the lids, which is thus preferable.

The treatment liquid according to the embodiment of the present invention may be bottled in a container such as a gallon bottle or a coated bottle after being produced, and then transported and stored in the container. The gallon bottle may be one formed using a glass material or others.

In order to prevent the modifications in the components in the treatment liquid during the storage, the inside of the container may be purged with inert gas (nitrogen, argon, or the like) with a purity 99.99995% by volume or more. In particular, a gas having a low moisture content is preferable. In addition, during the transportation or storage, the temperature may be controlled to a normal temperature in the range of −20° C. to 20° C. to prevent deterioration.

[Clean Room]

It is preferable that handlings including production of the treatment liquid according to the embodiment of the present invention, opening and/or washing of a housing container, filling of the treatment liquid, and the like, treatment analysis, and measurements are all performed in clean rooms. The clean rooms preferably satisfy 14644-1 clean room standards. It is preferable to satisfy any one of International Standards Organization (ISO) Class 1, ISO Class 2, ISO Class 3, and ISO Class 4, it is more preferable to satisfy either ISO Class 1 or ISO Class 2, and it is still more preferable to satisfy ISO Class 1.

<Filtering>

It is preferable that the treatment liquid according to the embodiment of the present invention is filtered in order to adjust the contents of the metal component and water to be in desired ranges or to remove foreign matters, coarse particles, and the like.

As a filter used for filtering, any filter which has been used in the filtering applications or the like from the related art can be used without particular limitation. Examples of the materials constituting the filter include fluorine resins such as polytetrafluoroethylene (PTFE), polyamide-based resins such as nylon, and polyolefin resins (including a high-density polyolefin and an ultrahigh-molecular-weight polyolefin) such as polyethylene and polypropylene (PP). Among these materials, polyamide-based resins, PTFE, and polypropylene (including high-density polypropylene) are preferable, and by using a filter formed with these materials, high-polarity foreign matters which are likely to cause residue defects or particle defects can be more effectively removed, and in addition, the amount of the specific metal component of the present invention can be more efficiently reduced.

For the critical surface tension of the filter, the lower limit value is preferably 70 mN/m or more, and the upper limit value is preferably 95 mN/m or less. In particular, the critical surface tension of the filter is preferably from 75 mN/m to 85 mN/m.

In addition, the value of the critical surface tension is a nominal value of a filter manufacturer. By using a filter having a critical surface tension in the range, high-polarity foreign matters which are likely to cause residue defects or particle defects can be more effectively removed, and in addition, the amount of the specific metal component of the present invention can be more efficiently reduced.

The pore diameter of the filter is preferably approximately 0.001 to 1.0 μm, more preferably approximately 0.02 to 0.5 μm, and more preferably approximately 0.01 to 0.1 μm. By adjusting the pore diameter of the filter to be in the range, it is possible to reliably remove fine foreign matters included in the treatment liquid while suppressing clogging in filtering.

In addition, from the viewpoint of reducing the amount of the specific metal component of the present invention, it is preferable that the pore diameter of the filter is set to 0.05 μm or less. The pore diameter of the filter in case of adjusting the amount of the specific metal component is more preferably from 0.005 μm to 0.04 μm, and still more preferably from 0.01 μm to 0.02 μm. With the pore diameter being in the range, the pressure required for filtering can be kept low, filtering can be efficiently performed, and thus, the desired effects of the present invention are remarkably obtained.

In a case of using filters, different filters may be combined. At that time, the filtering with the first filter may be performed once or twice or more times. In a case where the filtering is performed twice or more times by combining different filters, the respective filters may be of the same kinds or of different kinds from each other, and are preferably of different kinds from each other. Typically, it is preferable that the first filter and the second filter have a difference in at least one of the pore diameter or the constituent materials.

The pore diameter of the second time or later is preferably the same as or smaller than the pore diameter of the first filtering. In addition, the first filters with different pore diameters may be combined in the ranges described above. Here, with regard to the pore diameters, reference can be made to nominal values of filter manufacturers. A commercially available filter may be selected from various filters provided by Nihon Pall Ltd., Advantech Toyo Roshi Kaisha., Ltd., Nihon Entegris K. K. (formerly Nippon Microlith Co., Ltd.), Kitz Micro Filter Corporation, or the like, for example. Further, a polyamide-made P-nylon Filter (pore diameter of 0.02 μm, critical surface tension of 77 mN/m)"; (manufactured by Nihon Pall Ltd.), a high-density polyethylene-made "PE•clean filter (pore diameter of 0.02 μm)"; (manufactured by Nihon Pall Ltd.), and a high-density polyethylene-made "PE•clean filter (pore diameter of 0.01 μm)"; (manufactured by Nihon Pall Ltd.) can also be used.

As the second filter, a filter formed of the same materials as those of the first filter can be used. A filter having the same pore diameter as that of the above-mentioned first filter can be used. In a case of using the first filter having a smaller pore diameter than that of the second filter, the ratio of the pore diameter of the second filter to the pore diameter of the first filter (pore diameter of second filter/pore diameter of first filter) is preferably 0.01 to 0.99, more preferably 0.1 to 0.9, and still more preferably 0.3 to 0.9. By adjusting the pore diameter of the second filter to be in the range, fine foreign matters incorporated into the treatment liquid can be more reliably removed.

For example, filtering using a first filter may be performed with a mixed liquid including a part of the treatment liquid, the residual components may be mixed therewith to prepare a treatment liquid, and then second filtering may be carried out.

Moreover, the filter used is preferably treated before filtering the treatment liquid. The liquid used in this treatment is not particularly limited, but as long as the liquid is a liquid having a content of the metal component adjusted to be in the same range as that of the treatment liquid by purifying organic solvents; the treatment liquid according to the embodiment of the present invention as it is; a dilution of the treatment liquid according to the embodiment of the present invention; or a liquid containing the components included in the treatment liquid, desired effects of the present invention are remarkably obtained.

In a case of performing filtering, the upper limit value in the temperature during the filtering is preferably room temperature (25° C.) or lower, more preferably 23° C. or lower, and still more preferably 20° C. or lower. Further, the lower limit value in the temperature during the filtering is preferably 0° C. or higher, more preferably 5° C. or higher, and still more preferably 10° C. or higher.

By the filtering, particulate foreign matters or impurities can be removed, but in a case of performing the filtering at the temperature, the amounts of the particulate foreign matters or impurities dissolved in the treatment liquid are reduced, and thus, the filtering is more efficiently performed.

In particular, it is preferable that the treatment liquid according to the embodiment of the present invention including an ultratrace amount of the specific metal component is filtered at the above temperature. Although the mechanism is not clear, it is considered that most of the specific metal component is present in the particulate colloidal state. It is considered that in a case of performing filtering at the above temperature, some of the specific metal components floating in the colloidal shape are aggregated, the aggregates are thus efficiently removed by filtering, and therefore, the content of the specific metal component is easily adjusted to the desired amount of the present invention.

Moreover, the filter used is preferably treated before filtering the treatment liquid. The liquid used in this treatment is not particularly limited, but the content of the above-mentioned specific metal component is preferably less than 0.001 ppt by mass. As long as the liquid is a liquid having a content of the above-mentioned specific metal component adjusted to be in the above range by purifying organic solvents other than the above-mentioned specific organic solvents; the treatment liquid according to the embodiment of the present invention as it is; a dilution of the treatment liquid; or a liquid having reduced specific metal components, impurities, and coarse particles by further performing purification, desired effects of the present invention are remarkably obtained.

<Applications>

The treatment liquid according to the embodiment of the present invention is a treatment liquid for a semiconductor device. In the present invention, the expression, "for a semiconductor device" means a use in the manufacture of a semiconductor device. The treatment liquid according to the embodiment of the present invention can also be used in any steps for manufacturing a semiconductor device (for example, a lithography step, an etching step, an ion implantation step, and a peeling step), and can also be used in treatments of, for example, an insulating film, a resist film, an etching residue, an antireflection film, and ashing residues, which are present on a substrate.

The treatment liquid is used as a pre-wet liquid applied on a substrate in order to improve the coatability of an actinic ray-sensitive or radiation-sensitive composition before a step of forming a resist film by using the composition; a washing liquid (for example, a rinsing liquid) used for the removal of residues such as etching residues adhering onto a metal film or an insulating film, or the like; a solution (for example, a remover and a peeling liquid) used for the removal of various resist films for pattern formation; a solution (for example, a remover and a peeling liquid) used for the removal of a permanent film (for example, a color filter, a transparent insulating film, and a resin-made lens), or the like from a semiconductor substrate; or the like. Further, the treatment liquid can also be used as a developer for various resists for pattern formation. In addition, the treatment liquid can also be used to rinse an edge line of a semiconductor substrate before and after the application of the resist. Incidentally, the treatment liquid can be used as a diluent of a resin contained in a resist liquid (which will be described later). That is, the treatment liquid can also be used as a solvent contained in the actinic ray-sensitive or radiation-sensitive composition.

Furthermore, the semiconductor substrate after removal of the permanent film may be used again in a case of using a semiconductor device in some cases, and therefore, the removal of the permanent film shall be included in the step for manufacturing a semiconductor device.

Here, in a case where a large amount of impurities are included in the rinsing liquid and the pre-wet liquid, components derived from impurities and impurities remain in the obtained semiconductor device, as compared with other liquids (for example, a developer), and thus, defects are easily generated. To the contrary to such a problem, the treatment liquid according to the embodiment of the present invention has a small content of impurities, and therefore, in a case where it is used in the rinsing liquid and the pre-wet liquid, the effects of the present invention are more remarkably exhibited. From such a viewpoint, it is preferable that the treatment liquid according to the embodiment of the present invention is used in at least one of the rinsing liquid or the pre-wet liquid.

Moreover, the treatment liquid according to the embodiment of the present invention can also be suitably used in applications other than semiconductor applications, and can also be used as a developer, a rinsing liquid, or the like for a polyimide, a resist for a sensor, a resist for a lens, or the like.

In addition, the treatment liquid according to the embodiment of the present invention can also be used as a solvent for medical uses or washing applications. In particular, it can be suitably used to wash a container, a pipe, and a substrate (for example, a wafer and a glass).

<Pattern Forming Method>

The treatment liquid according to the embodiment of the present invention is used for a developer, a rinsing liquid, a pre-wet liquid, a peeling liquid, or the like in a method for manufacturing a semiconductor device, and in an aspect, in the pattern forming method included in the manufacture of a semiconductor device method, the treatment liquid is preferably used as a developer, a rinsing liquid, or a pre-wet liquid, and more preferably used as a rinsing liquid or a pre-wet liquid.

A pattern forming method using the treatment liquid according to the embodiment of the present invention includes a resist film forming step in which an actinic ray-sensitive or radiation-sensitive composition (hereinafter also referred to as a "resist composition") is applied onto a substrate to form an actinic ray-sensitive or radiation-sensitive film (hereinafter also referred to as a "resist film"), an exposing step in which the resist film is exposed, and a treating step in which the substrate before the application of the resist composition or the exposed resist film is treated with the treatment liquid according to the embodiment of the present invention.

In the pattern forming method using the treatment liquid according to the embodiment of the present invention, the treatment liquid according to the embodiment of the present invention may be used as any one of a developer, a rinsing liquid, or a pre-wet liquid.

Hereinafter, the respective steps of the pattern forming method using the treatment liquid according to the embodiment of the present invention will be described. As an example of the treatment steps using the treatment liquid according to the embodiment of the present invention will be described for each of a pre-wet step, a developing step, and a rinsing step.

<Pre-Wet Step>

The pattern forming method using the treatment liquid according to the embodiment of the present invention may also include a pre-wet step in which a pre-wet liquid is applied onto a substrate in advance in order to improve the coatability before a step of forming a resist film using the actinic ray-sensitive or radiation-sensitive composition. For example, with regard to the pre-wet step, reference can be made to the description in JP2014-220301A, which is hereby incorporated by reference.

<Resist Film Forming Step>

The resist film forming step is a step of forming a resist film using an actinic ray-sensitive or radiation-sensitive composition, and can be performed, for example, by the following method.

In order to form a resist film (actinic ray-sensitive or radiation-sensitive composition film) on a substrate using an actinic ray-sensitive or radiation-sensitive composition, the respective components which will be described below are dissolved in a solvent to prepare an actinic ray-sensitive or radiation-sensitive composition, and the actinic ray-sensitive or radiation-sensitive composition is filtered through a filter, as desired, and applied onto the substrate. As the filter, a polytetrafluoroethylene-made, polyethylene-made, or nylon-made filter having a pore size of 0.1 μm or less, more preferably 0.05 μm or less, and still more preferably 0.03 μm or less is preferable.

The actinic ray-sensitive or radiation-sensitive composition is applied onto a substrate (for example, silicon and a silicon dioxide coating) which is used for the manufacture of an integrated circuit element, using a suitable coating method such as a method using a spinner. Thereafter, the actinic ray-sensitive or radiation-sensitive composition is dried to form a resist film. Various undercoat layers (an inorganic film, an organic film, or an antireflection film) may be formed on the underlayer of the resist film, as desired.

As the drying method, a method of drying the composition by heating is generally used. Heating may be performed using a means provided in typical exposure devices or development devices, and may be performed using a hot plate or the like.

The heating temperature is preferably 80° C. to 180° C., more preferably 80° C. to 150° C., still more preferably 80° C. to 140° C., and particularly preferably 80° C. to 130° C. The heating time is preferably 30 to 1,000 seconds, more preferably 60 to 800 seconds, and still more preferably 60 to 600 seconds.

The film thickness of the resist film is generally 200 nm or less, and preferably 100 nm or less.

For example, in order to resolve a 1:1 line-and-space pattern having a size of 30 nm or less, the film thickness of a resist film to be formed is preferably 50 nm or less. In a case where a resist film having a film thickness of 50 nm or less is applied to a developing step which will be described below, pattern collapse is not likely to occur, and superior resolution performance is obtained.

The film thickness is more preferably in the range of 15 nm to 45 nm. In a case where the film thickness is 15 nm or more, sufficient etching resistance is obtained. The film thickness is still more preferably is in the range of 15 nm to 40 nm. In a case where the film thickness is in this range, etching resistance and superior resolution performance can be simultaneously satisfied.

Moreover, in the pattern forming method using the treatment liquid according to the embodiment of the present invention, an upper layer film (topcoat film) may be formed on the upper layer of the resist film. The upper layer film can be formed using a composition for forming an upper layer film containing a hydrophobic resin, an acid generator, and a basic compound. The upper layer film and the composition for forming an upper layer film are as described later.

<Exposing Step>

The exposing step is a step of exposing the resist film, and can be performed, for example, using the following method.

The resist film formed as described above is irradiated with actinic rays or radiation through a predetermined mask. For irradiation of electron beams, drawing (direct drawing) not using a mask is common.

The actinic rays or radiation is not particularly limited, and examples thereof include KrF excimer laser, ArF excimer laser, extreme ultraviolet (EUV) light, and electron beams (EB). The exposure may be liquid immersion exposure.

<Baking>

In the pattern forming method using the treatment liquid according to the embodiment of the present invention, it is preferable that baking (heating) is performed before development after exposure. Due to the baking, a reaction of an exposed area is accelerated, and the sensitivity or the pattern shape is improved.

The heating temperature is preferably 80° C. to 150° C., more preferably 80° C. to 140° C., and still more preferably 80° C. to 130° C.

The heating time is preferably 30 to 1,000 seconds, more preferably 60 to 800 seconds, and still more preferably 60 to 600 seconds.

Heating may be performed using a means provided in typical exposure devices or development devices, and may be performed using a hot plate or the like.

<Developing Step>

The developing step is a step of developing the exposed resist film with the developer.

As the developing method, for example, a method of dipping a substrate in a bath filled with a developer for a given period of time (dipping method); a method of causing a developer to accumulate on the surface of a substrate with a surface tension and maintaining this state for a given period of time (puddle method); a method of spraying a developer onto a surface of a substrate (spraying method); and a method of continuously jetting a developer to a substrate rotating at a given speed, while scanning a developer jetting nozzle on a substrate at a given speed (dynamic dispense method) can be applied.

In addition, a step of stopping development while replacing the solvent with another solvent may be performed after the developing step.

The developing time is not particularly limited as long as it is a period of time where an unexposed area of a resin is sufficiently dissolved. The developing time is typically 10 to 300 seconds and preferably 20 to 120 seconds.

The temperature of the developer is preferably 0° C. to 50° C. and more preferably 15° C. to 35° C.

As the developer used in the developing step, the above-described treatment liquid is preferably used. The developer is as described above. In addition to the development using the treatment liquid, development using an alkali developer may be further performed (so-called double development).

<Rinsing Step>

The rinsing step is a step of performing washing (rinsing) by a rinsing liquid after the developing step.

In the rinsing step, the wafer which has been subjected to development is subjected to a washing treatment using the above rinsing liquid.

The method for the washing treatment is not particularly limited, but it is possible to apply, for example, a method of continuously jetting a rinsing liquid on a substrate rotating at a given speed (rotation jetting method), a method of dipping a substrate in a bath filled with a rinsing liquid for a given period of time (dip method), or a method of spraying a rinsing liquid onto the surface of a substrate (spray method), and among these, it is preferable that the washing treatment is carried out by the rotation jetting method and after the washing, the substrate is rotated at a rotation speed of 2,000 rpm to 4,000 rpm to remove the rinsing liquid from the substrate.

The rinsing time is not particularly limited, but is usually 10 seconds to 300 seconds, preferably 10 seconds to 180 seconds, and most preferably 20 seconds to 120 seconds.

The temperature of the rinsing liquid is preferably 0° C. to 50° C. and more preferably 15° C. to 35° C.

Furthermore, a treatment of removing the developer or rinsing liquid adhering on the pattern by a supercritical fluid may be carried out after the developing treatment or rinsing treatment.

In addition, after the developing treatment, the rinsing treatment, or the treatment with a supercritical fluid, a heat treatment may be carried out to remove the solvent remaining in the pattern. The heating temperature is not particularly limited as long as a good resist pattern can be obtained, and is usually 40° C. to 160° C. The heating temperature is preferably 50° C. to 150° C., and most preferably 50° C. to 110° C. The heating time is not particularly limited as long as a good resist pattern can be obtained, but is usually 15 to 300 seconds, and preferably 15 to 180 seconds.

It is preferable to use the above-mentioned treatment liquid as the rinsing liquid. The description of the rinsing liquid is as described above.

In the pattern forming method using the treatment liquid according to the embodiment of the present invention, any one of the developer, the rinsing liquid, or the pre-wet liquid as described above may be the above-mentioned treatment liquid according to the embodiment of the present invention, but any two of the developer, the rinsing liquid, or the pre-wet liquid may be the treatment liquid according to the embodiment of the present invention, but three of the developer, the rinsing liquid, and the pre-wet liquid may also be the treatment liquid according to the embodiment of the present invention.

In an aspect, it is preferable that the treatment liquid and the actinic ray-sensitive or radiation-sensitive resin composition, which are used in the pattern forming method using the treatment liquid according to the embodiment of the present invention, satisfy the following relationship.

That is, it is preferable to use the actinic ray-sensitive or radiation-sensitive resin composition and the treatment liquid according to the embodiment of the present invention, in which the dissolution rate of the actinic ray-sensitive or radiation-sensitive film formed using the actinic ray-sensitive or radiation-sensitive resin composition in the treatment liquid according to the embodiment of the present invention satisfies the relationship of 0.0016 to 0.33 nm/sec.

Here, the dissolution rate of the actinic ray-sensitive or radiation-sensitive film in the treatment liquid according to the embodiment of the present invention is a decreasing rate of a film thickness upon immersion in the treatment liquid according to the embodiment of the present invention after forming the actinic ray-sensitive or radiation-sensitive film, and the dissolution rate at 23° C. is used in the present invention. This dissolution rate is more preferably 0.0016 to 0.16 nm/sec, and still more preferably 0.0016 to 0.08 nm/sec.

<Actinic Ray-Sensitive or Radiation-Sensitive Composition (Resist Composition)>

Next, the actinic ray-sensitive or radiation-sensitive composition which is preferably used in combination with the treatment liquid according to the embodiment of the present invention will be described in detail.

(A) Resin

It is preferable that a resin (A) is contained as the actinic ray-sensitive or radiation-sensitive composition which is preferably used in combination with the treatment liquid according to the embodiment of the present invention. The resin (A) has at least (i) a repeating unit having a group that decomposes by the action of an acid to generate a carboxyl group (which may further include a repeating unit having a phenolic hydroxyl group), or includes may at least (ii) a repeating unit having a phenolic hydroxyl group.

Furthermore, in a case where the resin (A) has the repeating unit that decomposes by the action of an acid to generate a carboxyl group, the solubility in an alkali developer increases and the solubility in the organic solvent increases due to the action of an acid.

Examples of the repeating unit having a phenolic hydroxyl group contained in the resin (A) include a repeating unit represented by General Formula (I).

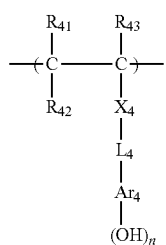

(I)

In the formula, $R_{41}$, $R_{42}$, and $R_{43}$ each independently represent a hydrogen atom, an alkyl group, a halogen atom, a cyano group, or an alkoxycarbonyl group, provided that $R_{42}$ may be bonded to $Ar_4$ to form a ring, and in this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents a (n+1)-valent aromatic ring group, and in a case where $Ar_4$ is bonded to $R_{42}$ to form a ring, $Ar_4$ represents a (n+2)-valent aromatic ring group.

n represents an integer of 1 to 5.

Examples of the alkyl group of $R_{41}$, $R_{42}$, or $R_{43}$ in General Formula (I) preferably include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, more preferably include an alkyl group having 8 or less carbon atoms, and particularly preferably include an alkyl group having 3 or less carbon atoms, each of which may have a substituent.

The cycloalkyl group of $R_{41}$, $R_{42}$, or $R_{43}$ in General Formula (I) may be either monocyclic or polycyclic. Preferred examples thereof include a monocyclic cycloalkyl group having 3 to 8 carbon atoms, such as a cyclopropyl group, a cyclopentyl group, and a cyclohexyl group, each of which may have a substituent.

Examples of the halogen atom of $R_{41}$, $R_{42}$, or $R_{43}$ in General Formula (I) include a fluorine atom, a chlorine atom, a bromine atom, and an iodine atom, with the fluorine atom being particularly preferable.

The alkyl group included in the alkoxycarbonyl group of $R_{41}$, $R_{42}$, or $R_{43}$ in General Formula (I) is preferably the same as the alkyl group in $R_{41}$, $R_{42}$, or $R_{43}$.

Preferred examples of a substituent of each of the groups include an alkyl group, a cycloalkyl group, an aryl group, an amino group, an amido group, an ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms in the substituent is preferably 8 or less.

$Ar_4$ represents an (n+1)-valent aromatic ring group. In a case where n represents 1, a divalent aromatic ring group may have a substituent, and preferred examples thereof include an arylene group having 6 to 18 carbon atoms, such as a phenylene group, a tolylene group, a naphthylene group, or an anthracenylene group; and an aromatic ring group having a heterocycle such as thiophene, furan, pyrrole, benzothiophene, benzofuran, benzopyrrole, triazine, imidazole, benzimidazole, triazole, thiadiazole, and thiazole.

In a case where n represents an integer of 2 or more, suitable specific examples of the (n+1)-valent aromatic ring group include groups obtained by removing any (n−1) hydrogen atoms from the specific examples of the above-described divalent aromatic ring groups.

The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group include the alkyl groups mentioned above for $R_{41}$, $R_{42}$, or $R_{43}$ in General Formula (I), and alkoxy groups such as a methoxy group, an ethoxy group, a hydroxyethoxy group, a propoxy group, a hydroxypropoxy group, and a butoxy group; and aryl groups such as a phenyl group.

Preferred examples of the alkyl group of $R_{64}$ in —CONR$_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and more preferred examples of the alkyl group include an alkyl group having 8 or less carbon atoms, each of which may have a substituent.

$X_4$ is preferably a single bond, —COO—, or —CONH—, and more preferably a single bond or —COO—.

Preferred examples of the alkylene group in $L_4$ include an alkylene group having 1 to 8 carbon atoms, which may have a substituent, such as a methylene group, an ethylene group, a propylene group, a butylene group, a hexylene group, and an octylene group.

As $Ar_4$, an aromatic ring group having 6 to 18 carbon atoms, which may have a substituent, is more preferable, and a benzene ring group, a naphthalene ring group, or a biphenylene ring group is particularly preferable.

The repeating unit represented by General Formula (I) preferably includes a hydroxystyrene structure. That is, $Ar_4$ is preferably a benzene ring group.

Preferred examples of the repeating unit having a phenolic hydroxyl group contained in the resin (A) include a repeating unit represented by General Formula (p1).

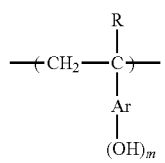
(p1)

R in General Formula (p1) represents a hydrogen atom, a halogen atom, or a linear or branched alkyl group having 1 to 4 carbon atoms. A plurality of R's may be the same as or different from each other. R in General Formula (p1) is particularly preferably a hydrogen atom.

Ar in General Formula (p1) represents an aromatic ring, and examples thereof include an aromatic hydrocarbon ring having 6 to 18 carbon atoms, which may have a substituent, such as a benzene ring, a naphthalene ring, an anthracene ring, a fluorene ring, or a phenanthrene ring; and an aromatic ring heterocycle having a heterocycle such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, or a thiazole ring. Among these, a benzene ring is most preferable.

m in General Formula (p1) represents an integer of 1 to 5, and is preferably 1.

Specific examples of the repeating unit having a phenolic hydroxyl group included in the resin (A) are shown below, but the present invention is not limited thereto. In the formulae, a represents 1 or 2.

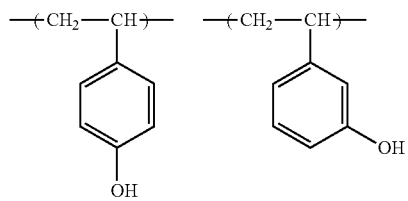

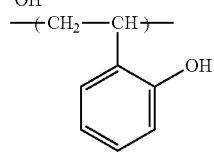

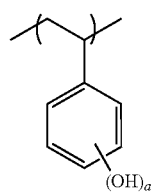
(B-1)

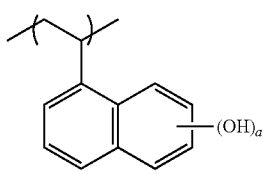
(B-2)

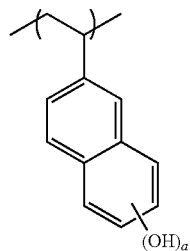
(B-3)

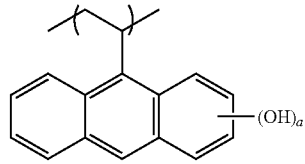
(B-4)

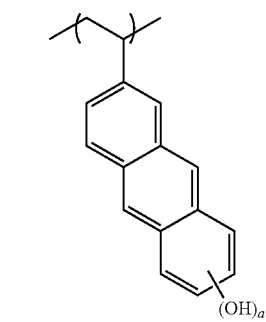
(B-5)

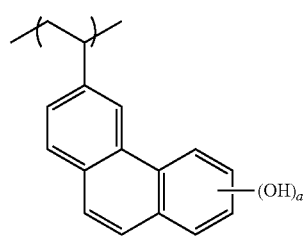
(B-6)

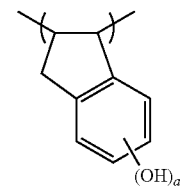
(B-7)

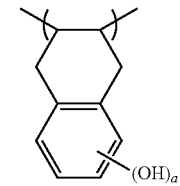
(B-8)

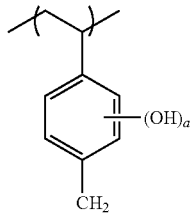
(B-9)

-continued
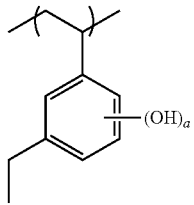 (B-10)
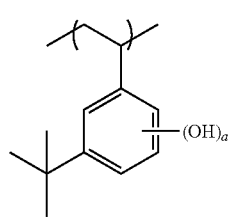 (B-11)
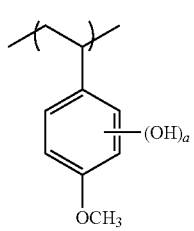 (B-12)
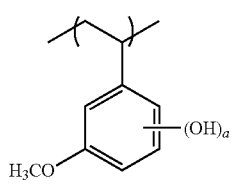 (B-13)
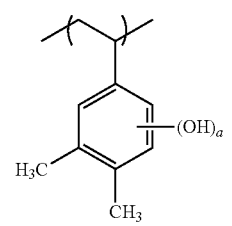 (B-14)
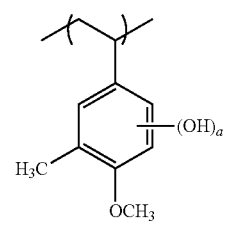 (B-15)
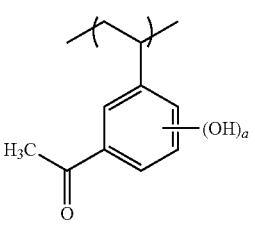 (B-16)
-continued
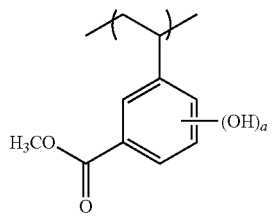 (B-17)
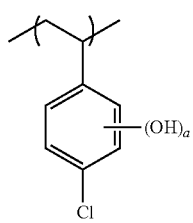 (B-18)
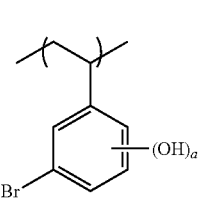 (B-19)
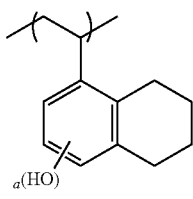 (B-20)
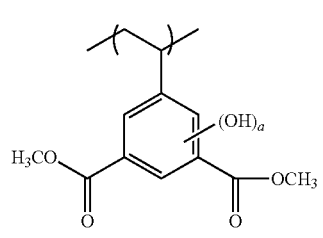 (B-21)
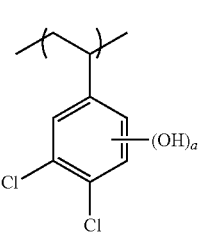 (B-22)
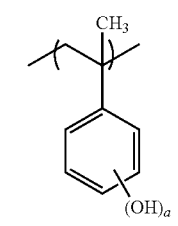 (B-23)

-continued
(B-24) 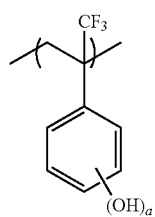
(B-25) 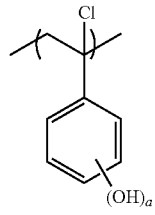
(B-26) 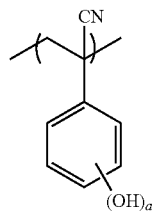
(B-27) 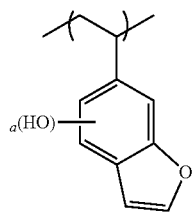
(B-28) 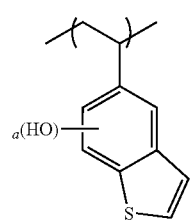
(B-29) 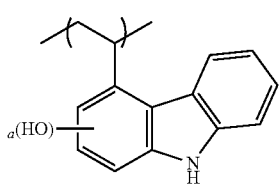
(B-30) 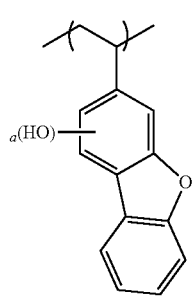
-continued
(B-31) 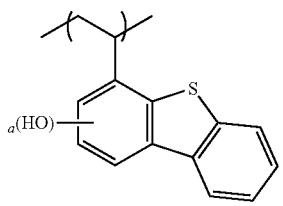
(B-32) 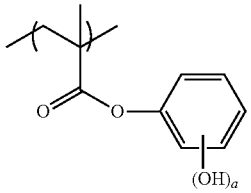
(B-33) 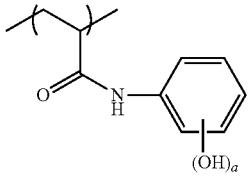
(B-34) 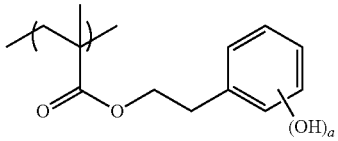
(B-35) 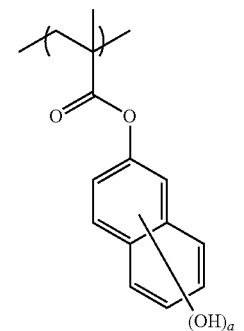
(B-36) 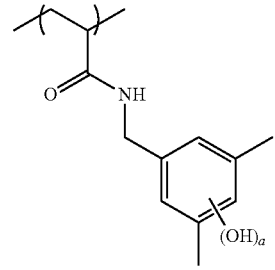
(B-37) 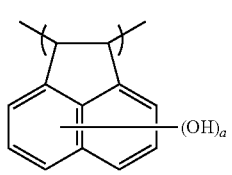

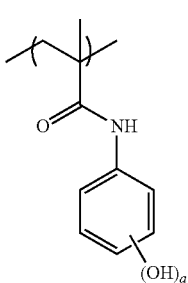
(B-38)

The content of the repeating units having a phenolic hydroxyl group is preferably 0% to 50% by mole, more preferably 0% to 45% by mole, and still more preferably 0% to 40% by mole with respect to all the repeating units in the resin (A).

The repeating unit having a group that decomposes by the action of an acid to generate a carboxyl group, which is contained in the resin (A), is a repeating unit having a group which is substituted with a group obtained by a hydrogen atom leaving from a carboxyl group due to decomposition caused by the action of an acid.

Examples of the group which leaves by an acid include $-C(R_{36})(R_{37})(R_{38})$, $-C(R_{36})(R_{37})(OR_{39})$, and $-C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ to $R_{02}$ each independently represent a hydrogen atom, an alkyl group, a cycloalkyl group, an aryl group, an aralkyl group, or an alkenyl group.

As the repeating unit having a group that decomposes by the action of an acid to generate a carboxyl group, which is contained in the resin (A), a repeating unit represented by General Formula (AI) is preferable.

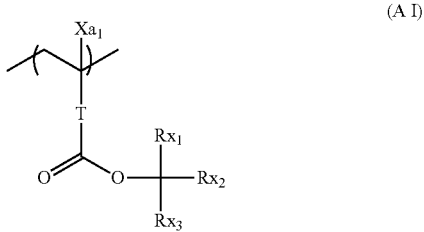
(A I)

In General Formula (AI), $Xa_1$ represents a hydrogen atom or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group, provided that in a case where all of $Rx_1$ to $Rx_3$ are an (linear or branched) alkyl group, it is preferable that at least two of $Rx_1$, $Rx_2$, or $Rx_3$ are methyl groups.

Two of $Rx_1$ to $Rx_3$ may be bonded to each other to form a (monocyclic or polycyclic) cycloalkyl group.

Examples of the alkyl group which may have a substituent represented by $Xa_1$ include a methyl group or a group represented by $-CH_2-R_{11}$. $R_{11}$ represents a halogen atom (a fluorine atom and the like), a hydroxyl group, or a monovalent organic group, and examples thereof include an alkyl group having 5 or less carbon atoms and an acyl group having 5 or less carbon atoms. An alkyl group having 3 or less carbon atoms is preferable, and a methyl group is more preferable. In one aspect, $Xa_1$ is preferably a hydrogen atom, a methyl group, a trifluoromethyl group, or a hydroxymethyl group.

Examples of the divalent linking group of T include an alkylene group, a —COO-Rt- group, and an —O-Rt- group. In the formulae, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

As the alkyl group of each of $Rx_1$ to $Rx_3$, an alkyl group having 1 to 4 carbon atoms, such as a methyl group, an ethyl group, a n-propyl group, an isopropyl group, a n-butyl group, an isobutyl group, and a t-butyl group is preferable.

As the cycloalkyl group of $Rx_1$ to $Rx_3$, a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group is preferable.

As the cycloalkyl group which is formed by two of $Rx_1$ to $Rx_3$ being bonded to each other, a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group is preferable. In particular, a monocyclic cycloalkyl group having 5 or 6 carbon atoms is preferable.

In the cycloalkyl group which is formed by two of $Rx_1$ to $Rx_3$ being bonded to each other, for example, one methylene group constituting the ring may be substituted with a heteroatom such as an oxygen atom or a group having a heteroatom such as a carbonyl group.

In the repeating unit represented by General Formula (AI), for example, it is preferable that $Rx_1$ represents a methyl group or an ethyl group and that $Rx_2$ and $Rx_3$ are bonded to each other to form the cycloalkyl group.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), in which the number of carbon atoms is preferably 8 or less.

As the repeating unit represented by General Formula (AI), an acid-decomposable tertiary alkyl (meth)acrylate-based repeating unit (a repeating unit in which $Xa_1$ represents a hydrogen atom or a methyl group, and T represents a single bond) is preferable. A repeating unit in which $Rx_1$ to $Rx_3$ each independently represent a linear or branched alkyl group is more preferable, and a repeating unit in which $Rx_1$ to $Rx_3$ each independently represent a linear alkyl group is still more preferable.

Specific examples of the repeating unit having a group that decomposes by the action of an acid to generate a carboxyl group included in the resin (A) are shown below, but the present invention is not limited thereto.

In the specific examples, Rx and $Xa_1$ each represent a hydrogen atom, $CH_3$, $CF_3$, or $CH_2OH$. Rxa and Rxb each represent an alkyl group having 1 to 4 carbon atoms. Z represents a substituent including a polar group, and in a case where a plurality of Z's are present, Z's are each independent. p represents 0 or a positive integer. Examples of the substituent including a polar group represented by Z include a linear or branched alkyl group having a hydroxyl group, a cyano group, an amino group, an alkylamido group, or a sulfonamide group, and a cycloalkyl group, and the substituent is preferably the alkyl group having a hydroxyl group. As the branched alkyl group, an isopropyl group is particularly preferable.
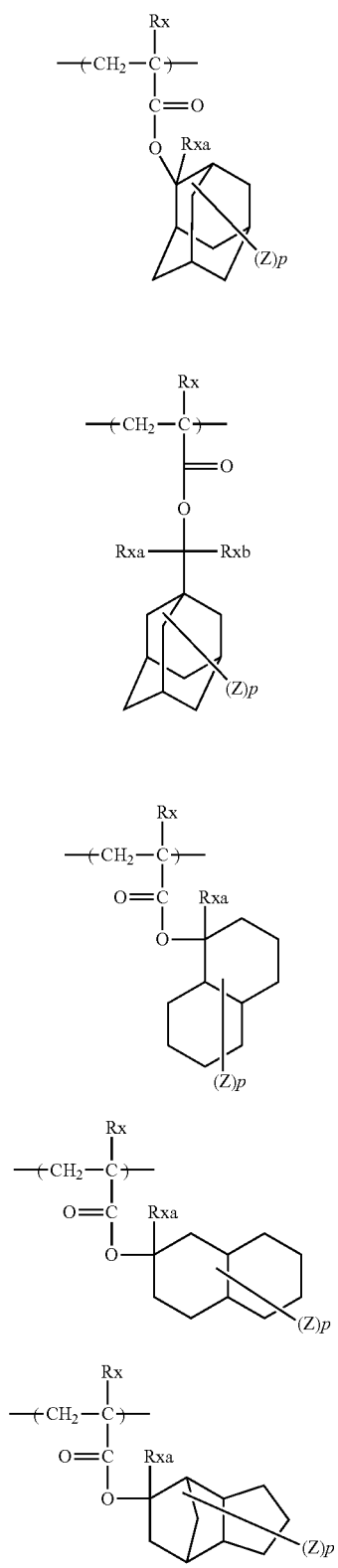
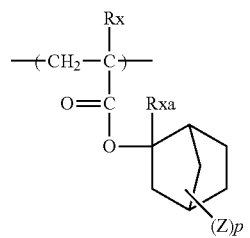
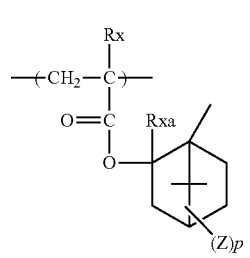
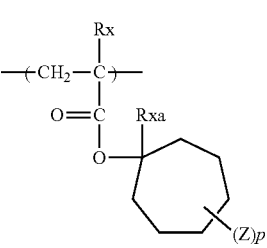
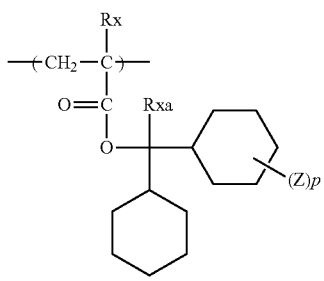
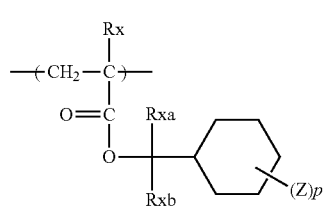
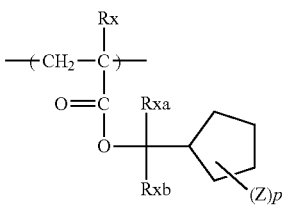

-continued

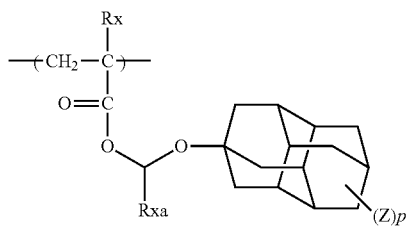

24

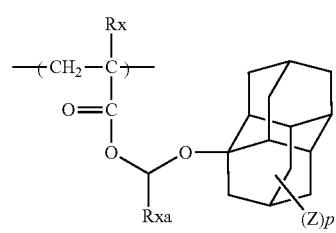

The content of the repeating units having a group that decomposes by the action of an acid to generate a carboxyl group is preferably 15% to 90% by mole, more preferably 20% to 90% by mole, still more preferably 25% to 80% by mole, and even still more preferably 30% to 70% by mole, with respect to all the repeating units of the resin (A).

It is preferable that the resin (A) further contains a repeating unit having a lactone group.

As the lactone group, any group may be used as long as it has a lactone structure, but the group is preferably a group having a 5- to 7-membered ring lactone structure, and more preferably a group having a 5- to 7-membered ring lactone structure to which another ring structure is fused in the form of forming a bicyclo structure or a spiro structure.

It is more preferable that the resin (A) has a repeating unit having a group with a lactone structure represented by any one of General Formula (LC1-1), . . . , or (LC1-16). In addition, the group having a lactone structure may be directly bonded to a main chain. A preferred lactone structure is a group represented by General Formula (LC1-1), (LC1-4), (LC1-5), (LC1-6), (LC1-13), or (LC1-14).

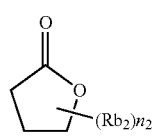

LC1-1

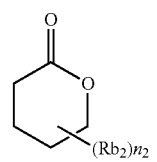

LC1-2

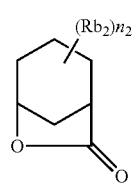

LC1-3

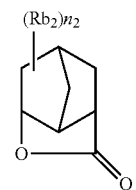

LC1-4

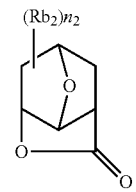

LC1-5

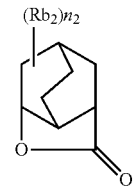

LC1-6

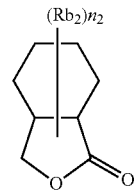

LC1-7

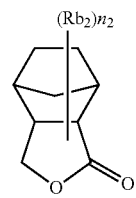

LC1-8

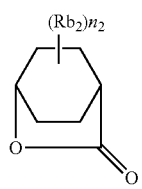

LC1-9

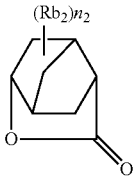

LC1-10

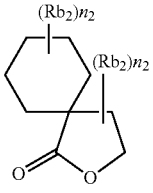

LC1-11

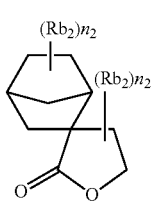 LC1-12

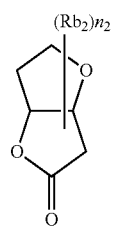 LC1-13

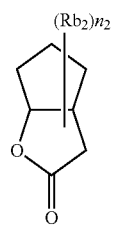 LC1-14

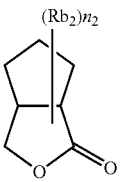 LC1-15

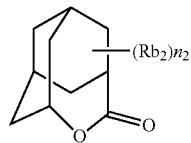 LC1-16

The lactone structure portion may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. $n_2$ represents an integer of 0 to 4. In a case where $n_2$ is 2 or more, a plurality of $Rb_2$'s may be the same as or different from each other or the plurality of $Rb_2$'s may be bonded to each other to form a ring.

Examples of the repeating unit which has a group having a lactone structure represented by any one of General Formula (LC1-1), ..., or (LC1-16) include a repeating unit represented by General Formula (AI).

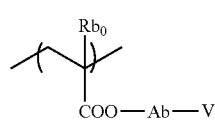 (AI)

In General Formula (AI), $Rb_0$ represents a hydrogen atom, a halogen atom, or an alkyl group having 1 to 4 carbon atoms.

Preferred examples of a substituent which may be contained in the alkyl group of $Rb_0$ include a hydroxyl group and a halogen atom.

Examples of the halogen atom of $Rb_0$ include a fluorine atom, a chlorine atom, a bromine atom, and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group including a combination thereof. Ab is preferably a single bond or a linking group represented by -$Ab_1$-$CO_2$—. $Ab_1$ is a linear or branched alkylene group or a monocyclic or polycyclic cycloalkylene group, and preferably a methylene group, an ethylene group, a cyclohexylene group, an adamantylene group, or a norbornylene group.

V represents a group represented by any one of General Formula (LC1-1), ..., or (LC1-16).

In the repeating unit which has a group having a lactone structure, an optical isomer is present, and any optical isomer may be used. In addition, one optical isomer may be used singly, or a plurality of optical isomers may be used in mixture. In a case where one optical isomer is mainly used, the optical purity (ee) thereof is preferably 90 or more, and more preferably 95 or more.

Specific examples of the repeating unit which has a group having a lactone structure are shown below, but the present invention is not limited thereto.

(In the formula, Rx represents H, $CH_3$, $CH_2OH$, or $CF_3$)

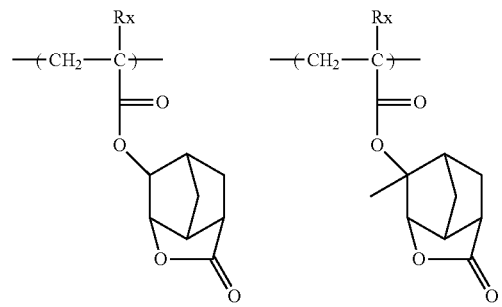

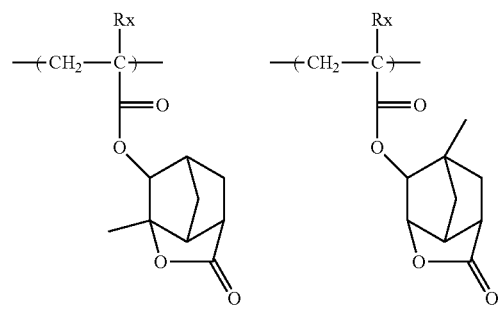

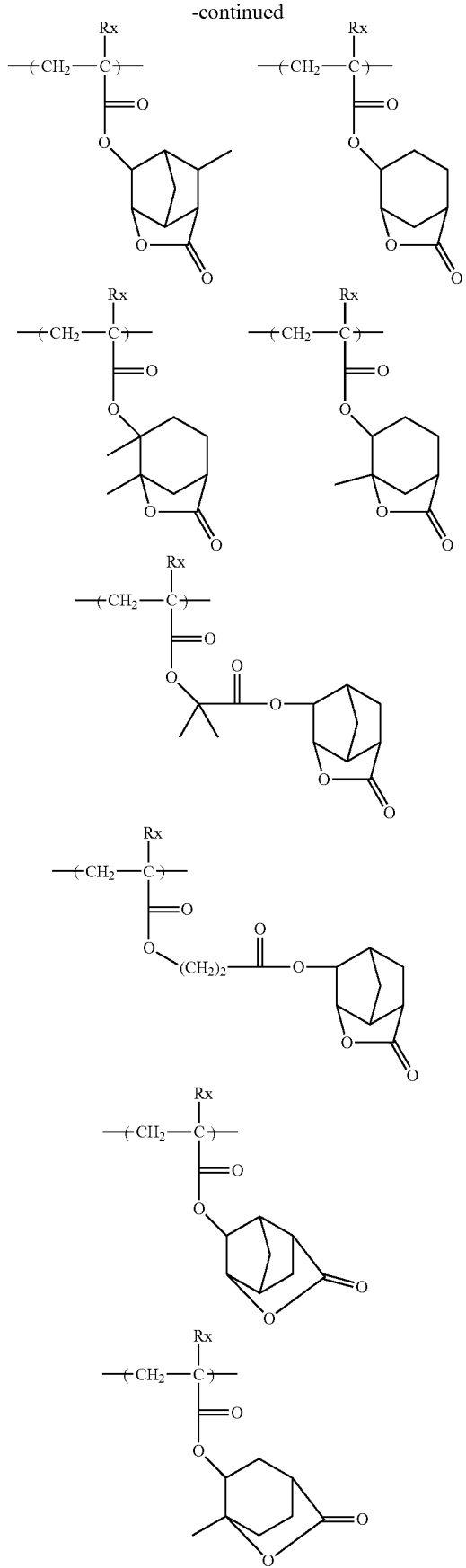
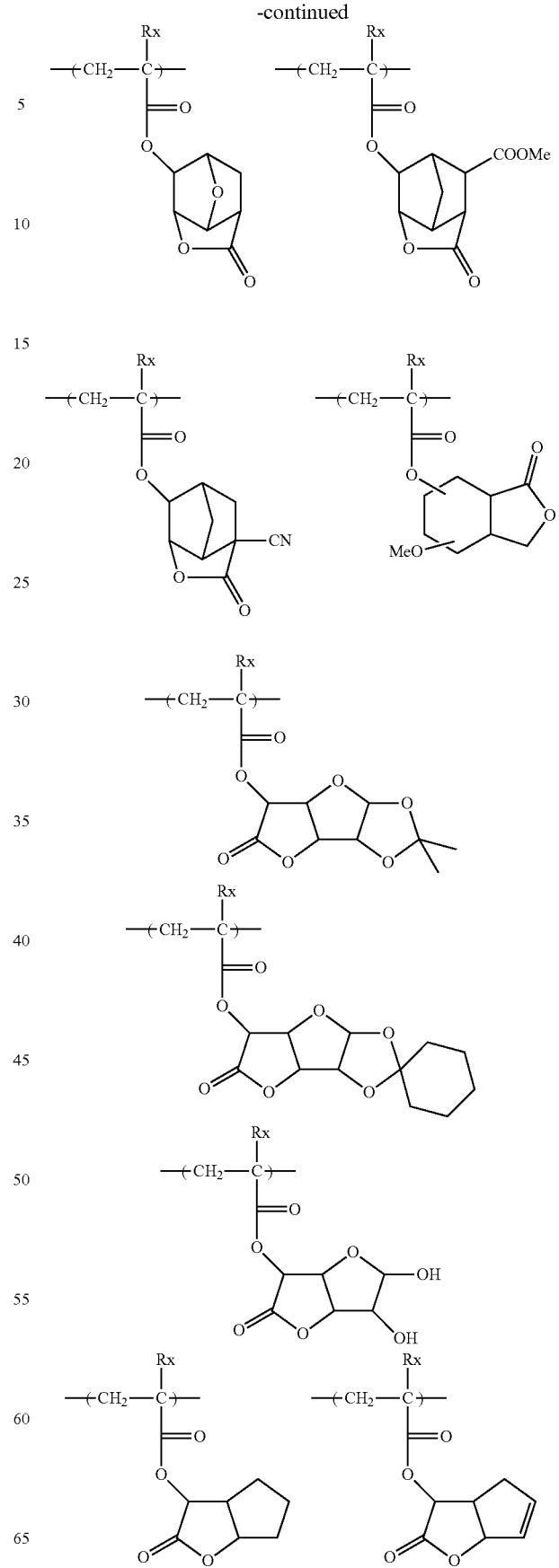

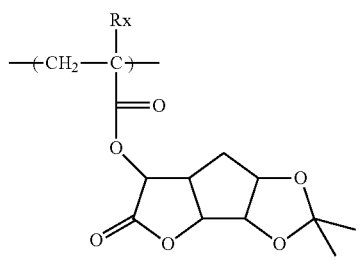
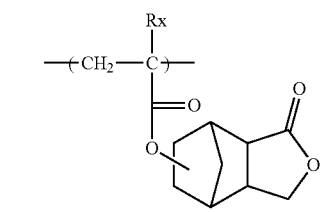
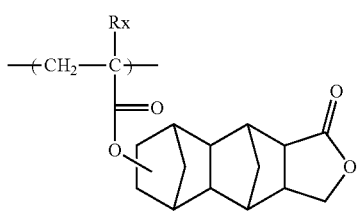
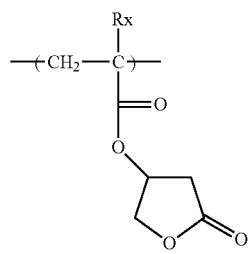
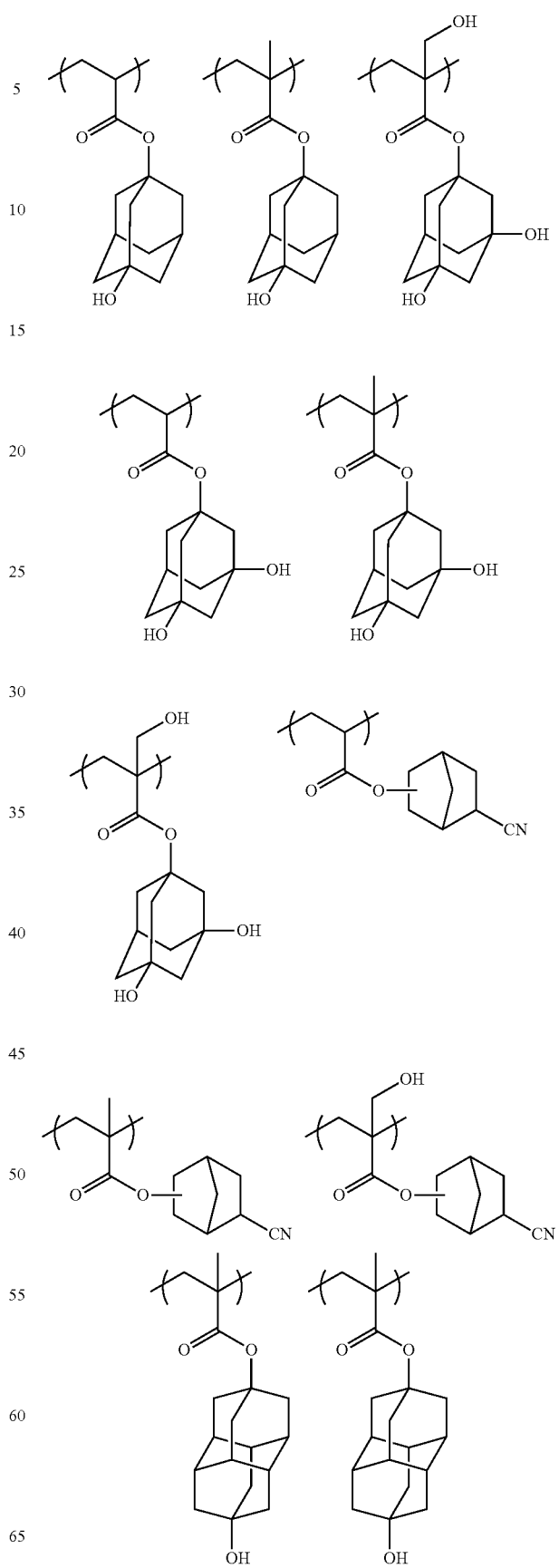

The content of the repeating units having a lactone group is preferably 1% to 65% by mole, more preferably 1% to 30% by mole, still more preferably 5% to 25% by mole, and even still more preferably 5% to 20% by mole, with respect to all the repeating units of the resin (A).

The resin (A) may further include a repeating unit which has an organic group having a polar group, in particular, a repeating unit which has an alicyclic hydrocarbon structure substituted with a polar group.

As a result, the substrate adhesiveness or the developer affinity are improved. As the alicyclic hydrocarbon structure of the alicyclic hydrocarbon structure substituted with a polar group, an adamantyl group, a diamantyl group, or a norbornane group is preferable. As the polar group, a hydroxyl group or a cyano group is preferable.

Specific examples of the repeating unit having a polar group are shown below, but the present invention is not limited thereto.

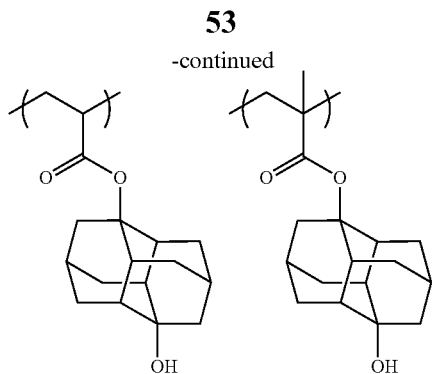

In a case where the resin (A) has a repeating unit containing an organic group with a polar group, the content thereof is preferably 1% to 50% by mole, more preferably 1% to 30% by mole, still more preferably 5% to 25% by mole, and even still more preferably 5% to 20% by mole, with respect to all the repeating units of the resin (A).

Furthermore, as a repeating unit other than the above-described repeating units, the resin (A) may include a repeating unit having a group (photoacid generating group) which generates an acid upon irradiation with actinic rays or radiation. In this case, it can be considered that the repeating unit having a photoacid generating group corresponds to a compound (B) described below that generates an acid upon irradiation with actinic rays or radiation.

Examples of the repeating unit include a repeating unit represented by General Formula (4).

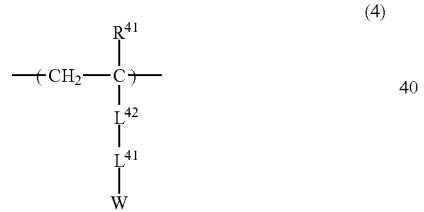

$R^{41}$ represents a hydrogen atom or a methyl group. $L^{41}$ represents a single bond or a divalent linking group. $L^{42}$ represents a divalent linking group. W represents a structural site that decomposes upon irradiation with actinic rays or radiation to generate an acid at a side chain.

Specific examples of the repeating unit represented by General Formula (4) are shown below, but the present invention is not limited thereto.

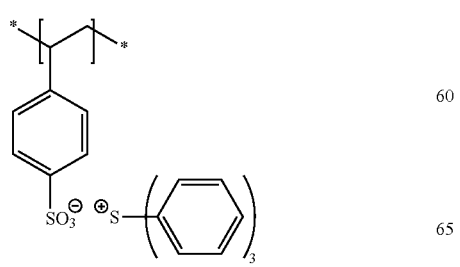

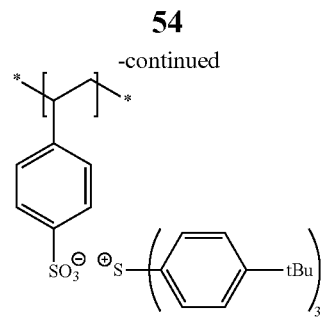

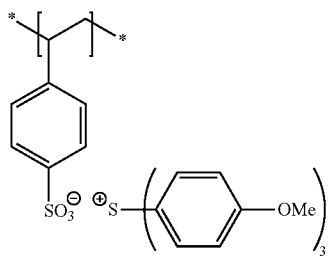

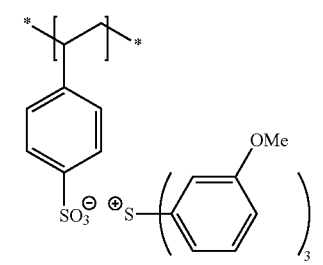

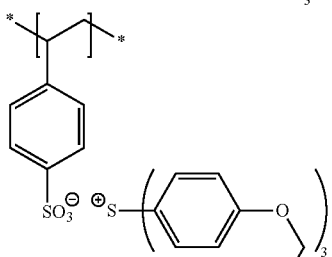

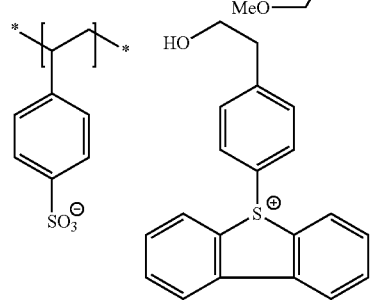

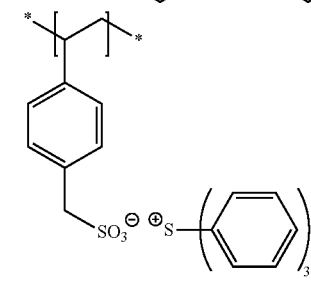

-continued

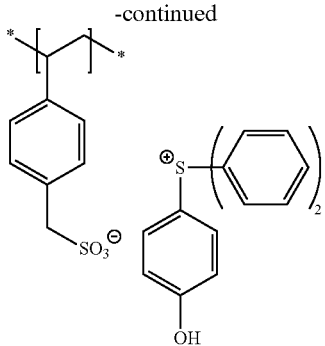

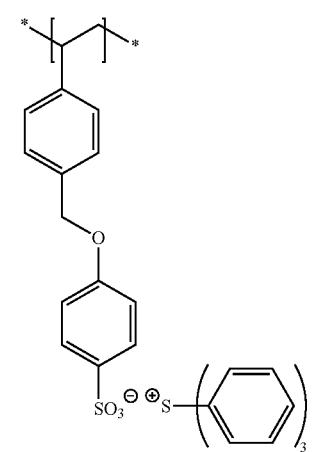

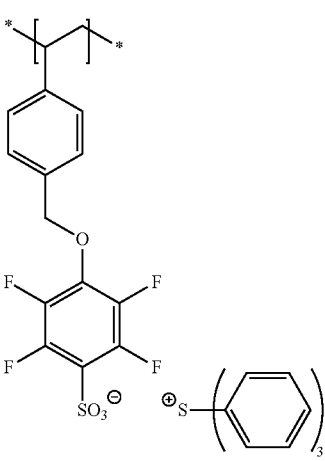

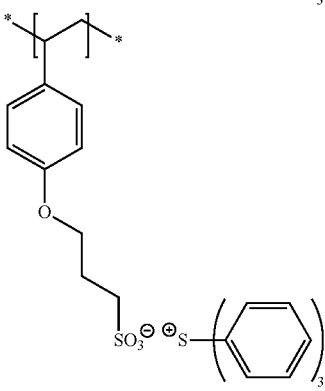

-continued

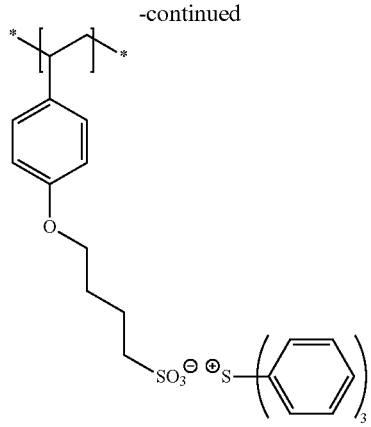

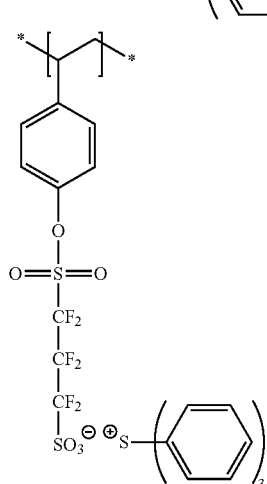

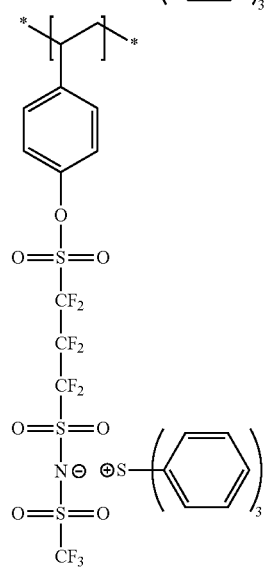

Other examples of the repeating unit represented by General Formula (4) include repeating units described in paragraphs [0094] to [0105] of JP2014-041327A.

In a case where the resin (A) contains the repeating unit having a photoacid generating group, the content of the repeating units having a photoacid generating group is preferably 1% to 40% by mole, more preferably 5% to 35% by mole, and still more preferably 5% to 30% by mole, with respect to all the repeating units of the resin (A).

The resin (A) can be synthesized using an ordinary method (for example, radical polymerization). Examples of the general synthesis method include a batch polymerization method of dissolving a monomer species and an initiator in a solvent and heating the solution for polymerization, and a dropwise addition polymerization method of adding a solution of a monomer species and an initiator dropwise to a heated solvent for 1 to 10 hours, and the dropwise addition polymerization method is preferable.

Examples of the reaction solvent include ethers such as tetrahydrofuran, 1,4-dioxane, and diisopropyl ether, ketones such as methyl ethyl ketone and methyl isobutyl ketone, esters solvent such as ethyl acetate, amide solvents such as dimethyl formamide and dimethylacetamide, and solvents for dissolving an actinic ray-sensitive or radiation-sensitive composition described below such as propylene glycol monomethyl ether acetate, propylene glycol monomethyl ether, and cyclohexanone. It is preferable that the same solvent as that used in the actinic ray-sensitive or radiation-sensitive composition is used for polymerization. In this manner, generation of particles during storage can be suppressed.

It is preferable that the polymerization reaction is performed in an inert gas atmosphere such as nitrogen or argon. In order to initiate the polymerization, a commercially available radical initiator (an azo-based initiator, a peroxide, or the like) is used as the polymerization initiator. As the radical initiator, an azo-based initiator is preferable, and preferred examples thereof include an azo-based initiator having an ester group, a cyano group, or a carboxyl group. Preferred examples of the initiator include azobisisobutyronitrile, azobisdimethylvaleronitrile, and dimethyl 2,2'-azobis(2-methylpropionate). As desired, the initiator is added additionally or dividedly, and after completion of the reaction, the reaction product is put into a solvent and a desired polymer is collected using a powder or solid collecting method or the like. The reaction concentration is 5% to 50% by mass, and preferably 10% to 30% by mass.

The reaction temperature is usually 10° C. to 150° C., preferably 30° C. to 120° C., and still more preferably 60° C. to 100° C.

Examples of a method which can be applied to the purification include a typical method such as a liquid-liquid extraction method in which residual monomers or oligomer components are removed using a combination of water washing or appropriate solvents; a purification method in a solid state such as ultrafiltration in which substances having a specific molecular weight or less are extracted and removed; a reprecipitation method in which residual monomers are removed by adding a resin solution dropwise to a poor solvent to solidify the resin in the poor solvent; and a purification method in a solid state in which a resin slurry separated by filtering is washed with a poor solvent.

The weight-average molecular weight of the resin (A) is preferably 1,000 to 200,000, more preferably 3,000 to 20,000, and most preferably 5,000 to 15,000 in terms of polystyrene by a GPC method. By adjusting the weight-average molecular weight to 1,000 to 200,000, deterioration in heat resistance and dry etching resistance can be prevented. In addition, deterioration in developability and deterioration in film forming properties caused by an increase in viscosity can be prevented.

It is particularly preferable that the weight-average molecular weight of the resin (A) is 3,000 to 9,500 in terms of polystyrene by a GPC method. By adjusting the weight-average molecular weight to 3,000 to 9,500, in particular, a resist residue (hereinafter also referred to as "scum") is suppressed, and a better pattern can thus be formed.

As the dispersity (molecular weight distribution), a diversity in the range of typically 1 to 5, preferably 1 to 3, more preferably 1.2 to 3.0, and particularly preferably 1.2 to 2.0 is used. As the dispersity decreases, the resolution and a resist shape are improved. In addition, a side wall of a resist pattern is smooth, and roughness properties are excellent.

In the actinic ray-sensitive or radiation-sensitive composition, the content of the resin (A) is preferably 50% to 99.9% by mass, and more preferably 60% to 99.0% by mass, with respect to the total solid content of the actinic ray-sensitive or radiation-sensitive composition.

Moreover, in the actinic ray-sensitive or radiation-sensitive composition, the resin (A) may be used singly or in combination of a plurality of kinds thereof.

In addition, the resin (A) may include a repeating unit represented by General Formula (VI).

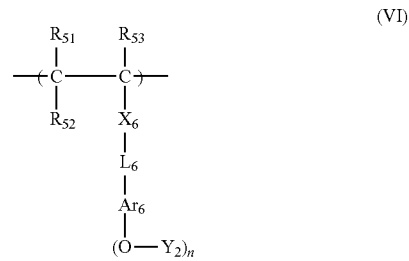

(VI)

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group, provided that $R_{62}$ may be bonded to $Ar_6$ to form a ring, and in this case, $R_{62}$ represents a single bond or an alkylene group.

$X_6$ represents a single bond, —COO—, or —CONR$_{64}$—.

$R_{64}$ represents a hydrogen atom or an alkyl group.

$L_6$ represents a single bond or an alkylene group.

$Ar_6$ represents a (n+1)-valent aromatic ring group, and in a case where $Ar_6$ is bonded to $R_{62}$ to form a ring, $Ar_6$ represents a (n+2)-valent aromatic ring group.

In a case of n≥2, $Y_2$'s each independently represent a hydrogen atom or a group which leaves by the action of an acid. At least one of $Y_2$'s represents a group which leaves by the action of an acid.

n represents an integer of 1 to 4.

As the group which leaves by the action of an acid represented by $Y_2$, a structure represented by General Formula (VI-A) is more preferable.

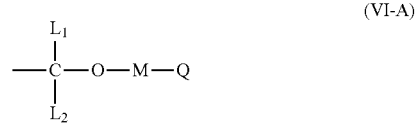

(VI-A)

Here, $L_1$ and $L_2$ each independently represent a hydrogen atom, an alkyl group, a cycloalkyl group, an aryl group, or a group including a combination of an alkylene group and an aryl group.

M represents a single bond or a divalent linking group.

Q represents an alkyl group, a cycloalkyl group which may have a heteroatom, an aryl group which may have a heteroatom, an amino group, an ammonium group, a mercapto group, a cyano group, or an aldehyde group.

At least two of Q, M, or $L_1$ may be bonded to each other to form a ring (preferably a 5- or 6-membered ring).

It is preferable that the repeating unit represented by General Formula (VI) is a repeating unit represented by General Formula (3).

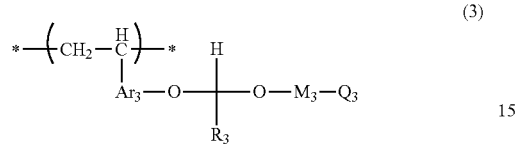
(3)

In General Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two of $Q_3$, $M_3$, or $R_3$ are bonded to each other to form a ring.

The aromatic ring group represented by $Ar_3$ is the same as $Ar_6$ in General Formula (VI) in a case where n in General Formula (VI) represents 1. In this case, a phenylene group or a naphthylene group is more preferable, and a phenylene group is still more preferable.

Specific examples of the repeating unit represented by General Formula (VI) are shown below, but the present invention is not limited thereto.

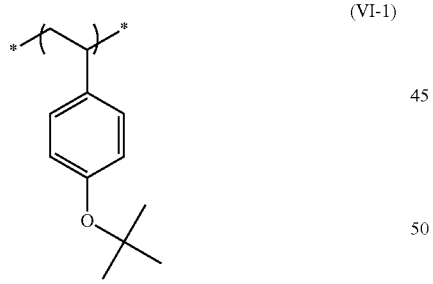
(VI-1)

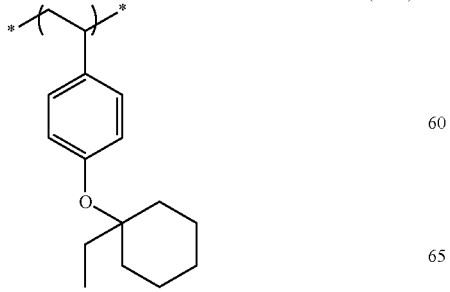
(VI-2)

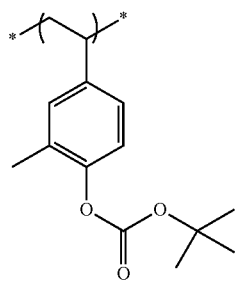
(VI-3)

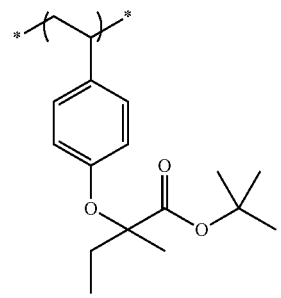
(VI-4)

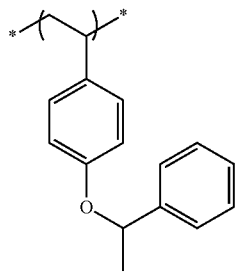
(VI-5)

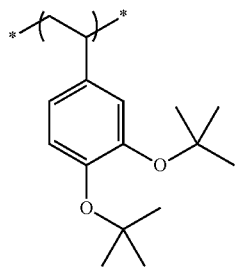
(VI-6)

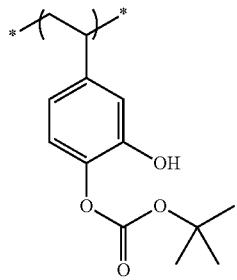
(VI-7)

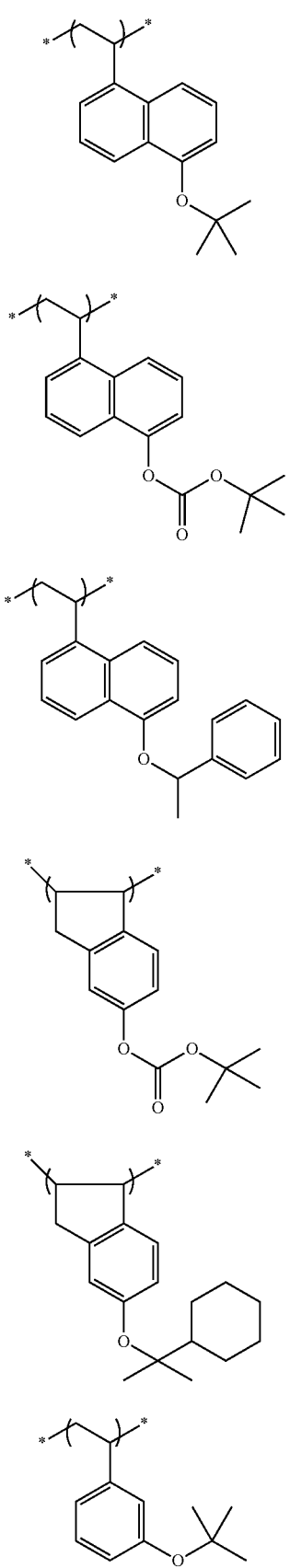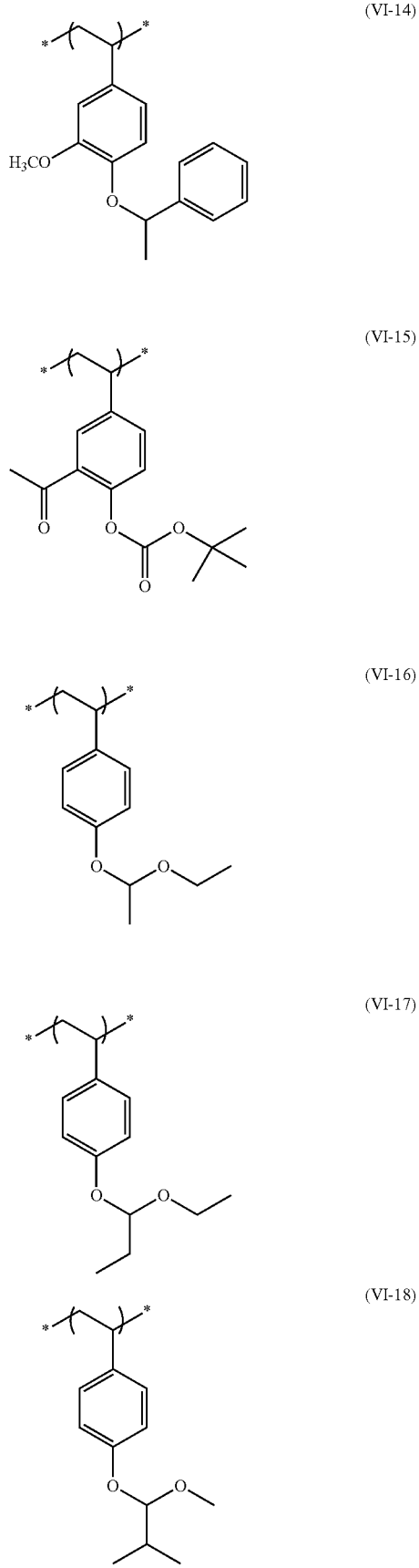

(VI-19)
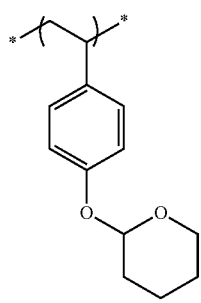
(VI-20)
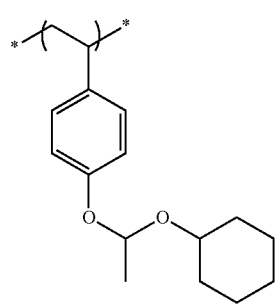
(VI-21)
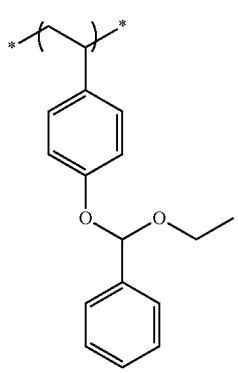
(VI-22)
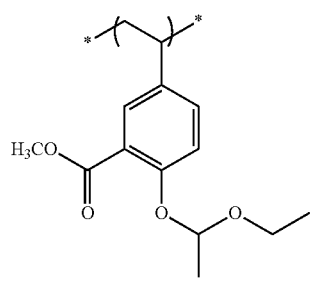
(VI-23)
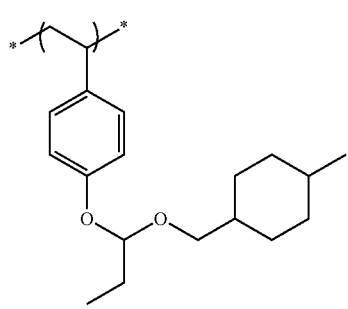
(VI-24)
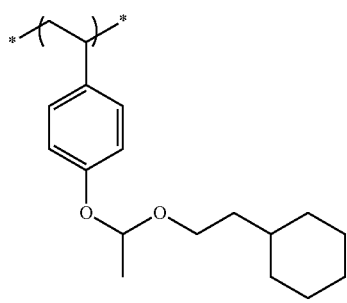
(VI-25)
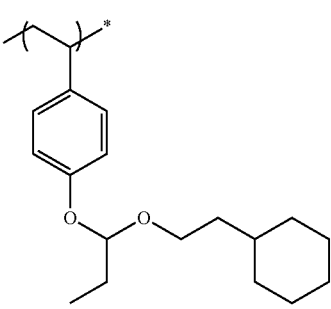
(VI-26)
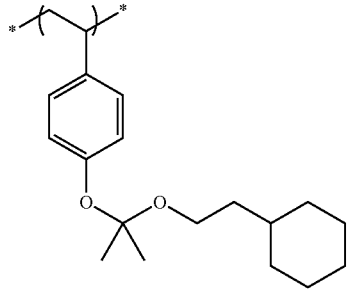
(VI-27)
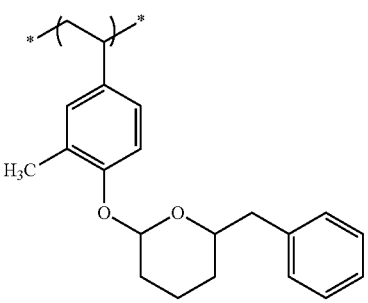
(VI-28)
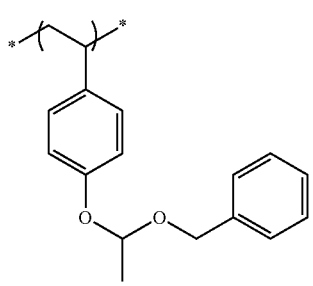

-continued (VI-29)
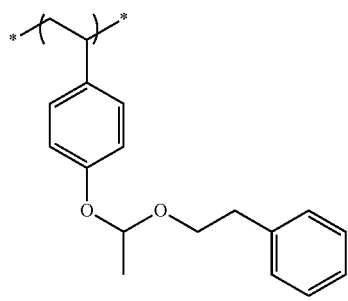

(VI-30)

(VI-31)

(VI-32)

(VI-33)

-continued (VI-34)
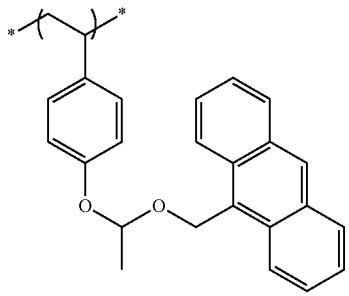

(VI-35)
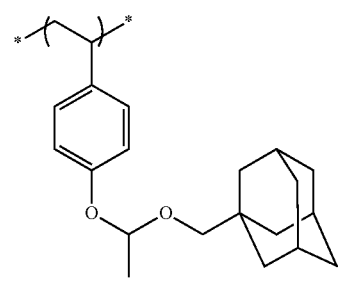

(VI-36)
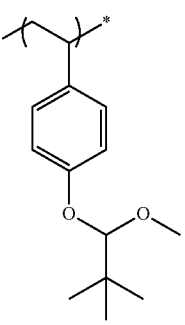

It is also preferable that the resin (A) includes a repeating unit represented by General Formula (4).

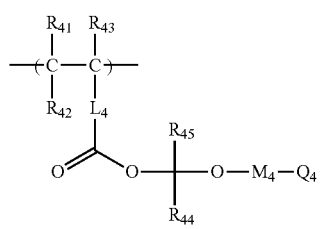
(4)

In General Formula (4), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ may be bonded to $L_4$ to form a ring. In this case, $R_{42}$ represents an alkylene group.

$L_4$ represents a single bond or a divalent linking group. In a case where $L_4$ and $R_{42}$ form a ring, $L_4$ represents a trivalent linking group.

$R_{44}$ and $R_{45}$ represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two of $Q_4$, $M_4$, or $R_{44}$ may be bonded to each other to form a ring.

$R_{41}$, $R_{42}$, and $R_{43}$ have the same definitions and the same preferred ranges as $R_{51}$, $R_{52}$, and $R_{53}$ in General Formula (V), respectively.

$L_4$ has the same definition and the same preferred range as $L_5$ in General Formula (V), respectively.

$R_{44}$ and $R_{45}$ have the same definition and the same preferred range as $R_3$ in General Formula (3).

$M_4$ has the same definition and the same preferred range as $M_3$ in General Formula (3).

$Q_4$ has the same definition and the same preferred range as $Q_3$ in General Formula (3).

Examples of a ring which is formed by at least two of $Q_4$, $M_4$, or $R_{44}$ being bonded to each other include the ring which is formed by at least two of $Q_3$, $M_3$, or $R_3$ being bonded to each other, and preferred ranges thereof are also the same.

Specific examples of the repeating unit represented by General Formula (4) are shown below, but the present invention is not limited thereto.

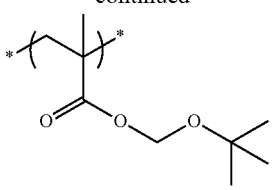

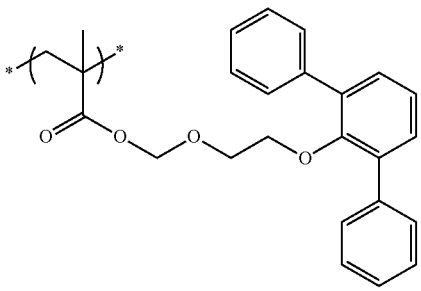

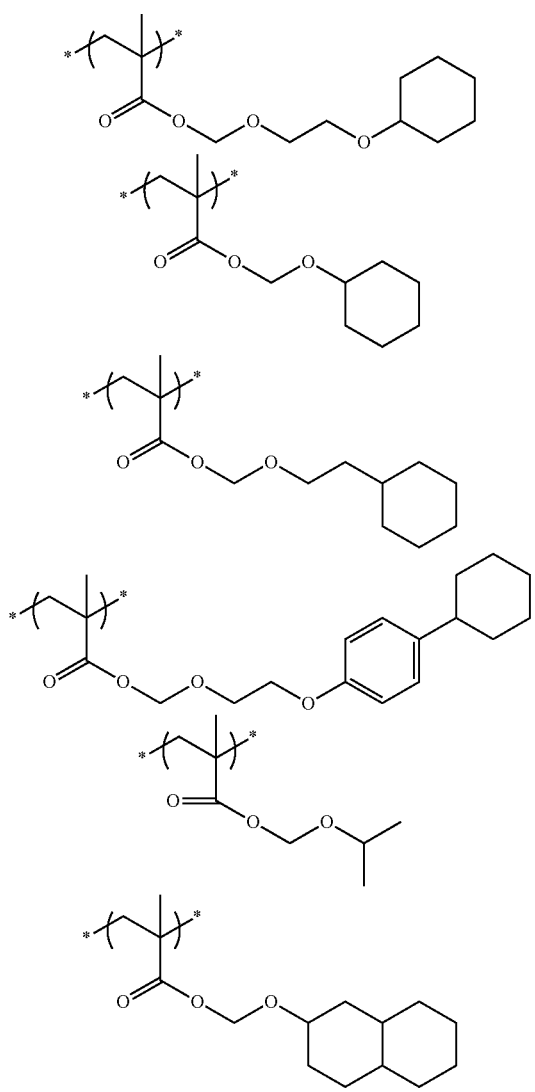

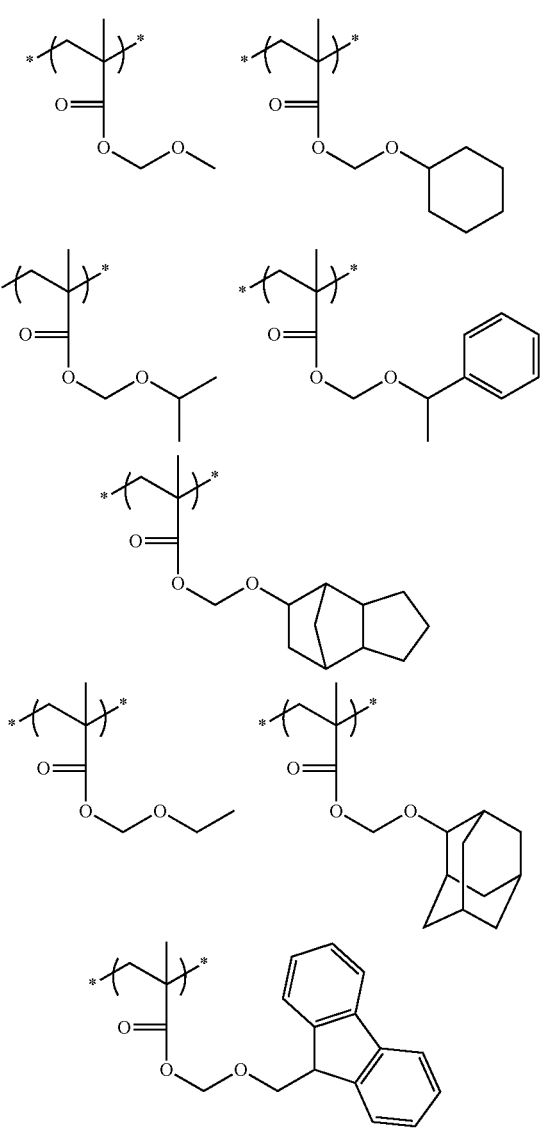

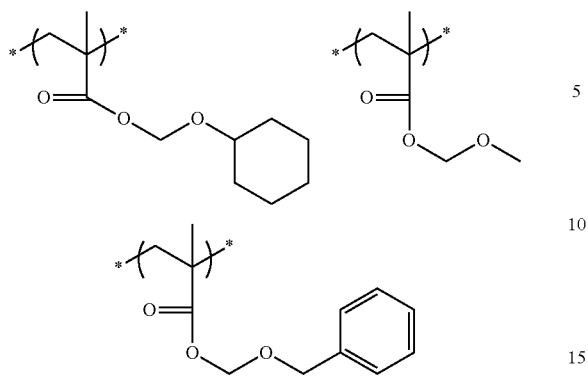

In addition, the resin (A) may include a repeating unit represented by General Formula (BZ).

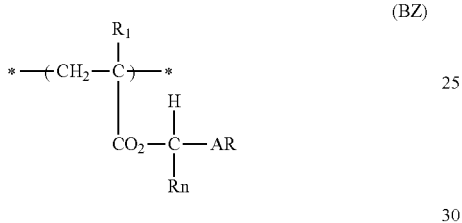

In General Formula (BZ), AR represents an aryl group. Rn represents an alkyl group, a cycloalkyl group, or an aryl group. Rn and AR may be bonded to each other to form a non-aromatic ring.

$R_1$ represents a hydrogen atom, an alkyl group, a cycloalkyl group, a halogen atom, a cyano group, or an alkyloxycarbonyl group.

Specific examples of the repeating unit represented by General Formula (BZ) are shown below, but the present invention is not limited thereto.

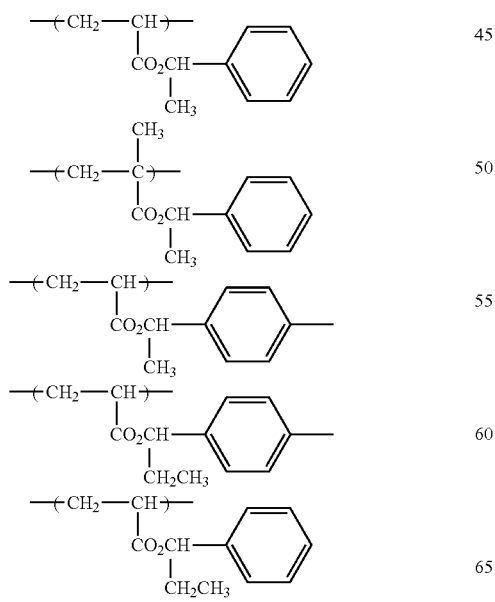

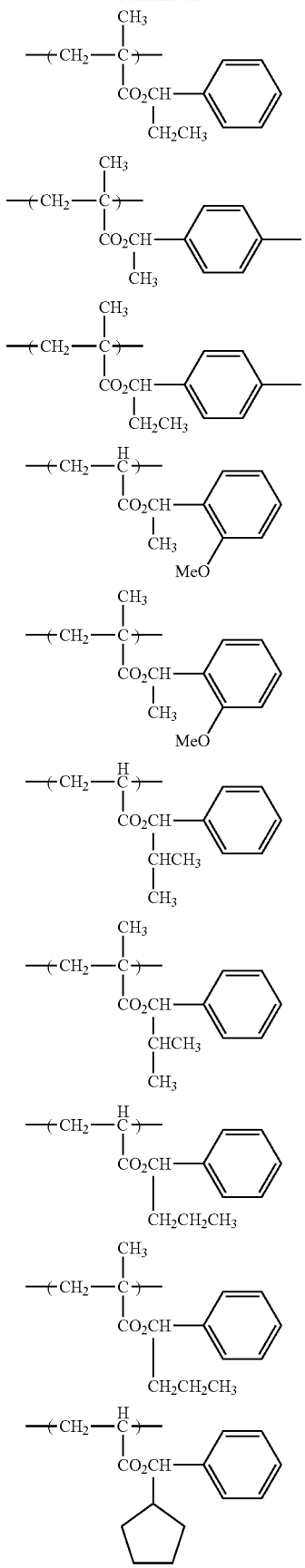

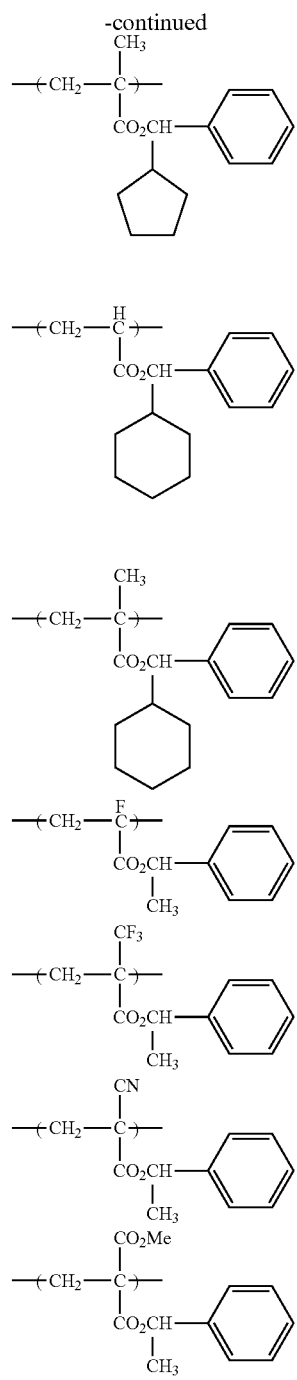

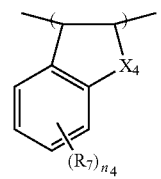

(V)

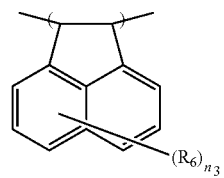

(VI)

In the formulae,

R₆ and R₇ each independently represent a hydrogen atom, a hydroxy group, a linear, branched, or cyclic alkyl group having 1 to 10 carbon atoms, an alkoxy group or acyloxy group, a cyano group, a nitro group, an amino group, a halogen atom, an ester group (—OCOR or —COOR: R is an alkyl group having 1 to 6 carbon atoms or a fluorinated alkyl group), or a carboxyl group.

$n_3$ represents an integer of 0 to 6.

$n_4$ represents an integer of 0 to 4.

$X_4$ is a methylene group, an oxygen atom, or a sulfur atom.

Specific examples of the repeating unit represented by General Formula (V) or General Formula (VI) are shown below, but the present invention is not limited thereto.

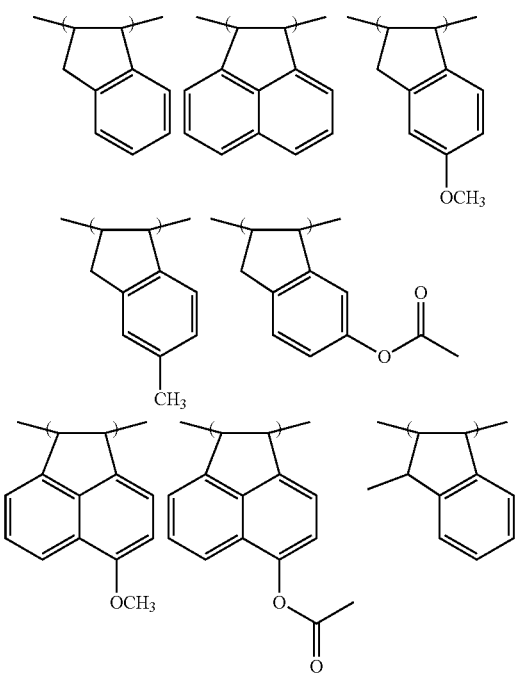

The repeating unit having an acid-decomposable group may be used singly or in combination of two or more kinds thereof.

The content of the repeating units having an acid-decomposable group in the resin (A) (in a case where the resin (A) includes a plurality of repeating units having an acid-decomposable group, the total content thereof) is preferably from 5% by mole to 80% by mole, more preferably from 5% by mole to 75% by mole, and still more preferably from 10% by mole to 65% by mole, with respect to all the repeating units of the resin (A).

The resin (A) may contain a repeating unit represented by General Formula (V) or General Formula (VI).

The resin (A) may further have a repeating unit having a silicon atom in the side chain. Examples of the repeating unit having a silicon atom in the side chain include a (meth)acrylate-based repeating unit having a silicon atom and a vinyl-based repeating unit having a silicon atom. The repeating unit having a silicon atom in the side chain is typically a repeating unit having a group having a silicon atom in the side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilylsilyl group, a methylbistrimethylsilylsilyl group, a methylbistrimethylsiloxysilyl group, a dimethyltrimethylsilylsilyl group, a dimethyltrimethylsiloxysilyl group, and a cyclic or linear polysiloxane, and a cage-type or ladder-type or random-type silsesquioxane structure as described below. In the formulae, R and $R^1$ each independently represent a monovalent substituent. * represents a bond.

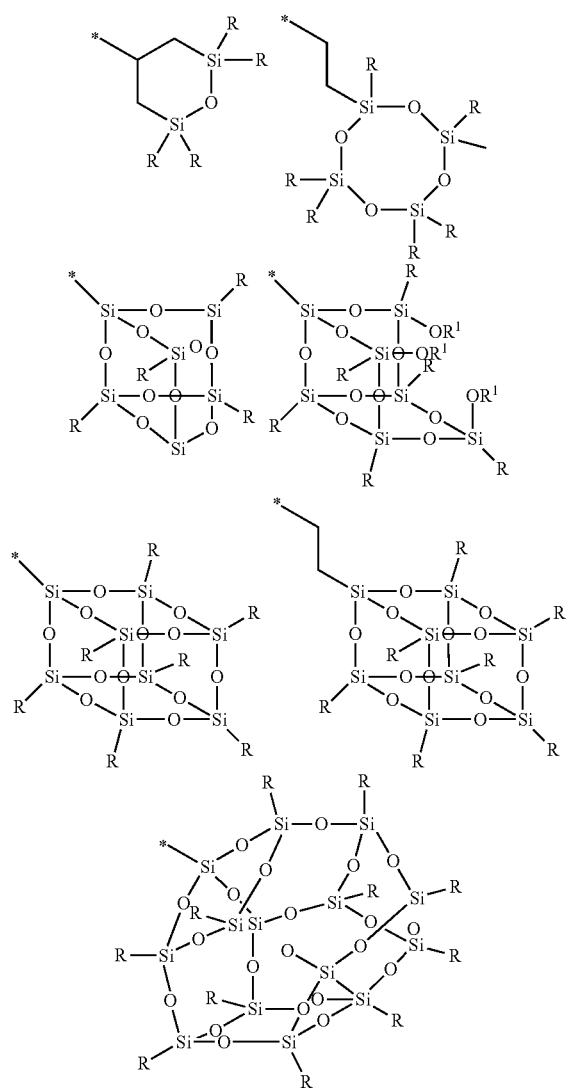

Suitable examples of the repeating units having the above-mentioned groups include a repeating unit derived from an acrylate or methacrylate compound having the above-mentioned group, and a repeating unit derived from a compound having the above-mentioned group and a vinyl group.

The repeating unit having a silicon atom is preferably a repeating unit having a silsesquioxane structure, whereby it is possible to express superior pattern collapse suppressing performance in the formation of an ultra fine (for example, a line width of 50 nm or less) pattern having a cross-sectional shape of a high aspect ratio (for example, film thickness/line width of 3 or more).

Examples of the silsesquioxane structure include a cage-type silsesquioxane structure, a ladder-type silsesquioxane structure, and a random-type silsesquioxane structure. Among them, the cage-type silsesquioxane structure is preferable.

Here, the cage-type silsesquioxane structure is a silsesquioxane structure having a cage-like skeleton. The cage-type silsesquioxane structure may be a complete cage-type silsesquioxane structure or an incomplete cage-type silsesquioxane structure, among which the complete cage-type silsesquioxane structure is preferable.

Furthermore, the ladder-type silsesquioxane structure is a silsesquioxane structure having a ladder-like skeleton.

In addition, the random-type silsesquioxane structure is a silsesquioxane structure whose skeleton is of random.

The cage-type silsesquioxane structure is preferably a siloxane structure represented by Formula (S).

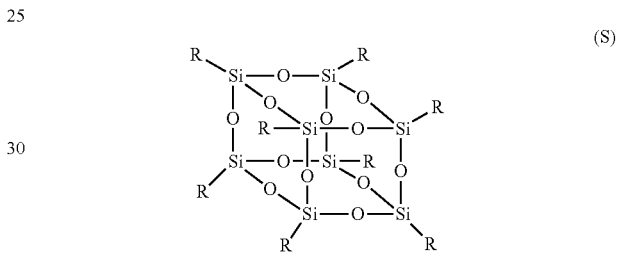

In Formula (S), R represents a monovalent organic group. R's which are present in plural numbers may be the same as or different from each other.

The organic group is not particularly limited, but specific examples thereof include a hydroxy group, a nitro group, a carboxy group, an alkoxy group, an amino group, a mercapto group, a blocked mercapto group (for example, a mercapto group blocked (protected) with an acyl group), an acyl group, an imido group, a phosphino group, a phosphinyl group, a silyl group, a vinyl group, a hydrocarbon group which may have a heteroatom, a (meth)acryl group-containing group, and an epoxy group-containing group.

Examples of the heteroatom of the hydrocarbon group which may have the heteroatom include an oxygen atom, a nitrogen atom, a sulfur atom, and a phosphorus atom.

Examples of the hydrocarbon group of the hydrocarbon group which may have the heteroatom include an aliphatic hydrocarbon group, an aromatic hydrocarbon group, and a group formed by combination thereof.

The aliphatic hydrocarbon group may be linear, branched, or cyclic. Specific examples of the aliphatic hydrocarbon group include a linear or branched alkyl group (in particular, having 1 to 30 carbon atoms), a linear or branched alkenyl group (in particular, having 2 to 30 carbon atoms), and a linear or branched alkynyl group (in particular, having 2 to 30 carbon atoms).

Examples of the aromatic hydrocarbon group include an aromatic hydrocarbon group having 6 to 18 carbon atoms, such as a phenyl group, a tolyl group, a xylyl group, and a naphthyl group.

In a case where the resin (A) has a repeating unit having a silicon atom in the side chain, the content thereof is preferably 1% to 30% by mole, more preferably 5% to 25% by mole, and still more preferably 5% to 20% by mole, with respect to all the repeating units in the resin (A).

(B) Compound That Generates Acid with Actinic Rays or Radiation (Photoacid Generator)

The actinic ray-sensitive or radiation-sensitive resin composition preferably contains a compound that generates an acid with actinic rays or radiation (hereinafter also referred to as a "photoacid generator <<PAG>>").

The photoacid generator may be in a form of a low molecular compound or in a form of being incorporated into a part of a polymer. Further, a combination of the form of a low molecular compound and the form of being incorporated into a part of a polymer may also be used.

In a case where the photoacid generator is in the form of a low molecular compound, the molecular weight thereof is preferably 3,000 or less, more preferably 2,000 or less, and still more preferably 1,000 or less.

In a case where the photoacid generator is in the form of being incorporated into a part of a polymer, it may be incorporated into a part of the resin (A) or into a resin different from the resin (A).

In the present invention, the photoacid generator is preferably in the form of a low molecular compound.

The photoacid generator is not particularly limited as long as it is a known photoacid generator, but the photoacid generator is preferably a compound that generates an organic acid, for example, at least one of sulfonic acid, bis(alkylsulfonyl)imide, or tris(alkylsulfonyl)methide, upon irradiation with actinic rays or radiation, and preferably electron beams or extreme ultraviolet rays.

More preferred examples of the photoacid generator include compounds represented by General Formulae (ZI), (ZII), and (ZIII).

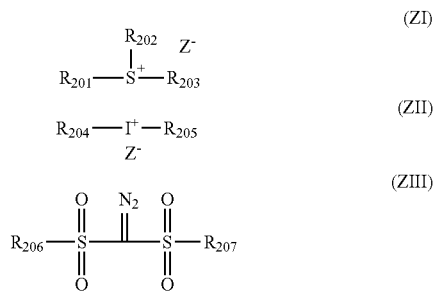

In General Formula (ZI), $R_{201}$, $R_{202}$, and $R_{203}$ each independently represent an organic group.

The number of carbon atoms of the organic group as $R_{201}$, $R_{202}$, and $R_{203}$ is generally 1 to 30, and preferably 1 to 20.

Furthermore, two of $R_{201}$ to $R_{203}$ may be bonded to each other to form a ring structure, and the ring may include an oxygen atom, a sulfur atom, an ester bond, an amide bond, or a carbonyl group, and examples of the group formed by the bonding of two of $R_{201}$ to $R_{203}$ include an alkylene group (for example, a butylene group and a pentylene group).

$Z^-$ represents a non-nucleophilic anion (anion having an extremely low ability of causing a nucleophilic reaction).

Examples of the non-nucleophilic anion include a sulfonate anion (such as an aliphatic sulfonate anion, an aromatic sulfonate anion, and a camphor sulfonate anion), a carboxylate anion (such as an aliphatic carboxylate anion, an aromatic carboxylate anion, and an aralkyl carboxylate anion), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be an alkyl group or a cycloalkyl group, and preferred examples thereof include a linear or branched alkyl group having 1 to 30 carbon atoms and a cycloalkyl group having 3 to 30 carbon atoms.

Preferred examples of the aromatic group in the aromatic sulfonate anion and aromatic carboxylate anion include an aryl group having 6 to 14 carbon atoms, such as a phenyl group, a tolyl group, and a naphthyl group.

The alkyl group, the cycloalkyl group, and the aryl group mentioned above may have a substituent. Specific examples of the substituent include a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms).

Examples of an aryl group and a ring structure included in each of the groups include an alkyl group (preferably having 1 to 15 carbon atoms) as a substituent.

Preferred examples of the aralkyl group in the aralkyl carboxylate anion include an aralkyl group having 7 to 12 carbon atoms, such as a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms. Examples of the substituent of this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with the fluorine atom and the fluorine atom-substituted alkyl group being preferable.

In addition, the alkyl groups in the bis(alkylsulfonyl) imide anions may be bonded to each other to form a ring structure. As a result, the acid strength increases.

Other examples of the non-nucleophilic anion include phosphorus fluoride (for example, $PF_6^-$), boron fluoride (for example, $BF_4^-$), and antimony fluoride (for example, $SbF_6^-$).

The non-nucleophilic anion is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (still more preferably having 4 to 8 carbon atoms) or a fluorine atom-containing benzenesulfonate anion, and still more preferably a nonafluorobutanesulfonate anion, a perfluorooctanesulfonate anion, a pentafluorobenzenesulfonate anion, or a 3,5-bis(trifluoromethyl)benzenesulfonate anion.

From the viewpoint of the acid strength, the pKa of the acid generated is preferably −1 or less so as to improve the sensitivity.

Moreover, an anion represented by General Formula (AN1) may also be mentioned as a preferred aspect of the non-nucleophilic anion.

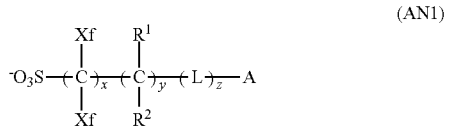

(AN1)

In the formula,

Xf's each independently represent a fluorine atom or an alkyl group substituted with at least one fluorine atom.

$R^1$ and $R^2$ each independently represent a hydrogen atom, a fluorine atom, or an alkyl group. In a case where a plurality of $R^1$'s and a plurality of $R^2$'s are present, $R^1$'s and $R^2$'s may be the same as or different from each other.

L represents a divalent linking group, and L's in a case where a plurality of L's are present may be the same as or different from each other.

A represents a cyclic organic group.

x represents an integer of 1 to 20, y represent an integer of 0 to 10, and z represents an integer of 0 to 10.

General Formula (AN1) will be described in more detail.

The alkyl group in the fluorine atom-substituted alkyl group of Xf is preferably an alkyl group having 1 to 10 carbon atoms, and more preferably an alkyl group having 1 to 4 carbon atoms. Further, the fluorine atom-substituted alkyl group of Xf is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, the fluorine atom and $CF_3$ are preferable.

In particular, it is preferable that both Xf's are fluorine atoms.

The alkyl group of $R^1$ or $R^2$ may have a substituent (preferably a fluorine atom), and an alkyl group having 1 to 4 carbon atoms is preferable. A perfluoroalkyl group having 1 to 4 carbon atoms is more preferable. Specific examples of the alkyl group having a substituent of $R^1$ or $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferable.

$R^1$ or $R^2$ is preferably a fluorine atom or $CF_3$.

x is preferably 1 to 10, and more preferably 1 to 5.

y is preferably 0 to 4, and more preferably 0.

z is preferably 0 to 5, and more preferably 0 to 3.

The divalent linking group of L is not particularly limited and examples thereof include —COO—, —OCO—, —CO—, —O—, —S—, —SO—, —SO$_2$—, an alkylene group, a cycloalkylene group, an alkenylene group, and a linking group formed by linking a plurality thereof. A linking group having a total number of carbon atoms of 12 or less is preferable. Among these, —COO—, —OCO—, —CO—, and —O— are preferable, and —COO— and —OCO— are more preferable.

In General Formula (ANI), preferred examples of a combination of partial structures other than A include $SO^{3-}$—$CF_2$—$CH_2$—OCO—, $SO^{3-}$—$CF_2$—CHF—$CH_2$—OCO—, $SO^{3-}$—$CF_2$—COO—, $SO^{3-}$—$CF_2$—$CF_2$—$CH_2$—, and $SO^{3-}$—$CF_2$—$CH(CF_3)$—OCO—.

The cyclic organic group of A is not particularly limited as long as it has a cyclic structure, and examples thereof include an alicyclic group, an aryl group, a heterocyclic group (including not only an aromatic heterocyclic group but also a non-aromatic heterocyclic group).

The alicyclic group may be monocyclic or polycyclic, and a monocyclic cycloalkyl group such as a cyclopentyl group, a cyclohexyl group, or a cyclooctyl group, or a polycyclic cycloalkyl group such as a norbornyl group, a tricyclodecanyl group, a tetracyclodecanyl group, a tetracyclododecanyl group, or an adamantyl group is preferable. Among these, an alicyclic group having a bulky structure which has 7 or more carbon atoms, such as a norbornyl group, a tricyclodecanyl group, a tetracyclodecanyl group, a tetracyclododecanyl group, or an adamantyl group is preferable from the viewpoints of suppressing in-film diffusion in a heating step after exposure and improving a mask error enhancement factor (MEEF).

Examples of the aryl group include a benzene ring, a naphthalene ring, a phenanthrene ring, and an anthracene ring.

Examples of the heterocyclic group include a furan ring, a thiophene ring, a benzofuran ring, a benzothiophene ring, a dibenzofuran ring, a dibenzothiophene ring, and a group derived from a pyridine ring. Among these, a furan ring, a thiophene ring, or a group derived from a pyridine ring is preferable.

In addition, as the cyclic organic group, a lactone structure can be used, and specific examples thereof include lactone structures represented by General Formulae (LC1-1) to (LC1-17).

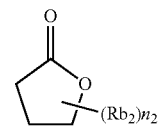

LC1-1

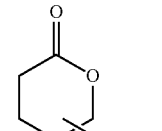

LC1-2

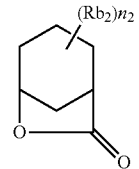

LC1-3

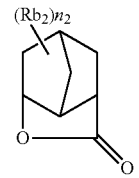

LC1-4

LC1-5 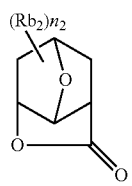

LC1-6 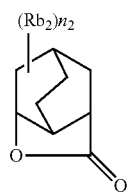

LC1-7 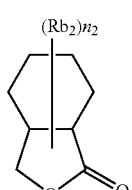

LC1-8 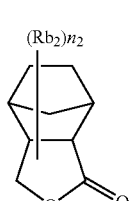

LC1-9 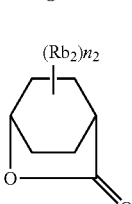

LC1-10 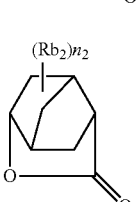

LC1-11 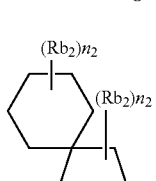

LC1-12 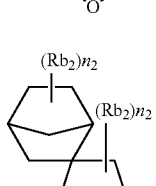

LC1-13 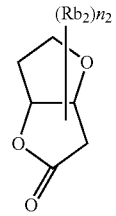

LC1-14 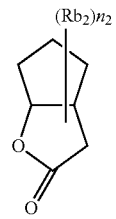

LC1-15 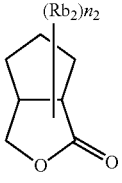

LC1-16 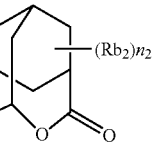

LC1-17 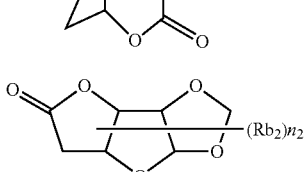

The cyclic organic group may have a substituent, and examples of the substituent include an alkyl group (a linear, branched, or cyclic alkyl group; preferably having 1 to 12 carbon atoms), a cycloalkyl group (a monocycle, a polycycle, or a spiro ring; preferably having 3 to 20 carbon atoms), an aryl group (preferably having 6 to 14 carbon atoms), a hydroxyl group, an alkoxy group, an ester group, an amido group, a urethane group, an ureido group, a thioether group, a sulfonamide group, and a sulfonate group. Carbon (carbon contributing to ring formation) constituting the cyclic organic group may be carbonyl carbon.

Moreover, the substituent corresponds to $Rb_2$ in (LC1-1) to (LC1-17). Further, in (LC1-1) to (LC1-17), $n_2$ represents an integer of 0 to 4. In a case where $n_2$ is 2 or more, a plurality of $R_{b2}$'s present may be the same as or different from each other or the plurality of $R_{b2}$'s present may be bonded to each other to form a ring.

In General Formula (ZI), examples of the organic groups of $R_{201}$, $R_{202}$, and $R_{203}$ include an aryl group, an alkyl group, and a cycloalkyl group.

It is preferable that at least one of $R_{201}$, $R_{202}$, or $R_{203}$ represents an aryl group, and it is more preferable that all of $R_{201}$, $R_{202}$, or $R_{203}$ represent an aryl group. As the aryl group, not only a phenyl group or a naphthyl group but also a heteroaryl group such as an indole residue or a pyrrole residue can be used. Preferred examples of the alkyl group and the cycloalkyl group of $R_{201}$ to $R_{203}$ include a linear or branched alkyl group having 1 to 10 carbon atoms or a cycloalkyl group having 3 to 10 carbon atoms. More preferred examples of the alkyl group include a methyl group, an ethyl group, a n-propyl group, an i-propyl group, and a n-butyl group. More preferred examples of the cycloalkyl group include a cyclopropyl group, a cyclobutyl group, a cyclopentyl group, a cyclohexyl group, and a cycloheptyl group. Each of the groups may further have a substituent. Examples of the substituent include, but are not limited to, a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group of each of $R_{204}$ to $R_{207}$ is preferably a phenyl group or a naphthyl group, and more preferably a phenyl group. The aryl group of each of $R_{204}$ to $R_{207}$ may be an aryl group having a heterocyclic structure containing an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group in each of $R_{204}$ to $R_{207}$ include linear or branched alkyl groups having 1 to 10 carbon atoms (for example, a methyl group, an ethyl group, a propyl group, a butyl group, and a pentyl group), and cycloalkyl groups having 3 to 10 carbon atoms (a cyclopentyl group, a cyclohexyl group, and a norbornyl group).

The aryl group, the alkyl group, or the cycloalkyl group of each of $R_{204}$ to $R_{207}$ may have a substituent. Examples of the substituent which the aryl group, the alkyl group, or the cycloalkyl group of each of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

Furthermore, in General Formula (ZII), $Z^-$ represents a non-nucleophilic anion. Specifically, $Z^-$ is the same as those described as $Z^-$ in General Formula (ZI), preferred aspects thereof are also the same.

Specific examples of General Formulae (ZI) to (ZIII) are shown below, but are not limited thereto.

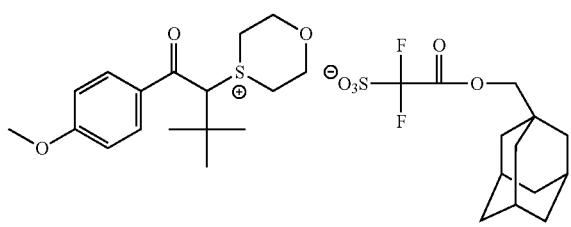

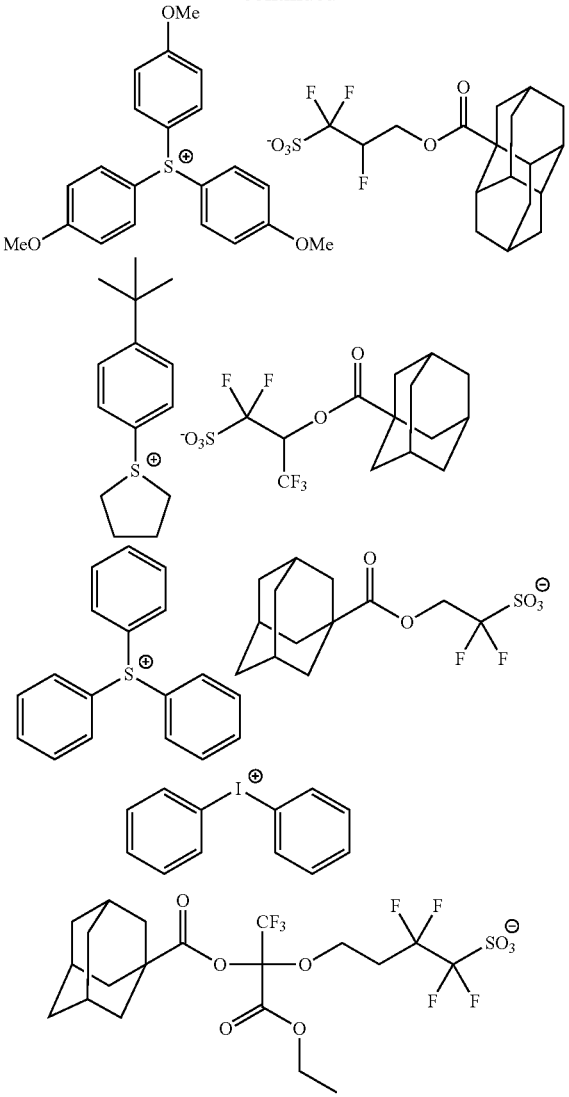

In the present invention, from the viewpoint of suppressing the diffusion of an acid generated by exposure to a unexposed area and improving the resolution, the photoacid generator may be a compound which generates an acid (more preferably sulfonic acid) having a volume of 130 Å$^3$ or more upon irradiation with an electron beam or an extreme ultraviolet ray, is more preferably a compound which generates an acid (more preferably sulfonic acid) having a volume of 190 Å$^3$ or more, still more preferably a compound which generates an acid (more preferably sulfonic acid) having a volume of 270 Å$^3$ or more, and particularly preferably a compound which generates an acid (more preferably sulfonic acid) having a volume of 400 Å$^3$ or more. From the viewpoints of sensitivity and coating solvent solubility, the volume is preferably 2,000 Å$^3$ or less, and more preferably 1,500 Å$^3$ or less. A value of the volume is obtained using "WinMOPAC" (manufactured by FUJITSU). That is, first, a chemical structure of an acid according to each example is input, and then the most stable conformation of each acid is determined through a molecular field calculation using a MM3 method with the input chemical structure as an initial structure. Next, a molecular orbital calculation is performed on the most stable conformation using a PM3 method. As a result, the "accessible volume" of each acid can be calculated.

In the present invention, photoacid generators which generate acids exemplified below upon irradiation with actinic rays or radiation are preferable. In addition, in some of the examples, calculated values of the volume are added (unit: Å$^3$). Further, the calculated values herein are volume values of an acid in which a proton is bonded to the anion portion.

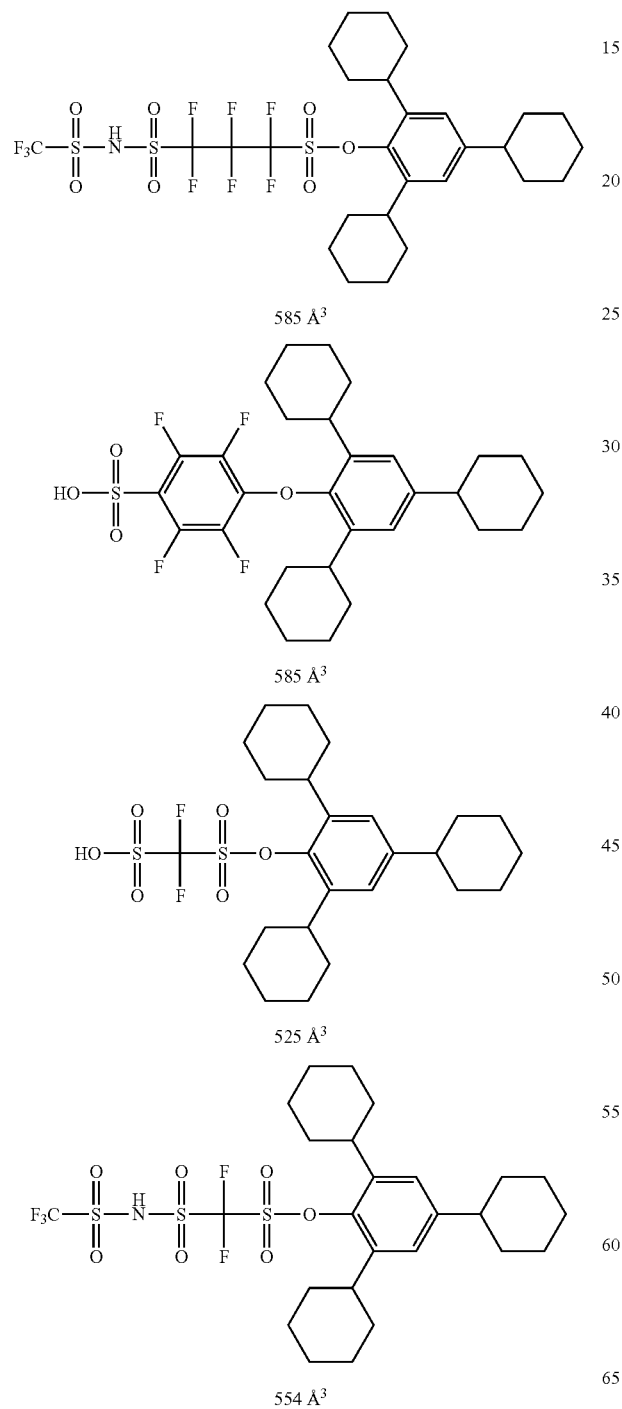

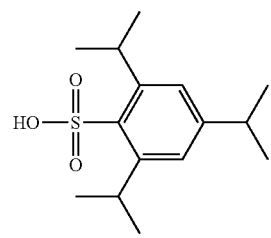

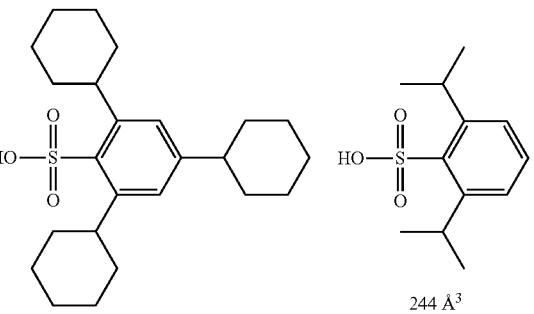

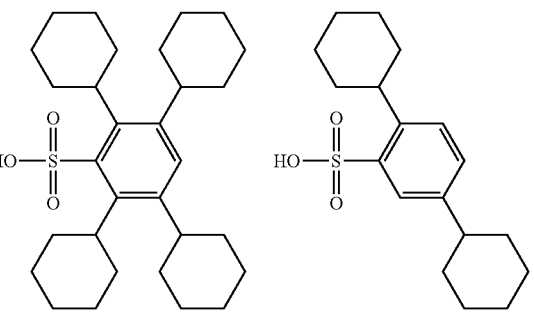

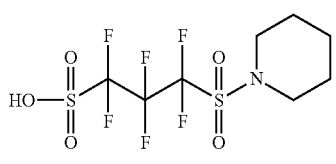

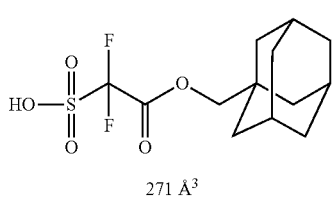

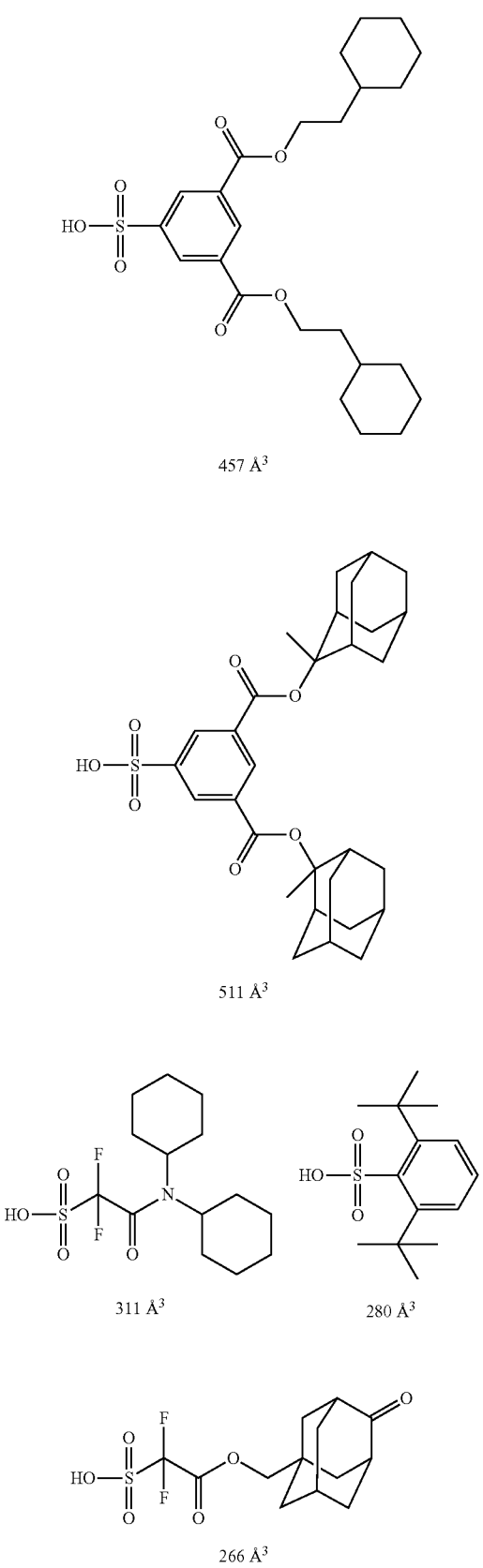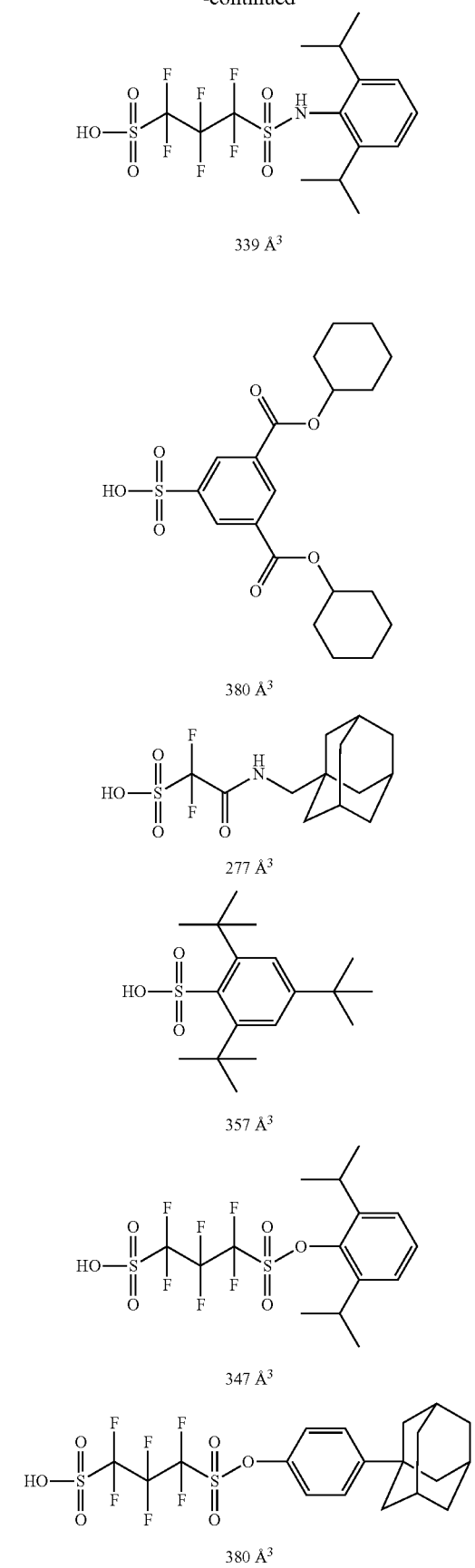

87
-continued
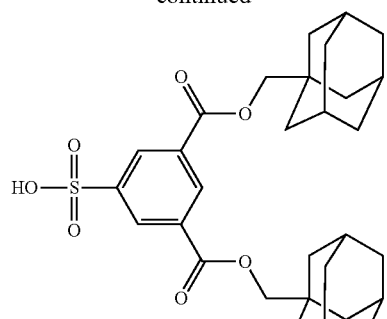
519 Å³
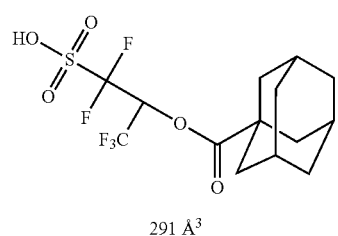
291 Å³
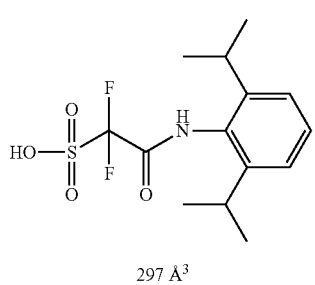
297 Å³
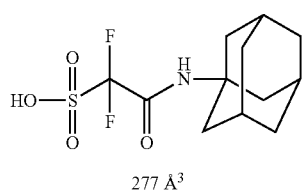
277 Å³
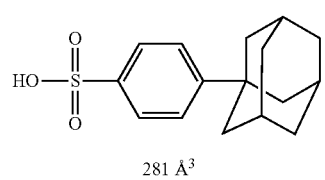
281 Å³
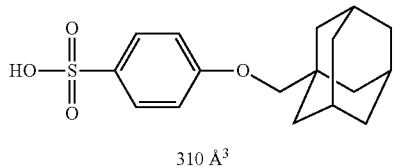
310 Å³
88
-continued
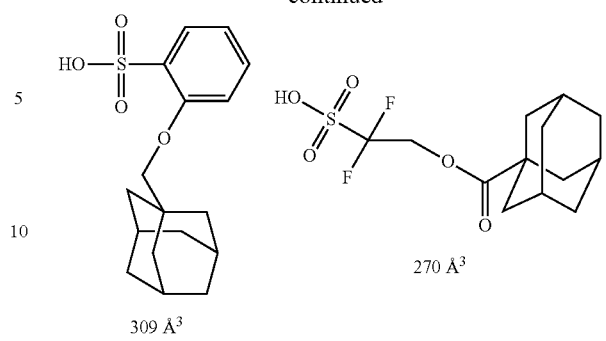
309 Å³        270 Å³
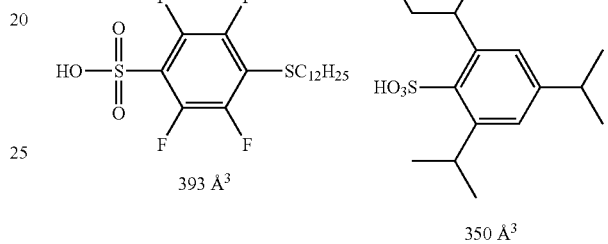
393 Å³        350 Å³
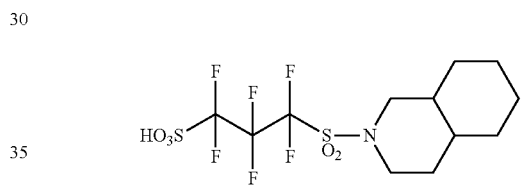
311 Å³
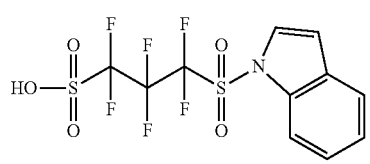
250 Å³
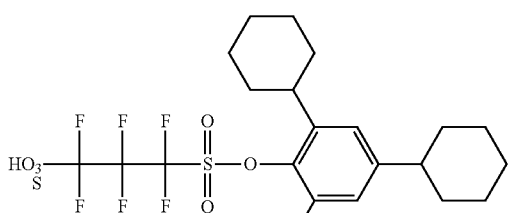
535 Å³
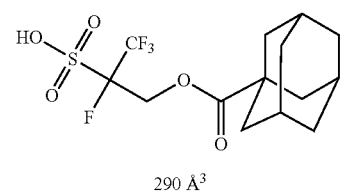
290 Å³

With regard to the photoacid generator, reference can be made to paragraphs [0368] to [0377] of JP2014-041328A and paragraphs [0240] to [0262] of JP2013-228681A (corresponding to paragraph [0339] of US2015/0004533A), the contents of which are hereby incorporated by reference. In addition, preferable specific examples thereof include, but are not limited to, the following compounds.

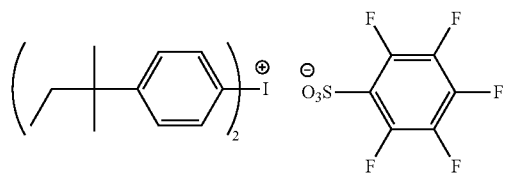
(z8)
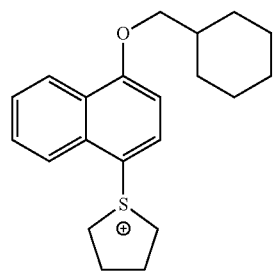
(z9)
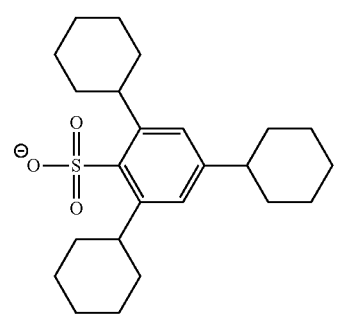
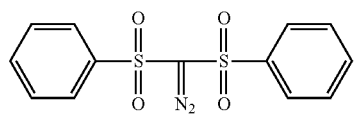
(z10)
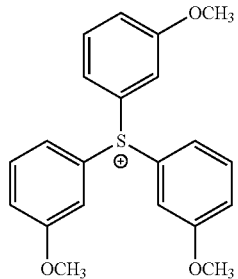
(z11)
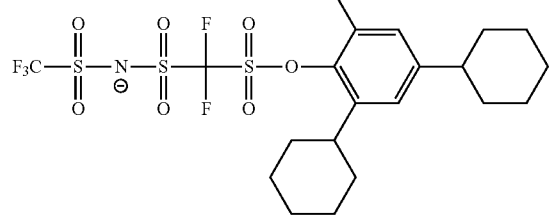
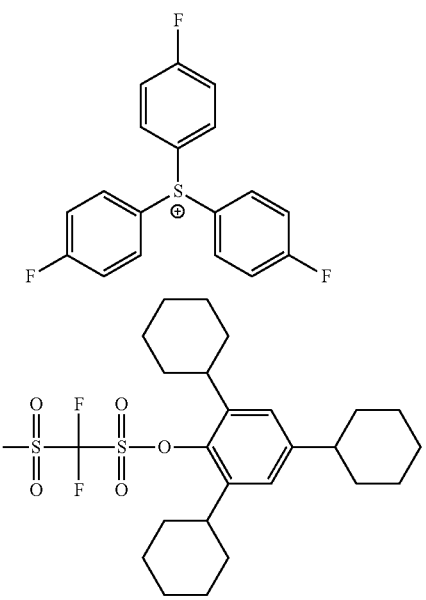
(z12)
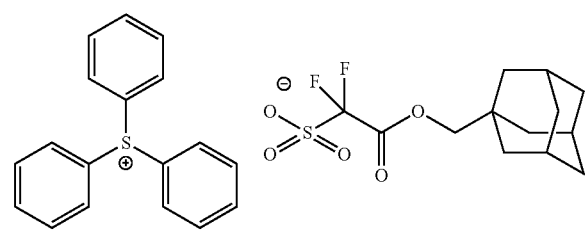
(z13)
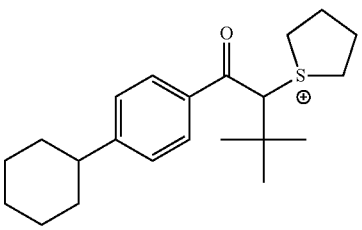
(z14)
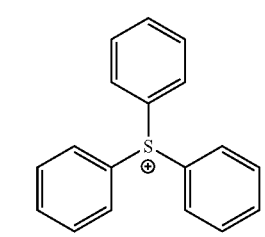
(z15)

-continued
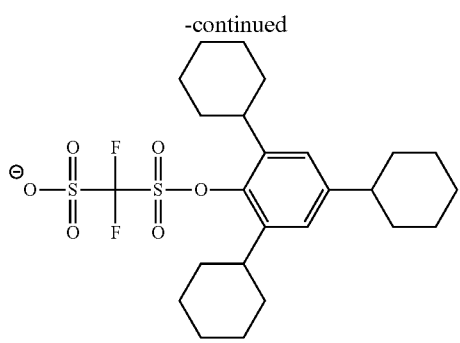
(z16)
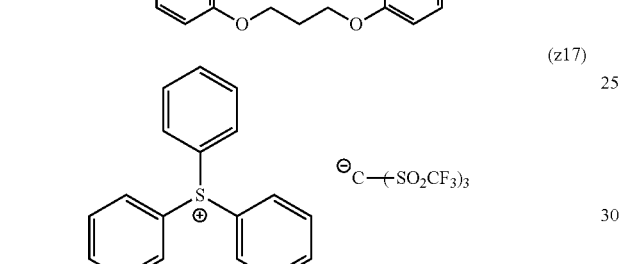
(z17)
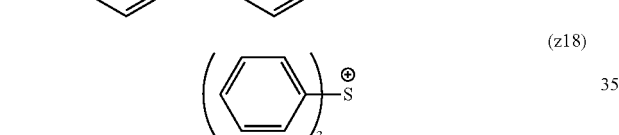
(z18)
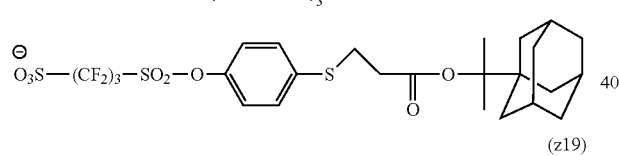
(z19)
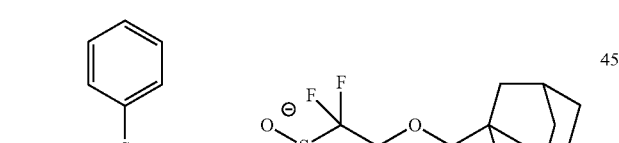
(z20)
-continued
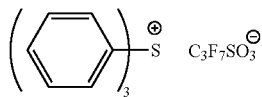
(z21)
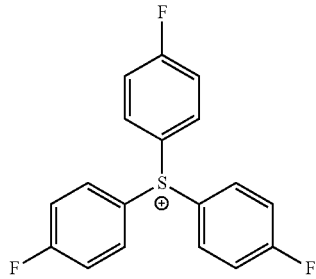
(z22)
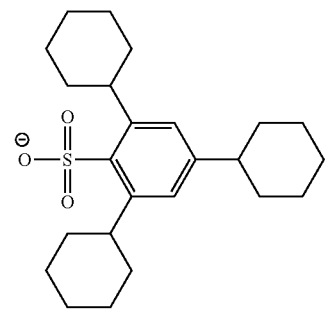
(z23)
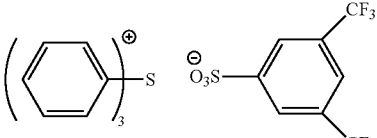
(z24)
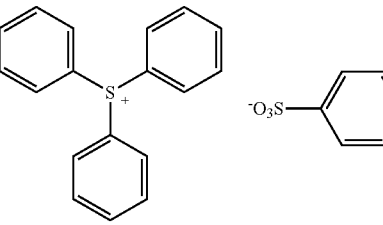
(z25)

(z26)
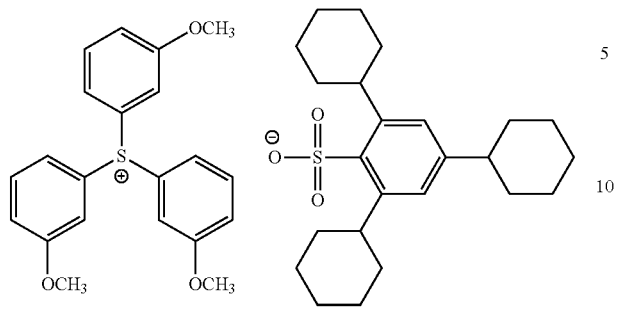
(z27)
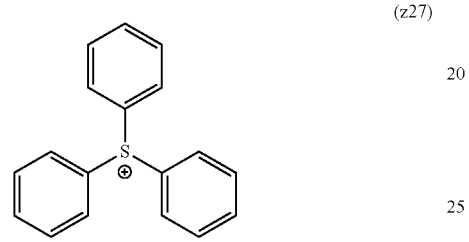
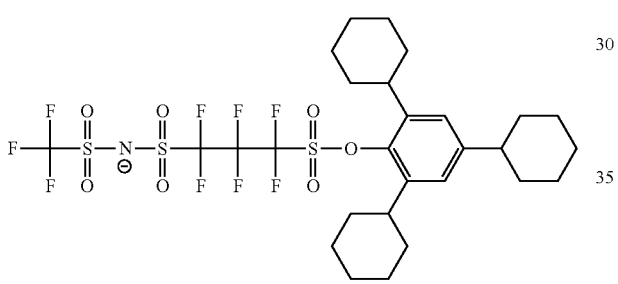
(z28)
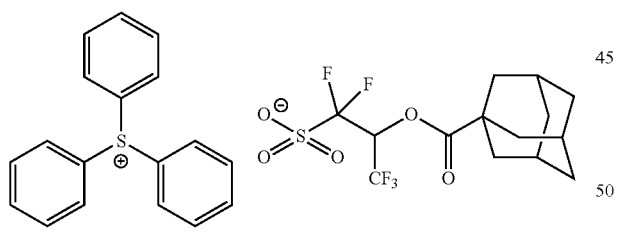
(z29)
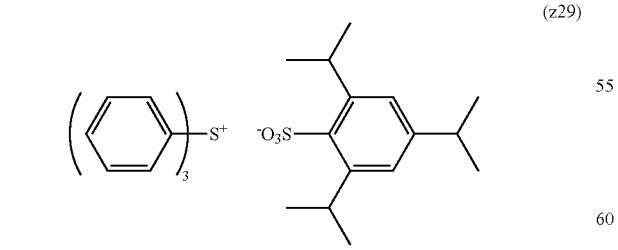
(z30)
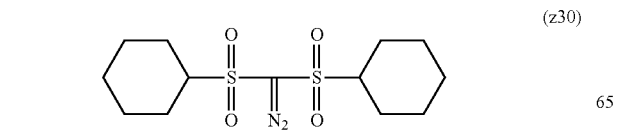
B-1
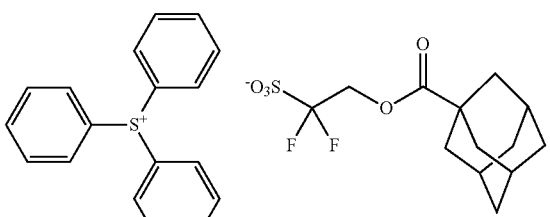
B-2
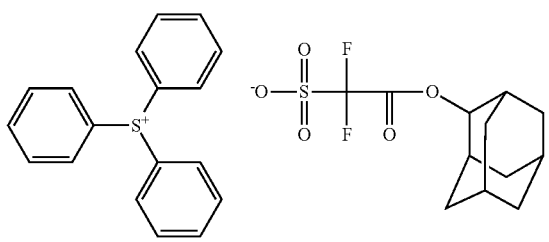
B-3
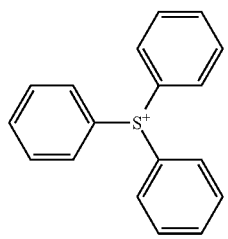
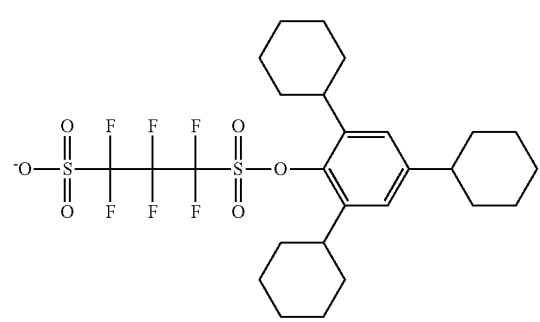
B-4
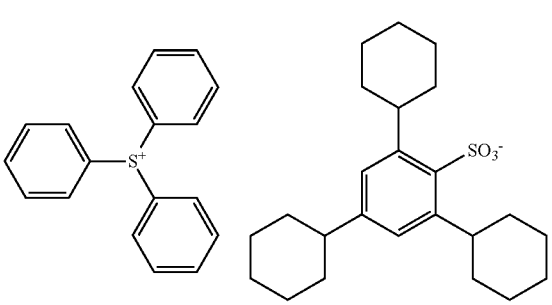

B-5
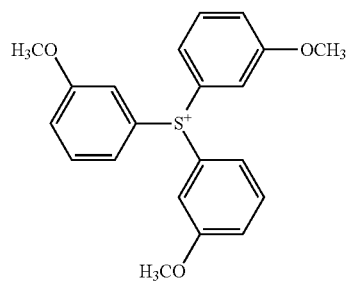
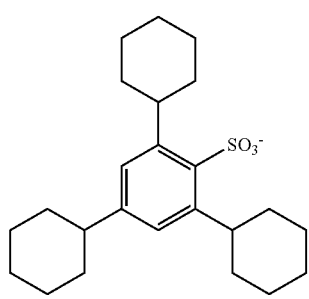
B-6
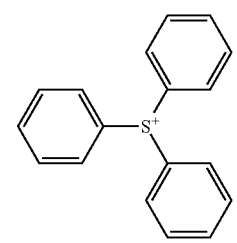
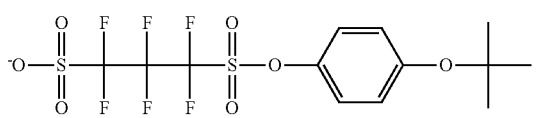
B-7
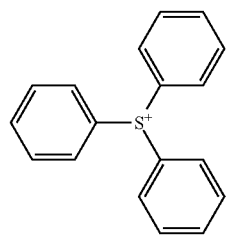
B-8
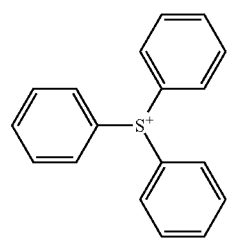
B-9
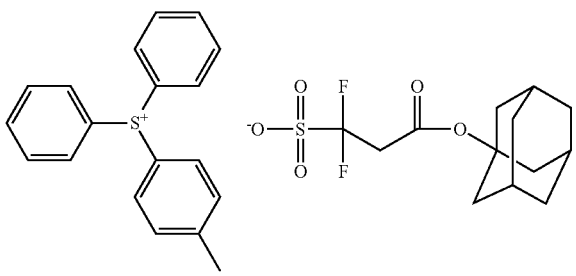
B-10
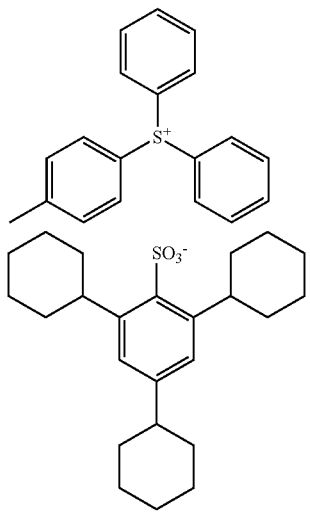
B-11
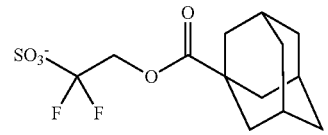
B-12
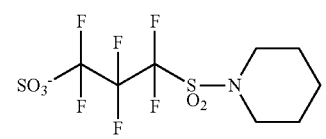
B-13
The photoacid generator may be used singly or in combination of two or more kinds thereof.
The content of the photoacid generator in the actinic ray-sensitive or radiation-sensitive resin composition is preferably 0.1% to 50% by mass, more preferably 5% to 50% by mass, and still more preferably 8% to 40% by mass, with respect to the total solid content of the composition. In particular, in order to simultaneously realize high sensitivity and high resolution during exposure with an electron beam or an extreme ultraviolet ray, the content of the photoacid generator is preferably high, more preferably 10% to 40% by mass, and most preferably 10% to 35% by mass.

(C) Solvent

In a case where the above-mentioned respective components are dissolved to prepare an actinic ray-sensitive or radiation-sensitive resin composition, a solvent can be used. Examples of the solvent that can be used include an organic solvent such as alkylene glycol monoalkyl ether carboxylate, alkylene glycol monoalkyl ether, alkyl lactate, alkyl alkoxy propionate, cyclic lactone having 4 to 10 carbon atoms, a monoketone compound having 4 to 10 carbon atoms which may include a ring, alkylene carbonate, alkyl alkoxy acetate, and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferred examples of the alkyl lactate include methyl lactate, ethyl lactate, propyl lactate, and butyl lactate.

Preferred examples of the alkyl alkoxy propionate include ethyl 3-ethoxypropionate, methyl 3-methoxypropionate, methyl 3-ethoxypropionate, and ethyl 3-methoxypropionate.

Preferred examples of the cyclic lactone having 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanolactone, and α-hydroxy-γ-butyrolactone.

Preferred examples of the monoketone compound having 4 to 10 carbon atoms, which may contain a ring, include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferred examples of the alkylene carbonate include propylene carbonate, vinylene carbonate, ethylene carbonate, and butylene carbonate.

Preferred examples of the alkyl acetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvate include methyl pyruvate, ethyl pyruvate, and propyl pyruvate.

Examples of the solvent which can be preferably used include a solvent having a boiling point of 130° C. or higher at a normal temperature under a normal pressure. Specific examples thereof include cyclopentanone, γ-butyrolactone, cyclohexanone, ethyl lactate, ethylene glycol monoethyl ether acetate, propylene glycol monomethyl ether acetate, 3-ethyl ethoxypropionate, ethyl pyruvate, 2-ethoxyethyl acetate, 2-(2-ethoxyethoxy)ethyl acetate, and propylene carbonate.

In the present invention, the solvent may be used singly or in combination of two or more kinds thereof.

In the present invention, as the organic solvent, a mixed solvent in which a solvent having a hydroxyl group in a structure is mixed with a solvent having no hydroxyl group may be used.

Examples of the solvent having a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Among these, propylene glycol monomethyl ether or ethyl lactate is particularly preferable.

Examples of the solvent having no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Among these, propylene glycol monomethyl ether acetate, ethyl ethoxypropionate, 2-heptanone, γ-butyrolactone, cyclohexanone, or butyl acetate is particularly preferable, and propylene glycol monomethyl ether acetate, ethyl ethoxypropionate, 2-heptanone is most preferable.

A mixing ratio (mass ratio) of the solvent having a hydroxyl group to the solvent having no hydroxyl group is preferably 1/99 to 99/1, more preferably 10/90 to 90/10, and still more preferably 20/80 to 60/40. A mixed solvent containing 50% by mass or more of the solvent having no hydroxyl group is particularly preferable in view of coating uniformity.

It is preferable that the solvent is a mixed solvent of two or more kinds of the solvents containing propylene glycol monomethyl ether acetate.

As the solvent, for example, the solvents described in paragraphs 0013 to 0029 of JP2014-219664A can also be used.

(D) Basic Compound

In order to reduce a change in performance with the lapse of time from exposure to heating, it is preferable that the actinic ray-sensitive or radiation-sensitive resin composition contains a basic compound (D).

Preferred examples of the basic compound (D) include compounds having structures represented by Formulae (A) to (E).

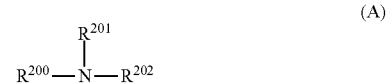

(A)

(B)

(C)

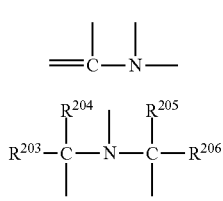

In General Formulae (A) and (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (preferably having 6 to 20 carbon atoms), and $R^{201}$ and $R^{202}$ may be bonded to each other to form a ring.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

$R^{203}$, $R^{204}$, $R^{205}$, and $R^{206}$ may be the same as or different from each other, and each represent an alkyl group having 1 to 20 carbon atoms.

It is more preferable that the alkyl groups in General Formulae (A) and (E) are unsubstituted.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure, or a pyridine structure, an alkylamino derivative having a hydroxyl group and/or an ether bond, and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]nona-5-ene, and 1,8-diazabicyclo[5,4,0]undeca-7-ene. Examples of the compound having an onium hydroxide structure include triarylsulfonium hydroxide, phenacylsulfonium hydroxide, sulfonium hydroxide having a 2-oxoalkyl group, and specifically, triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. The compound having an onium carboxylate structure is a compound in which the anion moiety of the compound having an onium hydroxide structure becomes a carboxylate, and examples thereof include acetate, adamantane-1-carboxylate, and perfluoroalkyl carboxylate. Examples of the compound having a trialkylamine structure include tri(n-butyl) amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Preferred examples of the basic compound include an amine compound further having a phenoxy group and an ammonium salt compound having a phenoxy group.

As the amine compound, a primary, secondary, or tertiary amine compound can be used, and an amine compound having at least one alkyl group bonded to the nitrogen atom thereof is preferable. The amine compound is more preferably a tertiary amine compound. In the amine compound, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) other than the alkyl group may be bonded to the nitrogen atom.

Incidentally, it is preferable that the amine compound has an oxygen atom in the alkyl chain thereof, thereby forming an oxyalkylene group. The number of oxyalkylene groups per molecule may be 1 or more, and is preferably 3 to 9, and more preferably 4 to 6. The oxyalkylene group is preferably an oxyethylene group (—$CH_2CH_2O$—) or an oxypropylene group (—$CH(CH_3)CH_2O$— or —$CH_2CH_2CH_2O$—), and more preferably an oxyethylene group.

As the ammonium salt compound, a primary, secondary, tertiary, or quaternary ammonium salt compound can be used. An ammonium salt compound having at least one alkyl group bonded to the nitrogen atom thereof is preferable. In the ammonium salt compound, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) other than the alkyl group may be bonded to the nitrogen atom.

It is preferable that the ammonium salt compound has an oxygen atom in an alkyl chain thereof, thereby forming an oxyalkylene group. The number of oxyalkylene groups per molecule may be 1 or more, and is preferably 3 to 9, and more preferably 4 to 6. The oxyalkylene group is preferably an oxyethylene group (—$CH_2CH_2O$—) or an oxypropylene group (—$CH(CH_3)CH_2O$— or —$CH_2CH_2CH_2O$—), and more preferably an oxyethylene group.

Examples of the anion in the ammonium salt compound include a halogen atom, sulfonate, borate, and phosphate. Among those, a halogen atom and sulfonate are preferable. Among the halogen atoms, chloride, bromide, and iodide are particularly preferable. Among the sulfonates, an organic sulfonate having 1 to 20 carbon atoms is particularly preferable. Examples of the organic sulfonate include aryl sulfonate and alkyl sulfonate having 1 to 20 carbon atoms. The alkyl group in the alkyl sulfonate may have a substituent. Examples of the substituent include fluorine, chlorine, bromine, an alkoxy group, an acyl group, and an aryl group. Specific examples of the alkyl sulfonate include methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate. Examples of the aryl group in the aryl sulfonate include a benzene ring, a naphthalene ring, and an anthracene ring. The benzene ring, the naphthalene ring, or the anthracene ring may have a substituent. Preferred examples of the substituent include a linear or branched alkyl group having 1 to 6 carbon atoms and a cycloalkyl group having 3 to 6 carbon atoms. Specific examples of the linear or branched alkyl group and cycloalkyl groups include methyl, ethyl, n-propyl, isopropyl, n-butyl, i-butyl, t-butyl, n-hexyl, and cyclohexyl. Other examples of the substituent include an alkoxy group having 1 to 6 carbon atoms, a halogen atom, cyano, nitro, an acyl group, and an acyloxy group.

The amine compound with a phenoxy group and the ammonium salt compound with a phenoxy group are those having a phenoxy group at the terminal of the alkyl group of each of the amine compound and the ammonium salt compound opposite to the nitrogen atom. The phenoxy group may have a substituent. Examples of the substituent of the phenoxy group include an alkyl group, an alkoxy group, a halogen atom, a cyano group, a nitro group, a carboxyl group, a carboxylic ester group, a sulfonic ester group, an aryl group, an aralkyl group, an acyloxy group, and an aryloxy group. The position of the substituent may be any of 2- to 6-positions. The number of the substituents may be any in the range of 1 to 5.

It is preferable that at least one oxyalkylene group is contained between the phenoxy group and the nitrogen atom. The number of oxyalkylene groups per molecule may be 1 or more, and is preferably 3 to 9, and more preferably 4 to 6. The oxyalkylene group is preferably an oxyethylene group (—$CH_2CH_2O$—) or an oxypropylene group (—CH($CH_3$)$CH_2O$— or —$CH_2CH_2CH_2O$—), and more preferably an oxyethylene group.

The amine compound having a phenoxy group can be obtained by heating a primary or secondary amine having a phenoxy group with a haloalkyl ether to make a reaction, and then adding an aqueous solution of a strong base such as sodium hydroxide, potassium hydroxide, and tetraalkylammonium thereto, followed by extraction with an organic solvent such as ethyl acetate and chloroform. Alternatively, the amine compound having a phenoxy group can be obtained by heating a primary or secondary amine with a haloalkyl ether having a phenoxy group at a terminal thereof to make a reaction, and then adding an aqueous solution of a strong base such as sodium hydroxide, potassium hydroxide, and tetraalkylammonium thereto, followed by extraction with an organic solvent such as ethyl acetate and chloroform.

(Compound (PA) that has Proton-Accepting Functional Group and Decomposes Upon Irradiation with Actinic Rays or Radiation to Generate Compound Exhibiting Deterioration in Proton-Accepting Properties, No Proton-Accepting Properties, or Change from Proton-Accepting Properties to Acidic Properties)

The composition according to the present invention may further include, as a basic compound, a compound [hereinafter also referred to as a compound (PA)] that has a proton-accepting functional group and decomposes upon irradiation with actinic rays or radiation to generate a compound exhibiting deterioration in proton-accepting properties, no proton-accepting properties, or a change from the proton-accepting properties to acidic properties.

The proton-accepting functional group refers to a functional group having a group or electron which is capable of electrostatically interacting with a proton, and for example, means a functional group with a macrocyclic structure, such as a cyclic polyether, or a functional group containing a nitrogen atom having an unshared electron pair not contributing to π-conjugation. The nitrogen atom having an unshared electron pair not contributing to π-conjugation is, for example, a nitrogen atom having a partial structure represented by the following general formula.

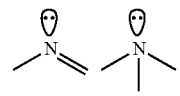

◌ Unshared Electron Pair

Preferred examples of a partial structure of the proton-accepting functional group include crown ether, azacrown ether, primary to tertiary amine, pyridine, imidazole, and a pyrazine structure.

The compound (PA) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (PA) having the proton-accepting functional group and the proton.

Specific examples of the compound (PA) include the following compounds. Further, specific examples of the compound (PA) include compounds described in paragraphs 0421 to 0428 of JP2014-041328A and paragraphs 0108 to 0116 of JP2014-134686A, the contents of which are hereby incorporated by reference.

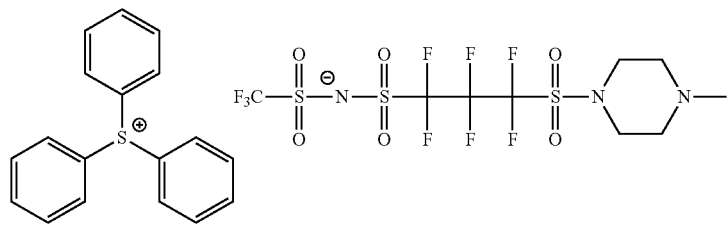

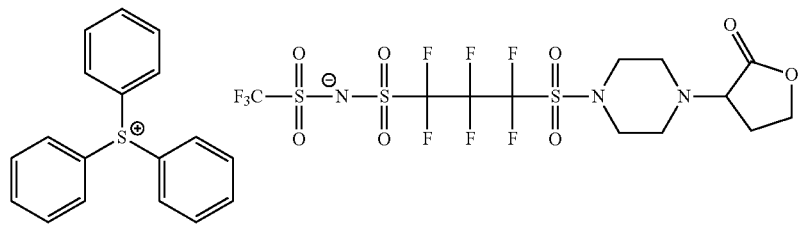

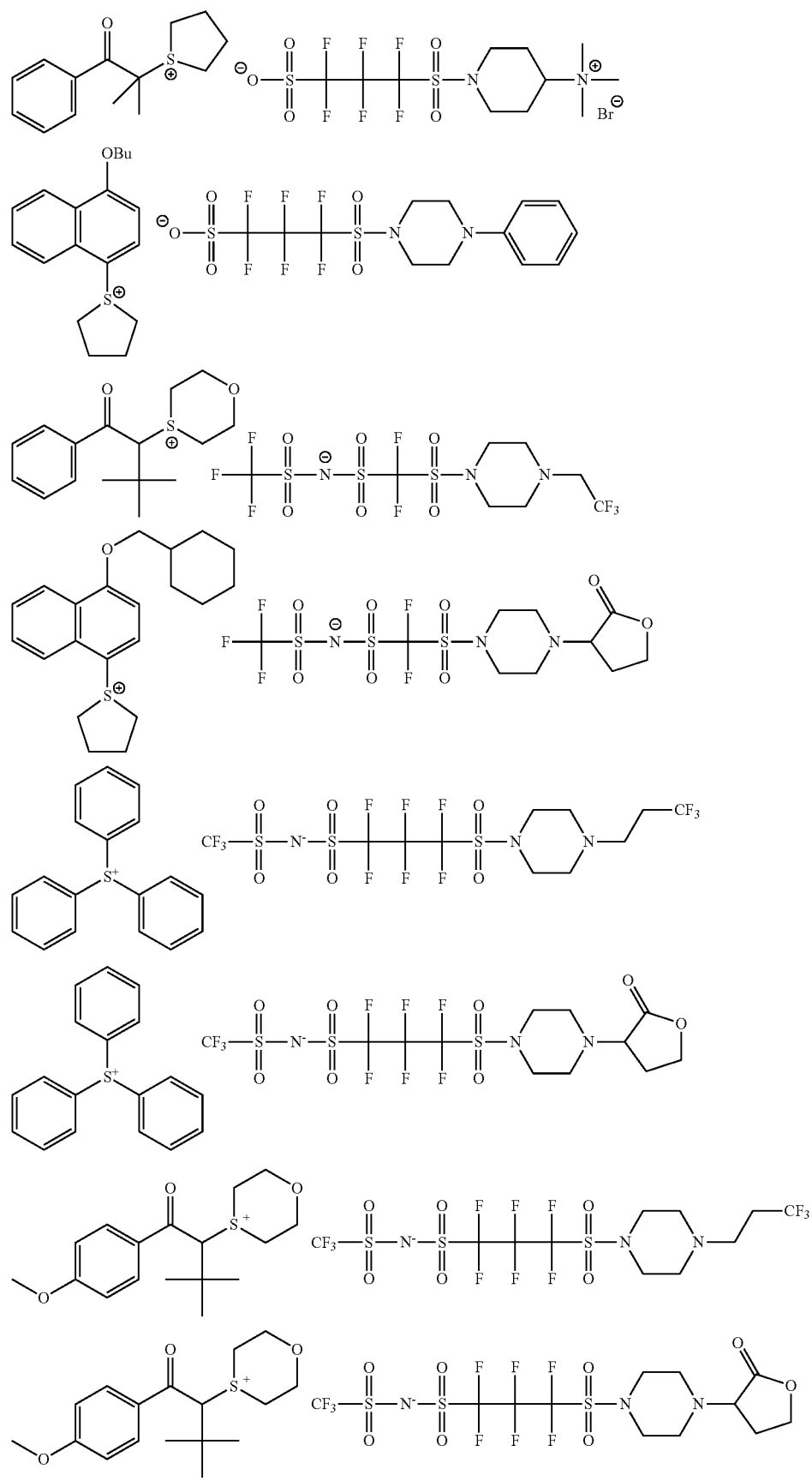

-continued

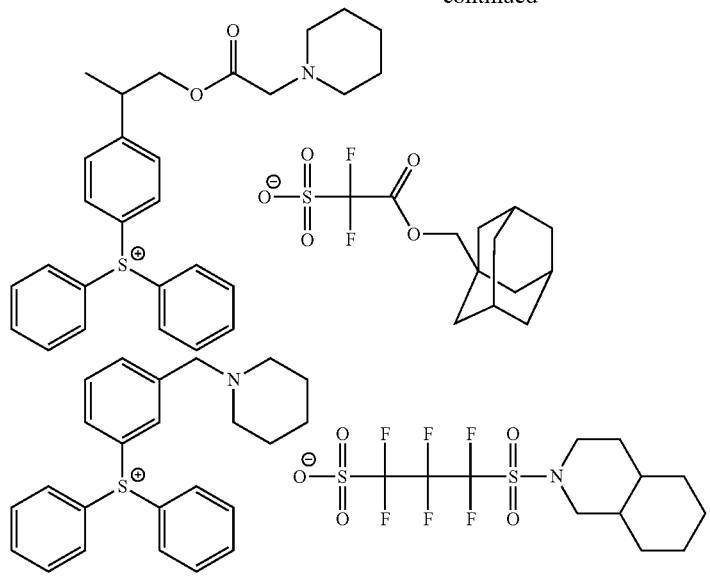

These basic compounds may be used singly or in combination of two or more kinds thereof.

The amount of the basic compound to be used is usually 0.001% to 10% by mass, and preferably 0.01% to 5% by mass, with respect to the solid content of the actinic ray-sensitive or radiation-sensitive composition.

The ratio between the photoacid generator to the basic compound to be used in the composition is preferably the photoacid generator/basic compound (molar ratio)=2.5 to 300. That is, the molar ratio is preferably 2.5 or more in view of sensitivity and resolution, and is preferably 300 or less in view of suppressing the reduction in resolution due to thickening of the resist pattern over time from exposure to the heat treatment. The photoacid generator/basic compound (molar ratio) is more preferably 5.0 to 200, and still more preferably 7.0 to 150.

As the basic compound, for example, the compounds (amine compounds, amido group-containing compounds, urea compounds, nitrogen-containing heterocyclic compounds, and the like) described in paragraphs 0140 to 0144 of JP2013-011833A can be used.

(A') Hydrophobic Resin

The actinic ray-sensitive or radiation-sensitive resin composition may include a hydrophobic resin (A') in addition to the resin (A).

It is preferable that the hydrophobic resin is designed to be localized on a surface of a resist film. Unlike the surfactant, the hydrophobic resin does not necessarily have a hydrophilic group in a molecule and does not necessarily contribute to uniform mixing with a polar/non-polar material.

Examples of an effect obtained by the addition of the hydrophobic resin include an effect of controlling a static/dynamic contact angle of a resist film surface with respect to water and an effect of suppressing out gas.

From the viewpoint of localization on the film surface layer, the hydrophobic resin includes preferably one or more kinds and more preferably two or more kinds among "a fluorine atom", "a silicon atom", and "a $CH_3$ partial structure included in a side chain of the resin". In addition, it is preferable that the hydrophobic resin includes a hydrocarbon group having 5 or more carbon atoms. These groups may be present at a main chain or may be substituted in a side chain of the resin.

In a case where the hydrophobic resin includes a fluorine atom and/or a silicon atom, the fluorine atom and/or the silicon atom in the hydrophobic resin may be present at a main chain or a side chain of the resin.

In a case where the hydrophobic resin includes a fluorine atom, it is preferable that the hydrophobic resin is a resin of which partial structure having a fluorine atom is an alkyl group having a fluorine atom, a cycloalkyl group having a fluorine atom, or an aryl group having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom and may further have a substituent other than a fluorine atom.

The cycloalkyl group having a fluorine atom is a monocyclic or polycyclic cycloalkyl group in which at least one hydrogen atom is substituted with a fluorine atom and may further have a substituent other than a fluorine atom.

Examples of the aryl group having a fluorine atom include an aryl group, such as a phenyl group or a naphthyl group, in which at least one hydrogen atom is substituted with a fluorine atom. The aryl group having a fluorine atom may further have a substituent other than a fluorine atom.

Examples of a repeating unit having a fluorine atom or a silicon atom include those exemplified in paragraph 0519 of US2012/0251948A1.

In addition, as described above, it is preferable that the hydrophobic resin includes a $CH_3$ partial structure at a side chain.

Here, examples of the $CH_3$ partial structure included at a side chain of the hydrophobic resin include a $CH_3$ partial structure such as an ethyl group or a propyl group.

On the other hand, a methyl group (for example, an α-methyl group of a repeating unit having a methacrylic acid structure) which is directly bonded to a main chain of the hydrophobic resin has little contribution to the surface localization of the hydrophobic resin caused by the effect of the main chain, and thus is not included in examples of the $CH_3$ partial structure according to the present invention.

With regard to the hydrophobic resin, reference can be made to the descriptions in paragraphs [0348] to [0415] of JP2014-010245A, the contents of which are hereby incorporated by reference.

In addition, as the hydrophobic resin, the resins described in JP2011-248019A, JP2010-175859A, and JP2012-032544A can also be preferably used.

(E) Surfactant

The actinic ray-sensitive or radiation-sensitive resin composition may further include a surfactant (E). By the incorporation of the surfactant, it is possible to form a pattern having less adhesiveness and fewer developing defects with good sensitivity and resolution in a case where an exposure light source at a wavelength of 250 nm or less, and particularly 220 nm or less is used.

As the surfactant, fluorine-based and/or silicon-based surfactants are particularly preferably used.

Examples of the fluorine-based and/or silicon-based surfactants include the surfactants described in [0276] of US2008/0248425A. Further, EFTOP EF301 or EF303 (manufactured by Shin-Akita Kasei K.K.); FLUORAD FC430, 431, or 4430 (manufactured by Sumitomo 3M Inc.); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Chemical); GF-300 or GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA); or FTX-204G, 208G, 218G, 230G, 204D, 208D, 212D, 218D, or 222D (manufactured by NEOS Co., Ltd.) may be used. In addition, a polysiloxane polymer KP-341 (manufactured by Shin-Etsu Chemical Co., Ltd.) can also be used as the silicon-based surfactant.

Furthermore, in addition to those known surfactants as shown above, the surfactant may be synthesized using a fluoro-aliphatic compound produced by a telomerization process (also called a telomer process) or an oligomerization process (also called an oligomer process). Specifically, a polymer including a fluoro-aliphatic group derived from the fluoro-aliphatic compound may be used as a surfactant. The fluoro-aliphatic compound can be synthesized in accordance with the method described in JP2002-090991A.

In addition, the surfactants described in [0280] of US2008/0248425A other than the fluorine-based and/or silicon-based surfactants may be used.

These surfactants may be used singly or in combination of two or more kinds thereof.

In a case where the actinic ray-sensitive or radiation-sensitive resin composition includes a surfactant, the content of the surfactant is preferably 0% to 2% by mass, more preferably 0.0001% to 2% by mass, and still more preferably 0.0005% to 1% by mass, with respect to the total solid content of the composition.

(F) Other Additives

The actinic ray-sensitive or radiation-sensitive resin composition may further include a dissolution inhibiting compound, a dye, a plasticizer, a photosensitizer, a light absorber, and/or a compound promoting a solubility in a developer (for example, a phenol compound having a molecular weight of 1,000 or less, or an alicyclic or aliphatic compound including a carboxy group).

The actinic ray-sensitive or radiation-sensitive resin composition may further include a dissolution inhibiting compound.

Here, the "dissolution inhibiting compound" is a compound having a molecular weight of 3,000 or less, which decreases its solubility in an organic developer through decomposition by the action of an acid.

The actinic ray-sensitive or radiation-sensitive resin composition may contain a quencher. The quencher is not particularly limited and known quenchers can be used.

The quencher has a basic compound that has a function of suppressing an acid-decomposable resin from unintentionally decomposing by an acid diffused from an exposed area in an unexposed area.

The content of the quencher in the actinic ray-sensitive or radiation-sensitive resin composition is not particularly limited, but generally, it is preferably 0.1% to 15% by mass, and more preferably 0.5% to 8% by mass, with respect to the total solid content of the actinic ray-sensitive or radiation-sensitive resin composition. The quencher may be used singly or in combination of two or more kinds thereof. In a case of using two or more kinds of the quenchers in combination, it is preferable that a total content thereof is in the range.

Examples of the quencher include those described in JP2016-057614A, JP2014-219664A, JP2016-138219A, and JP2015-135379A.

[Upper Layer Film (Topcoat Film)]

In the pattern forming method using the treatment liquid according to the embodiment of the present invention, an upper layer film (topcoat film) may be formed on the upper layer of the resist film.

It is preferable that the upper layer film is not mixed with a resist film, and further, can be uniformly applied on the upper layer of the resist film.

The upper layer film is not particularly limited, and upper layer films known in the related art can be formed according to the methods known in the related art, and can be formed, for example, based on the description in paragraphs 0072 to 0082 of JP2014-059543A. As a material for forming the upper layer film, a hydrophobic resin or the like can also be used, in addition to the polymers described in paragraph 0072 of JP2014-059543A. As the hydrophobic resin, for example, the hydrophobic resin (A') as described above can be used.

In a case where a developer containing an organic solvent is used in the developing step, it is preferable that an upper layer film containing the basic compound as described in JP2013-061648A, for example, is formed on a resist film. Specific examples of the basic compound which can be included in the upper layer film include a basic compound (E).

Furthermore, it is preferable that the upper layer film includes a compound including at least one group or bond selected from the group consisting of an ether bond, a thioether bond, a hydroxyl group, a thiol group, a carbonyl bond, an ester bond.

The upper layer film may further include a photoacid generator. As the photoacid generator, the same ones as the photoacid generator (for example, the above-mentioned photoacid generator (B)) which can be included in the actinic ray-sensitive or radiation-sensitive composition can be used.

Hereinafter, a resin which is preferable used for an upper layer film (topcoat film) will be described.

(Resin)

It is preferable that the composition for forming an upper layer film contains a resin. The resin that can be contained in the composition for forming an upper layer film is not particularly limited, but the same ones as the hydrophobic resin (for example, the above-mentioned hydrophobic resin (A')) that can be included in the actinic ray-sensitive or radiation-sensitive composition can be used.

With regard to the hydrophobic resin, reference can be made to [0017] to [0023] of JP2013-061647A ([0017] to [0023] of the corresponding US2013/0244438A), and [0016] to [0162] of JP2014-056194A, the contents of which are hereby incorporated by reference.

In the present invention, it is preferable that the composition for forming an upper layer film includes a resin containing a repeating unit having an aromatic ring. By the incorporation of the repeating unit having an aromatic ring, secondary electron generation efficiency and acid generation efficiency from a compound that generates an acid with actinic rays or radiation increase, particularly during exposure with electron beams or EUV, and thus, during pattern formation, an effect of realization of high sensitivity and high resolution can be expected.

The weight-average molecular weight of the resin is preferably 3,000 to 100,000, more preferably 3,000 to 30,000, and most preferably 5,000 to 20,000. The blend amount of the resin in the composition for forming an upper layer film is preferably 50% to 99.9% by mass, more preferably 60% to 99.9% by mass, still more preferably 70% to 99.7% by mass, and even still more preferably 80% to 99.5% by mass, in the total solid content.

In a case where the composition for forming an upper layer film (topcoat composition) includes a plurality of resins, it is preferable that the composition for forming an upper layer film includes at least one resin (XA) having a fluorine atom and/or a silicon atom.

As for a preferred range of the content of the fluorine atoms and the silicon atoms contained in the resin (XA), the repeating units including fluorine atoms and/or silicon atoms preferably accounts for 10% to 100% by mole, preferably accounts for 10% to 99% by mole, and more preferably 20% to 80% by mole in the resin (XA).

Furthermore, it is more preferable that the composition for forming an upper layer film includes at least one resin (XA) having a fluorine atom and/or a silicon atom, and a resin (XB) having a smaller content of the fluorine atom and/or the silicon atom than that of the resin (XA). As a result, at a time of forming the upper layer film, the resin (XA) is localized on the surface of an upper layer film, and therefore, performance such as development characteristics and immersion liquid tracking properties can be improved.

The content of the resin (XA) is preferably 0.01% to 30% by mass, more preferably 0.1% to 10% by mass, still more preferably 0.1% to 8% by mass, and particularly preferably 0.1% to 5% by mass, with respect to the total solid content included in the composition for forming an upper layer film. The content of the resin (XB) is preferably 50.0% to 99.9% by mass, more preferably 60% to 99.9% by mass, still more preferably 70% to 99.9% by mass, and particularly preferably 80% to 99.9% by mass, with respect to the total solid content included in the composition for forming an upper layer film.

An aspect in which the resin (XB) substantially does not a fluorine atom and a silicon atom is preferable, and in this case, specifically, the total content of the repeating units having a fluorine atom and the repeating unit having a silicon atom is preferably 0% to 20% by mole, more preferably 0% to 10% by mole, still more preferably 0% to 5% by mole, and particularly preferably 0% to 3% by mole, and ideally 0%, that is, not containing a fluorine atom and a silicon atom, with respect to all the repeating units in the resin (XB).

<Method for Preparing Composition for Forming Upper Layer Film (Topcoat Composition)>

For the composition for forming an upper layer film, it is preferable that the respective components are dissolved in a solvent and filtered through a filter. The filter is preferably a polytetrafluoroethylene-, polyethylene-, or nylon-made filter having a pore size of 0.1 µm or less, more preferably 0.05 µm or less, and still more preferably 0.03 µm or less. Further, two or more kinds of filters may be connected in series or in parallel, and used. Incidentally, the composition may be filtered a plurality of times, and a step of filtering a plurality of times may be a circulatory filtering step. Incidentally, the composition may also be subjected to a deaeration treatment or the like before and after the filtering through the filter. It is preferable that the composition for forming an upper layer film does not include impurities such as a metal. The content of the metal component included in these materials is preferably 10 ppm or less, more preferably 5 ppm or less, and still more preferably 1 ppm or less, but the materials substantially not having the metal component (at a detection limit of a measurement device or less) is particularly preferable.

In a case where the exposure is a liquid immersion exposure in <Exposing Step> as described above, the upper layer film is disposed between the actinic ray-sensitive or radiation-sensitive film and the immersion liquid, and the actinic ray-sensitive or radiation-sensitive film functions as a layer which is not brought into direct contact with the immersion liquid. In this case, preferred characteristics required for the upper layer film (composition for forming an upper layer film) are coating suitability onto the actinic ray-sensitive or radiation-sensitive film, radiation, transparency, particularly to light at 193 nm, and poor solubility in an immersion liquid (preferably water). Further, it is preferable that the upper layer film can be uniformly applied onto the surface of the actinic ray-sensitive or radiation-sensitive film while not being mixed with the actinic ray-sensitive or radiation-sensitive film.

Moreover, in order to uniformly apply the composition for forming an upper layer film onto the surface of the actinic ray-sensitive or radiation-sensitive film while not dissolving the actinic ray-sensitive or radiation-sensitive film, it is preferable that the composition for forming an upper layer film contains a solvent in which the actinic ray-sensitive or radiation-sensitive film is not dissolved. It is more preferable that as the solvent in which the actinic ray-sensitive or radiation-sensitive film is not dissolved, a solvent of components other than a developer containing an organic solvent (organic developer) is used.

A method for coating the composition for forming an upper layer film is not particularly limited, a spin coating method, a spray method, a roll coating method, a dip method, or the like, known in the related art, can be used.

The film thickness of the upper layer film is not particularly limited, but from the viewpoint of transparency to an exposure light source, the film is formed, which has a thickness of usually 5 nm to 300 nm, preferably 10 nm to 300 nm, more preferably 20 nm to 200 nm, and still more preferably 30 nm to 100 nm.

After forming the upper layer film, the substrate is heated (PB), if desired.

From the viewpoint of resolution, it is preferable that the refractive index of the upper layer film is close to that of the actinic ray-sensitive or radiation-sensitive film.

The upper layer film is preferably insoluble in an immersion liquid, and more preferably insoluble in water.

With regard to a receding contact angle of the upper layer film, the receding contact angle (23° C.) of an immersion liquid onto the upper layer film is preferably 50 to 100 degrees, and more preferably 80 to 100 degrees, from the viewpoint of immersion liquid tracking properties.

In the liquid immersion exposure, from the viewpoint that the immersion liquid needs to move on a wafer following the movement of an exposure head which is scanning the wafer at a high speed and forming an exposure pattern, the contact angle of the immersion liquid with respect to the actinic ray-sensitive or radiation-sensitive film in a dynamic state is important, and in order to obtain better resist performance, the immersion liquid preferably has a receding contact angle in the above range.

In a case where the upper layer film is peeled, an organic developer may be used, and another peeling liquid may also be used. As the peeling liquid, a solvent hardly permeating the actinic ray-sensitive or radiation-sensitive film is preferable. In a view that the peeling of the upper layer film can be carried out simultaneously with the development of the actinic ray-sensitive or radiation-sensitive film, the upper layer film is preferably releasable with an organic developer. The organic developer used for peeling is not particularly limited as long as it makes it possible to dissolve and remove a less exposed area of the actinic ray-sensitive or radiation-sensitive film.

From the viewpoint of peeling with an organic developer, the dissolution rate of the upper layer film in the organic developer is preferably 1 to 300 nm/sec, and more preferably 10 to 100 nm/sec.

Here, the dissolution rate of a upper layer film in the organic developer refers to a film thickness decreasing rate in a case where the upper layer film is exposed to a developer after film formation, and is a rate in a case where immersing in a butyl acetate solution at 23° C. in the present invention.

An effect of reducing the generation of development defects after developing an actinic ray-sensitive or radiation-sensitive film is accomplished by adjusting the dissolution rate of an upper layer film in the organic developer to 1 nm/sec or more, and preferably 10 nm/sec or more. Further, an effect that the line edge roughness of a pattern after the development of the actinic ray-sensitive or radiation-sensitive film is improved is accomplished by the influence of reduction in the exposure unevenness during liquid immersion exposure by adjusting the dissolution rate to 300 nm/sec or less, and preferably 100 nm/sec.

The upper layer film may also be removed using other known developers, for example, an aqueous alkali solution. Specific examples of the usable aqueous alkali solution include an aqueous tetramethylammonium hydroxide solution.

In addition, the treatment liquid according to the embodiment of the present invention can also be used in the method for manufacturing an electronic device, including a pattern forming method using treatment liquid according to the embodiment of the present invention.

An electronic device manufactured by the method for manufacturing an electronic device is suitably mounted on electric or electronic equipment (home electronics, office automation (OA), media-related equipment, optical equipment, telecommunication equipment, and the like).

Examples

Hereinafter, the present invention will be specifically described using Examples, but the present invention is not limited thereto. Further, "%", "ppm", "ppb", "ppt", and "ppq" are based on mass unless specified otherwise.

[Production of Treatment Liquid]

During the production of the treatment liquids of Examples and Comparative Examples, the following organic solvents were prepared. For each of the organic solvents, an organic solvent with a high-purity grade having a purity of 99% by mass or more was used as a raw material used for the production of the treatment liquid, and in addition, the raw material was purified in advance by distillation, ion exchange, filtering, or the like. Using the raw materials obtained in this manner, each of the organic solvents was produced by a known method and each of the organic solvents thus obtained was used in the following purifying step.

Propylene glycol monomethyl ether acetate (PGMEA)
Propylene glycol monomethyl ether (PGME)
Methyl ethyl ketone (MEK)
Methyl propyl ketone (MPK)
γ-Butyrolactone (γBL)

Next, a step of purifying the prepared organic solvent was carried out. In the purifying step, a first ion exchange treatment in which an organic solvent is subjected to an ion exchange treatment, a dehydration treatment in which the organic solvent after the first ion exchange treatment is subjected to dehydration, a distillation treatment in which the organic solvent after the dehydration treatment is subjected to distillation, and a second ion exchange treatment in which the organic solvent after the distillation treatment is subjected to an ion exchange treatment were carried out in this order.

Here, for the first ion exchange treatment, DIAION (manufactured by Mitsubishi Chemical Corporation) was used as an ion exchange resin. Further, the dehydration treatment was performed at an inert gas atmosphere with a dew point temperature of −70° C., using Molecular Sieves 3A, 4A, 5A, and 13X (all manufactured by Union Showa K. K.) as the water adsorbent singly or in combination. In addition, the distillation treatment was performed using a single-stage distillation device with. In addition, for the second ion exchange treatment, an ion adsorption film (trade name "NEOSEPTA", manufactured by ASTOM Corporation) was used.

Thereafter, the organic solvents were mixed to obtain treatment liquids of Examples and Comparative Examples. Incidentally, the mixing was performed in an airtight container.

Furthermore, adjustment of the contents of the metal component and water in Examples and Comparative Examples in the treatment liquids was performed by appropriately changing the number of each treatment.

[Measurement of Content and Evaluation Test]

Using the treatment liquids of Examples and Comparative Examples, measurement of the contents of the respective components and various evaluation tests were performed. Here, the following measurement and evaluation tests were performed in a clean room at a level that meets all ISO Class 2 or less. In order to improve measurement accuracy, in a case where the contents were below the detection limit by normal measurements, in the measurement of the content of the metal component, the measurement of the content of water, the measurement of the content of alkenes, and the measurement of the content of the acid component, the measurements were performed after performing concentration to one-hundredth in terms of volume, and calculation of the content was performed in terms of the concentration of the treatment liquid before the concentration.

<Measurement of Content of Metal Components (Total Metal Content)>

Using the treatment liquids of Examples and Comparative Examples, the content of the metal component (Na, K, Ca, Fe, Cu, Mg, Mn, Li, Al, Cr, Ni, Ti, and Zn) in the treatment liquid was measured. Specifically, using each of the treatment liquids of Examples and Comparative Examples, the contents were measured by an ICP-MS method using NexION350 (trade name, manufactured by Perkin Elmer, Inc.). The measurement results are shown in Table 1.

Specific measurement conditions for the ICP-MS method is as follows. Incidentally, the detected amount at a peak intensity for a standard solution at a known concentration was measured, and converted in terms of the mass of the metal component to calculate the content (total metal content) of the metal component in the treatment liquid used in the measurement.

The content of the metal component was measured by a conventional ICP-MS method, not a SP-ICP-MS method which will be described later. Specifically, a software for ICP-MS was used as a software used for the analysis of the metal component.

(Measurement Conditions for ICP-MS Method)

((Standard Substance))

Ultrapure water was metered into a clean glass container, and metal particles to be measured, having a median diameter of 50 nm, were added such that the concentration became 10,000 particles/ml, and then a dispersion liquid which had been treated with an ultrasonic washing machine for 30 minutes was used as a standard substance for measurement of a transport efficiency.

((ICP-MS Device Used))

Manufacturer: Perkin Elmer, Inc.

Model: NexION350S ((Measurement Condition of ICP-MS))

A liquid to be measured was aspirated at about 0.2 mL/min using a PFA-made coaxial nebulizer, a quartz-made cyclonic spray chamber, and a quartz-made torch injector with an inner diameter of 1 mm for ICP-MS. Cell purge was performed with an amount of oxygen to be added of 0.1 L/min, a plasma output of 1,600 W, and ammonia gas. Analysis was performed at a time resolution of 50 µs.

((Software))

The content of the metal component was measured using the following analysis software belonging to the manufacturer.

Syngistix for ICP-MS software

<Measurement of Content of Metal Particles>

Using the treatment liquids of Examples and Comparative Examples, the contents of the particulate metal component (metal particle) among the metal components (Na, K, Ca, Fe, Cu, Mg, Mn, Li, Al, Cr, Ni, Ti, and Zn) in the treatment liquid were measured. Specifically, in the same manner as in the measurement device in "Measurement of Content of Metal Components (Total Content of Metals)" above except that the software for "ICP-MS" was replaced by a software for "SP-ICP-MS" (Syngistix Nano Application Module exclusively for nanoparticle analysis "SP-ICP-MS"), measurement by a SP-ICP-MS method was performed.

The measurement results are shown in Table 1.

<Measurement of Content of Water>

Using the treatment liquids of Examples and Comparative Examples, the content of water in each of the treatment liquids was measured. For the measurement, a Karl Fischer moisture meter (trade name "MKC-710M", manufactured by Kyoto Electronics Manufacturing Co., Ltd., Karl Fischer coulometric titration) was used. The measurement results are shown in Table 1.

<Measurement of Content of Alkenes>

Using the treatment liquids of Examples and Comparative Examples, the content of alkenes in the treatment liquid. For the measurement, using a gas chromatograph mass spectrometry (GC-MS). The measurement results are shown in Table 1.

<Measurement of Content of Acid Components>

Using the treatment liquids of Examples and Comparative Examples, the content of the acid component in the treatment liquid was measured by a neutralization titration method. Specifically, an automatic potentiometric titrator (trade name "MKA-610", manufactured by Kyoto Electronics Manufacturing Co., Ltd.) was used for the measurement. The measurement results are shown in Table 1.

<Evaluation Test of Defects>

The number of foreign matters with a diameter of 32 nm or more present on the surface of a silicon substrate with a diameter of 300 mm, and the address of the foreign matters were measured using a wafer surface inspection device (SP-5, manufactured by KLA-Tencor Corporation).

Then, the wafer in which the number of the foreign matters present on the surface of a silicon substrate had been counted was set up in a spinning wafer treatment device (manufactured by EKC Technology, Inc.).

Next, the treatment liquids of Examples and Comparative Examples were jetted for 1 minute at a flow rate of 1.5 L/min onto the surface of the set wafer. Thereafter, the wafer was spin-dried.

For the obtained wafer after drying, the number of the foreign matters on the wafer and the address were measured using the wafer surface inspection device.

Furthermore, for the further increased foreign matters after spin-drying of the treatment liquid, elemental analysis by energy dispersive X-ray (EDX) spectrometry) was performed using a defect analyzer (SEMVISION G6, manufactured by APPLIED MATERIALS, Inc.). Using Na, K, Ca, Fe, Cu, Mg, Mn, Li, Al, Cr, Ni, Ti, and Zn as target metal elements, foreign matters including the target metal elements were counted as particles. The number of the obtained particles was evaluated according to the following evaluation standard. The results are shown in Table 1.

A: The number of particles with a diameter of 32 nm or more containing target metal elements is 0 or more and less than 100.

B: The number of particles with a diameter of 32 nm or more containing target metal elements is 100 or more and less than 500.

C: The number of particles with a diameter of 32 nm or more containing target metal elements is 500 or more and less than 1,000.

D: The number of particles with a diameter of 32 nm or more containing target metal elements is 1,000 or more.

<Evaluation Test of Wettability>

A silicon wafer was set in a spinning wafer treatment device (manufactured by EKC Technology, Inc.). Next, the treatment liquid of Example 1 was jetted for 1 minute at a flow rate of 1.5 L/min onto the surface of the set wafer.

Furthermore, the rotation speed in the spin drying was changed in the wafer which had been treated with the treatment liquid of Example 1, and the changed rotation speed was used in drying to obtain two wafers. For the two wafers after drying, the number of the foreign matters on the wafer and the address were measured using the wafer surface inspection device as used in "Evaluation Test of Defects" above. Here, a case where there is no difference in the number of the foreign matters and the address among the wafers can indicate that the treatment liquid has a property of being easily uniformly wet.

In other Examples and Comparative Examples, comparison of the number of the foreign matters and the address was performed in the same manner as in Example 1.

The evaluation standard is as follows.

A: A difference in the number of foreign matters and the address among the wafers was not observed.

B: A difference in the number of foreign matters and the address among the wafers was seen, and in particular, an increase or a decrease in foreign matters in the central portion and/or the edge portion of the wafer was seen.

<Evaluation Test of Corrosion Resistance>

After a silicon substrate was immersed in a 5% aqueous hydrofluoric acid solution for 1 minute, and then rinsed with ultrapure water and subjected to nitrogen blow drying, thereby preparing a silicon substrate A.

The silicon substrate A was immersed in each of the treatment liquids of Examples and Comparative Examples at 25° C. for 30 days. An increase in the thickness of the surface oxide film of the silicon substrate A after immersion in the treatment liquid was measured with an ellipsometer.

A: The increase in the thickness of the surface oxide film is 0.5 nm or less.

B: The increase in the thickness of the surface oxide film is more than 0.5 nm and 1 nm or less.

C: The increase in the thickness of the surface oxide film is more than 1 nm and 2 nm or less.

D: The increase in the thickness of the surface oxide film is more than 2 nm.

[Evaluation Results]

The results of the above evaluations are shown in Table 1. Incidentally, the content of each of the metal elements in the treatment liquids and the content of each of the metal particles in the treatment liquids are shown in Table 1-2.

TABLE 1

| Table 1-1 | Organic solvent [% by mass] | | | | | Content [ppt] of metal component in treatment liquid | Content [ppt] of metal particles in treatment liquid |
|---|---|---|---|---|---|---|---|
| | Ethers | | Ketones | | Lactones | Total | Total |
| | PGMEA | PGME | MEK | MPK | γBL | | |
| Example 1 | Residue | | | | | 30.14 | 3.35 |
| Example 2 | | Residue | | | | 27.39 | 3.04 |
| Example 3 | 30 | Residue | | | | 26.62 | 2.96 |
| Example 4 | 30 | Residue | | | | 26.62 | 2.96 |
| Example 5 | 30 | Residue | | | | 26.62 | 2.96 |
| Example 6 | 30 | Residue | | | | 251.68 | 25.52 |
| Example 7 | 30 | Residue | | | | 9900.00 | 1056.00 |
| Example 8 | 80 | Residue | | | | 29.70 | 3.30 |
| Example 9 | 60 | Residue | | | | 25.80 | 2.87 |
| Example 10 | 30 | Residue | | | | 24.50 | 2.72 |
| Example 11 | 29 | Residue | | | 1 | 23.20 | 2.58 |
| Example 12 | 25 | Residue | | | 5 | 31.00 | 3.44 |
| Example 13 | | Residue | 5 | | 5 | 37.50 | 4.17 |
| Example 14 | | Residue | 5 | | 30 | 38.80 | 4.31 |
| Example 15 | | Residue | 5 | | | 27.10 | 3.01 |
| Example 16 | 30 | Residue | | | | 2.04 | 0.0132 |
| Example 17 | 30 | Residue | | | | 0.05 | 0.0020 |
| Example 18 | Residue | | | | | 25.80 | 2.87 |
| Example 19 | Residue | | | | | 23.20 | 2.58 |
| Example 20 | Residue | | | | | 21.90 | 2.43 |
| Example 21 | Residue | | | | | 25.80 | 2.87 |
| Example 22 | Residue | | | | | 24.50 | 2.72 |
| Comparative Example 1 | 30 | Residue | | | | 26.62 | 2.42 |
| Comparative Example 2 | 30 | Residue | | | | 26.62 | 2.53 |
| Comparative Example 3 | 30 | Residue | | | | 13000.00 | 1590.00 |
| Comparative Example 4 | 30 | Residue | | | | 0.00065 | 0.00017 |
| Comparative Example 5 | 30 | Residue | | | | 0.0050 | 0.00010 |

| Table 1-1 | Content of water in treatment liquid | Content (ppb) of alkenes in treatment liquid | Content (ppb) of acid component in treatment liquid | Evaluation results | | |
|---|---|---|---|---|---|---|
| | | | | Wettability | Corrosion resistance | Defects |
| Example 1 | 150 ppb | 12 | Not detected | A | A | A |
| Example 2 | 150 ppb | 10 | Not detected | A | A | A |
| Example 3 | 150 ppb | 11 | Not detected | A | A | A |
| Example 4 | 20 ppm | 15 | Not detected | A | C | A |
| Example 5 | 7.5 ppm | 18 | Not detected | A | B | A |

TABLE 1-continued

| | | | | | | | |
|---|---|---|---|---|---|---|---|
| Example 6 | 7.5 ppm | 25 | Not detected | A | B | B | |
| Example 7 | 7.5 ppm | 35 | Not detected | A | B | B | |
| Example 8 | 150 ppb | 13 | Not detected | A | A | A | |
| Example 9 | 150 ppb | 10 | Not detected | A | A | A | |
| Example 10 | 150 ppb | 11 | Not detected | A | A | A | |
| Example 11 | 150 ppb | 16 | Not detected | A | A | A | |
| Example 12 | 150 ppb | 15 | Not detected | A | A | A | |
| Example 13 | 150 ppb | 14 | 10 | A | A | B | |
| Example 14 | 150 ppb | 13 | 150 | A | A | C | |
| Example 15 | 150 ppb | 12 | Not detected | A | A | B | |
| Example 16 | 150 ppb | 21 | Not detected | A | A | B | |
| Example 17 | 150 ppb | 12 | Not detected | A | A | B | |
| Example 18 | 150 ppb | 80 | Not detected | A | A | B | |
| Example 19 | 150 ppb | 0.5 | Not detected | A | A | A | |
| Example 20 | 150 ppb | 16 | Not detected | A | A | A | |
| Example 21 | 150 ppb | 150 | Not detected | A | A | C | |
| Example 22 | 150 ppb | 0.05 | Not detected | A | A | C | |
| Comparative Example 1 | 50 ppb | 12 | Not detected | B | A | D | |
| Comparative Example 2 | 150 ppm | 15 | Not detected | A | D | A | |
| Comparative Example 3 | 150 ppb | 14 | Not detected | A | A | D | |
| Comparative Example 4 | 150 ppb | 13 | Not detected | A | A | D | |
| Comparative Example 5 | 150 ppb | 12 | Not detected | A | A | D | |

TABLE 2

| | Content [ppt] of metal component in treatment liquid | | | | | | |
|---|---|---|---|---|---|---|---|
| Table 1-2 | Na | K | Ca | Fe | Cu | Mg | Mn |
| Example 1 | 1.00 | 2.10 | 2.20 | 1.30 | 1.40 | 1.50 | 3.60 |
| Example 2 | 1.10 | 1.10 | 1.30 | 2.60 | 2.10 | 3.60 | 2.70 |
| Example 3 | 1.50 | 1.30 | 2.10 | 3.90 | 1.40 | 2.20 | 2.20 |
| Example 4 | 1.50 | 1.30 | 2.10 | 3.90 | 1.40 | 2.20 | 2.20 |
| Example 5 | 1.50 | 1.30 | 2.10 | 3.90 | 1.40 | 2.20 | 2.20 |
| Example 6 | 38.00 | 23.00 | 11.00 | 49.00 | 11.00 | 17.00 | 12.00 |
| Example 7 | 750.00 | 750.00 | 750.00 | 750.00 | 750.00 | 750.00 | 750.00 |
| Example 8 | 1.80 | 2.90 | 3.00 | 2.10 | 2.20 | 2.30 | 1.60 |
| Example 9 | 1.50 | 2.60 | 2.70 | 1.80 | 1.90 | 2.00 | 1.30 |
| Example 10 | 1.40 | 2.50 | 2.60 | 1.70 | 1.80 | 1.90 | 1.20 |
| Example 11 | 1.30 | 2.40 | 2.50 | 1.60 | 1.70 | 1.80 | 1.10 |
| Example 12 | 1.90 | 3.00 | 3.10 | 2.20 | 2.30 | 2.40 | 1.70 |
| Example 13 | 2.40 | 3.50 | 3.60 | 2.70 | 2.80 | 2.90 | 2.20 |
| Example 14 | 2.50 | 3.60 | 3.70 | 2.80 | 2.90 | 3.00 | 2.30 |
| Example 15 | 1.60 | 2.70 | 2.80 | 1.90 | 2.00 | 2.10 | 1.40 |
| Example 16 | 0.05 | 0.05 | 0.05 | 1.30 | 0.05 | 0.05 | 0.05 |
| Example 17 | Not detected | Not detected | Not detected | 0.05 | Not detected | Not detected | Not detected |
| Example 18 | 1.50 | 2.60 | 2.70 | 1.80 | 1.90 | 2.00 | 1.30 |
| Example 19 | 1.30 | 2.40 | 2.50 | 1.60 | 1.70 | 1.80 | 1.10 |
| Example 20 | 1.20 | 2.30 | 2.40 | 1.50 | 1.60 | 1.70 | 1.00 |
| Example 21 | 1.50 | 2.60 | 2.70 | 1.80 | 1.90 | 2.00 | 1.30 |
| Example 22 | 1.40 | 2.50 | 2.60 | 1.70 | 1.80 | 1.90 | 1.20 |
| Comparative Example 1 | 1.50 | 1.30 | 2.10 | 3.90 | 1.40 | 2.20 | 2.20 |
| Comparative Example 2 | 1.50 | 1.30 | 2.10 | 3.90 | 1.40 | 2.20 | 2.20 |
| Comparative Example 3 | 1000.00 | 1000.00 | 1000.00 | 1000.00 | 1000.00 | 1000.00 | 1000.00 |
| Comparative Example 4 | 0.00005 | 0.00005 | 0.00005 | 0.00005 | 0.00005 | 0.00005 | 0.00005 |
| Comparative Example 5 | Not detected | Not detected | Not detected | 0.0050 | Not detected | Not detected | Not detected |

| | Content [ppt] of metal component in treatment liquid | | | | | | |
|---|---|---|---|---|---|---|---|
| Table 1-2 | Li | Al | Cr | Ni | Zn | Ti | Total |
| Example 1 | 2.70 | 1.80 | 2.90 | 3.50 | 3.40 | 2.74 | 30.14 |
| Example 2 | 2.90 | 2.30 | 1.10 | 1.10 | 3.00 | 2.49 | 27.39 |
| Example 3 | 2.10 | 1.30 | 3.40 | 1.40 | 1.40 | 2.42 | 26.62 |
| Example 4 | 2.10 | 1.30 | 3.40 | 1.40 | 1.40 | 2.42 | 26.62 |
| Example 5 | 2.10 | 1.30 | 3.40 | 1.40 | 1.40 | 2.42 | 26.62 |

TABLE 2-continued

| | | | | | | | |
|---|---|---|---|---|---|---|---|
| Example 6 | 3.80 | 12.00 | 5.00 | 38.00 | 9.00 | 22.88 | 251.68 |
| Example 7 | 750.00 | 750.00 | 750.00 | 750.00 | 750.00 | 900.00 | 9900.00 |
| Example 8 | 1.80 | 2.10 | 1.80 | 1.80 | 3.00 | 3.30 | 29.70 |
| Example 9 | 1.50 | 1.80 | 1.50 | 1.50 | 2.70 | 3.00 | 25.80 |
| Example 10 | 1.40 | 1.70 | 1.40 | 1.40 | 2.60 | 2.90 | 24.50 |
| Example 11 | 1.30 | 1.60 | 1.30 | 1.30 | 2.50 | 2.80 | 23.20 |
| Example 12 | 1.90 | 2.20 | 1.90 | 1.90 | 3.10 | 3.40 | 31.00 |
| Example 13 | 2.40 | 2.70 | 2.40 | 2.40 | 3.60 | 3.90 | 37.50 |
| Example 14 | 2.50 | 2.80 | 2.50 | 2.50 | 3.70 | 4.00 | 38.80 |
| Example 15 | 1.60 | 1.90 | 1.60 | 1.60 | 2.80 | 3.10 | 27.10 |
| Example 16 | 0.05 | 0.05 | 0.05 | 0.05 | 0.05 | 0.19 | 2.04 |
| Example 17 | Not detected | Not detected | Not detected | Not detected | Not detected | Not detected | 0.05 |
| Example 18 | 1.50 | 1.80 | 1.50 | 1.50 | 2.70 | 3.00 | 25.80 |
| Example 19 | 1.30 | 1.60 | 1.30 | 1.30 | 2.50 | 2.80 | 23.20 |
| Example 20 | 1.20 | 1.50 | 1.20 | 1.20 | 2.40 | 2.70 | 21.90 |
| Example 21 | 1.50 | 1.80 | 1.50 | 1.50 | 2.70 | 3.00 | 25.80 |
| Example 22 | 1.40 | 1.70 | 1.40 | 1.40 | 2.60 | 2.90 | 24.50 |
| Comparative Example 1 | 2.10 | 1.30 | 3.40 | 1.40 | 1.40 | 2.42 | 26.62 |
| Comparative Example 2 | 2.10 | 1.30 | 3.40 | 1.40 | 1.40 | 2.42 | 26.62 |
| Comparative Example 3 | 1000.00 | 1000.00 | 1000.00 | 1000.00 | 1000.00 | 1000.00 | 13000.00 |
| Comparative Example 4 | 0.00005 | 0.00005 | 0.00005 | 0.00005 | 0.00005 | 0.00005 | 0.00065 |
| Comparative Example 5 | Not detected | Not detected | Not detected | Not detected | Not detected | Not detected | 0.0050 |

TABLE 3

| | Content [ppt] of metal particles in treatment liquid | | | | | | | |
|---|---|---|---|---|---|---|---|---|
| Table 1-3 | Na | K | Ca | Fe | Cu | Mg | Mn | Li |
| Example 1 | 0.11 | 0.23 | 0.24 | 0.14 | 0.16 | 0.17 | 0.40 | 0.30 |
| Example 2 | 0.12 | 0.12 | 0.14 | 0.29 | 0.23 | 0.40 | 0.30 | 0.32 |
| Example 3 | 0.17 | 0.14 | 0.23 | 0.43 | 0.16 | 0.24 | 0.24 | 0.23 |
| Example 4 | 0.17 | 0.14 | 0.23 | 0.43 | 0.16 | 0.24 | 0.24 | 0.23 |
| Example 5 | 0.17 | 0.14 | 0.23 | 0.43 | 0.16 | 0.24 | 0.24 | 0.23 |
| Example 6 | 4.10 | 2.20 | 1.00 | 5.30 | 1.20 | 1.50 | 0.90 | 0.40 |
| Example 7 | 80.00 | 80.00 | 80.00 | 80.00 | 80.00 | 80.00 | 80.00 | 80.00 |
| Example 8 | 0.20 | 0.32 | 0.33 | 0.23 | 0.24 | 0.26 | 0.18 | 0.20 |
| Example 9 | 0.17 | 0.29 | 0.30 | 0.20 | 0.21 | 0.22 | 0.14 | 0.17 |
| Example 10 | 0.16 | 0.28 | 0.29 | 0.19 | 0.20 | 0.21 | 0.13 | 0.16 |
| Example 11 | 0.14 | 0.27 | 0.28 | 0.18 | 0.19 | 0.20 | 0.12 | 0.14 |
| Example 12 | 0.21 | 0.33 | 0.34 | 0.24 | 0.26 | 0.27 | 0.19 | 0.21 |
| Example 13 | 0.27 | 0.39 | 0.40 | 0.30 | 0.31 | 0.32 | 0.24 | 0.27 |
| Example 14 | 0.28 | 0.40 | 0.41 | 0.31 | 0.32 | 0.33 | 0.26 | 0.28 |
| Example 15 | 0.18 | 0.30 | 0.31 | 0.21 | 0.22 | 0.23 | 0.16 | 0.18 |
| Example 16 | 0.0010 | 0.0010 | 0.0010 | 0.0010 | 0.0010 | 0.0010 | 0.0010 | 0.0010 |
| Example 17 | Not detected | Not detected | Not detected | 0.0020 | Not detected | Not detected | Not detected | Not detected |
| Example 18 | 0.17 | 0.29 | 0.30 | 0.20 | 0.21 | 0.22 | 0.14 | 0.17 |
| Example 19 | 0.14 | 0.27 | 0.28 | 0.18 | 0.19 | 0.20 | 0.12 | 0.14 |
| Example 20 | 0.13 | 0.26 | 0.27 | 0.17 | 0.18 | 0.19 | 0.11 | 0.13 |
| Example 21 | 0.17 | 0.29 | 0.30 | 0.20 | 0.21 | 0.22 | 0.14 | 0.17 |
| Example 22 | 0.16 | 0.28 | 0.29 | 0.19 | 0.20 | 0.21 | 0.13 | 0.16 |
| Comparative Example 1 | 0.10 | 0.10 | 0.20 | 0.50 | 0.10 | 0.20 | 0.20 | 0.20 |
| Comparative Example 2 | 0.10 | 0.10 | 0.20 | 0.50 | 0.10 | 0.20 | 0.30 | 0.20 |
| Comparative Example 3 | 120.00 | 110.00 | 80.00 | 160.00 | 120.00 | 130.00 | 110.00 | 90.00 |
| Comparative Example 4 | 0.00001 | 0.00001 | 0.00001 | 0.00001 | 0.00001 | 0.00001 | 0.00001 | 0.00001 |
| Comparative Example 5 | Not detected | Not detected | Not detected | 0.00010 | Not detected | Not detected | Not detected | Not detected |

| | Content [ppt] of metal particles in treatment liquid | | | | | |
|---|---|---|---|---|---|---|
| Table 1-3 | Al | Cr | Ni | Zn | Ti | Total |
| Example 1 | 0.20 | 0.32 | 0.39 | 0.38 | 0.30 | 3.35 |
| Example 2 | 0.26 | 0.12 | 0.12 | 0.33 | 0.28 | 3.04 |
| Example 3 | 0.14 | 0.38 | 0.16 | 0.16 | 0.27 | 2.96 |
| Example 4 | 0.14 | 0.38 | 0.16 | 0.16 | 0.27 | 2.96 |

TABLE 3-continued

| | | | | | | |
|---|---|---|---|---|---|---|
| Example 5 | 0.14 | 0.38 | 0.16 | 0.16 | 0.27 | 2.96 |
| Example 6 | 1.10 | 0.40 | 4.30 | 0.80 | 2.32 | 25.52 |
| Example 7 | 80.00 | 80.00 | 80.00 | 80.00 | 96.00 | 1056.00 |
| Example 8 | 0.23 | 0.20 | 0.20 | 0.33 | 0.37 | 3.30 |
| Example 9 | 0.20 | 0.17 | 0.17 | 0.30 | 0.33 | 2.87 |
| Example 10 | 0.19 | 0.16 | 0.16 | 0.29 | 0.32 | 2.72 |
| Example 11 | 0.18 | 0.14 | 0.14 | 0.28 | 0.31 | 2.58 |
| Example 12 | 0.24 | 0.21 | 0.21 | 0.34 | 0.38 | 3.44 |
| Example 13 | 0.30 | 0.27 | 0.27 | 0.40 | 0.43 | 4.17 |
| Example 14 | 0.31 | 0.28 | 0.28 | 0.41 | 0.44 | 4.31 |
| Example 15 | 0.21 | 0.18 | 0.18 | 0.31 | 0.34 | 3.01 |
| Example 16 | 0.0010 | 0.0010 | 0.0010 | 0.0010 | 0.0012 | 0.0132 |
| Example 17 | Not detected | Not detected | Not detected | Not detected | Not detected | 0.0020 |
| Example 18 | 0.20 | 0.17 | 0.17 | 0.30 | 0.33 | 2.87 |
| Example 19 | 0.18 | 0.14 | 0.14 | 0.28 | 0.31 | 2.58 |
| Example 20 | 0.17 | 0.13 | 0.13 | 0.27 | 0.30 | 2.43 |
| Example 21 | 0.20 | 0.17 | 0.17 | 0.30 | 0.33 | 2.87 |
| Example 22 | 0.19 | 0.16 | 0.16 | 0.29 | 0.32 | 2.72 |
| Comparative Example 1 | 0.10 | 0.30 | 0.10 | 0.10 | 0.22 | 2.42 |
| Comparative Example 2 | 0.10 | 0.30 | 0.10 | 0.10 | 0.23 | 2.53 |
| Comparative Example 3 | 160.00 | 110.00 | 170.00 | 130.00 | 100.00 | 1590.00 |
| Comparative Example 4 | 0.00001 | 0.00001 | 0.00001 | 0.00001 | 0.00005 | 0.00017 |
| Comparative Example 5 | Not detected | Not detected | Not detected | Not detected | Not detected | 0.00010 |

As shown in Table 1, it was shown that in a case where the content of water in the treatment liquid is in the range of 100 ppb by mass to 100 ppm by mass and the content of the metal component in the treatment liquid is 10 ppq by mass to 10 ppb by mass, generation of defects of a semiconductor device could be suppressed, and thus, the corrosion resistance and the wettability of the treatment liquid are excellent (Examples).

Moreover, it could be seen that in a case where the treatment liquids of Examples are used as a rinsing liquid and a pre-wet liquid for a semiconductor device, the corrosion resistance and the wettability are excellent and generation of defects of a semiconductor device can be suppressed.

On the other hand, it was shown that in a case where the content of water in the treatment liquid is less than 100 ppb by mass, the wettability of the treatment liquid is deteriorated, and thus, generation of defects of a semiconductor device also becomes remarkable (Comparative Example 1).

Furthermore, it was shown that in a case where the content of water in the treatment liquid is more than 100 ppm by mass, the corrosion resistance of the treatment liquid is deteriorated (Comparative Example 2).

In addition, it was shown that in a case where the content of the metal component in the treatment liquid is out of the range of 10 ppq by mass to 10 ppb by mass, generation of defects of a semiconductor device becomes remarkable (Comparative Examples 3 to 5).

Next, by the method for preparing a treatment liquid described in Table 1, a treatment liquid A was obtained. The composition of the treatment liquid A is as shown in Table 2.

The obtained treatment liquid A was housed in each of the containers described in Table 2, and each of the containers was sealed. In this manner, the treatment liquid housing bodies of Examples 2-1 to 2-6, in which the treatment liquid A was housed in each of the containers was obtained.

Here, as the container used to house the treatment liquid A, a container in which a liquid contact portion inside the container (a region in which the inner wall of the container is in contact with the treatment liquid), quartz, polytetrafluoroethylene (PTFE), a copolymer of tetrafluoroethylene and perfluoroether (PFA), SUS316 (stainless steel material, the surface was electropolished), or SUS316 (stainless steel material, surface was buffed and then electropolished) was used.

For each of the treatment liquid housing bodies of Examples 2-2 to 2-5, after storage at room temperature (25° C.) for 30 days, the measurement of the content of the metal component in the treatment liquid, the measurement of the content of water in the treatment liquid, and various evaluation tests were performed in the same manner as for the treatment liquids described in Table 1. On the other hand, for the treatment liquid housing body of Example 2-1, the same measurement of the contents and the same evaluation tests as in Examples 2-2 to 2-6 were performed without storage.

The results of the evaluation tests described above are shown in Table 2 below.

TABLE 4

| Table 2 | Organic solvent [% by mass] Ethers | | Content [ppt] of metal component in treatment liquid | | | | | | | | | | |
|---|---|---|---|---|---|---|---|---|---|---|---|---|---|
| | PGMEA | PGME | Na | K | Ca | Fe | Cu | Mg | Mn | Li | Al | Cr | Ni |
| Example 2-1 | 30 | Residue | 1.50 | 1.30 | 2.10 | 3.90 | 1.40 | 2.20 | 2.20 | 2.10 | 1.30 | 3.40 | 1.40 |
| Example 2-2 | 30 | Residue | 1.30 | 1.90 | 2.10 | 1.60 | 1.30 | 1.60 | 3.90 | 2.10 | 2.60 | 2.80 | 3.70 |
| Example 2-3 | 30 | Residue | 2.90 | 2.30 | 2.30 | 1.40 | 1.30 | 1.40 | 3.50 | 2.60 | 2.60 | 3.10 | 3.40 |

TABLE 4-continued

| | | | | | | | | | | | | | | |
|---|---|---|---|---|---|---|---|---|---|---|---|---|---|---|
| Example 2-4 | 30 | Residue | 1.60 | 1.70 | 1.90 | 1.40 | 1.40 | 1.60 | 3.70 | 2.50 | 2.70 | 2.70 | 3.50 |
| Example 2-5 | 30 | Residue | 11.70 | 21.30 | 23.30 | 216.10 | 39.20 | 11.30 | 13.50 | 3.90 | 78.30 | 29.60 | 283.10 |
| Example 2-6 | 30 | Residue | 1.80 | 1.90 | 2.30 | 2.20 | 2.10 | 1.40 | 3.50 | 2.50 | 2.60 | 3.90 | 4.30 |

| Table 2 | Content [ppt] of metal component in treatment liquid | | | Content of water in treatment liquid | Material of liquid contact portion of container | Time passing after charge | Evaluation results | | |
|---|---|---|---|---|---|---|---|---|---|
| | Zn | Ti | Total | | | | Wettability | Corrosion resistance | Defects |
| Example 2-1 | 1.40 | 2.6 | 26.84 | 150 ppb | Quartz | Immediately after charge | A | A | A |
| Example 2-2 | 3.30 | 1.9 | 30.12 | 20 ppm | Quartz | 30 days | A | C | A |
| Example 2-3 | 2.90 | 1.7 | 31.38 | 20 ppm | PTFE | 30 days | A | C | A |
| Example 2-4 | 3.30 | 1.9 | 29.92 | 20 ppm | PFA | 30 days | A | C | A |
| Example 2-5 | 109.30 | 13.6 | 854.16 | 20 ppm | SUS316 (electropolished) | 30 days | A | C | B |
| Example 2-6 | 3.30 | 1.7 | 33.48 | 20 ppm | SUS316 (buffed and then electropolished) | 30 days | A | C | A |

As shown in Table 2, it was shown that in a case of using quartz, a fluorine resin (PFA and PTFE), or a metal material which has been buffed and then electropolished for the liquid contact portion (Examples 2-2 to 2-4, and 2-6), an increase in the content of the metal component after long-term storage of the treatment liquid can be suppressed, as compared with a case of using a metal material which had been subjected to an electropolishing treatment while not being polished (Example 2-5).

[Pre-Wet Performance]

For suitability of the resist composition of the treatment liquid as a pre-wet liquid, the resist saving properties of the resist composition after application of the treatment liquid were evaluated. A case where the resist film has excellent resist saving properties indicates that the treatment liquid is suitable as the pre-wet liquid. Incidentally, in the present specification, the expression, having excellent resist saving properties, is intended to mean a state where the uniformity is excellent and the film thickness controlling properties are excellent.

<Uniformity>

First, as a control, the following resist composition 1 was directly applied onto a silicon wafer with a diameter of about 30 cm (12 inches) comprising an antireflection film. Further, a spin coater (trade name "LITHIUS", manufactured by Tokyo Electron Limited) was used for the application. The obtained resist film was baked at 90° C. For the resist film after baking, 59 points were map-measured using a measurement device for a film thickness, Lambda Ace, manufactured by Dainippon Screen Mfg. Co., Ltd., and it was thus confirmed that coating unevenness did not occur. Incidentally, the coating unevenness is intended to mean a state where in a case where 59 measurement points are extracted in a circular pattern from a resist film to be measured and the measurement results for the thickness of the resist film at each of the measurement points are observed, with the measurement points being two-dimensionally arranged, there is no deviation in the thickness of the resist film.

Next, another silicon wafer with a diameter of about 30 cm (12 inches), comprising an antireflection film, was prepared, and each of the treatment liquids of Examples 1 to 3 and Comparative Examples 1 to 5 was added dropwise thereto. Thereafter, the resist composition was applied onto the silicon wafer in the same amount as the control and baked at 90° C. The obtained resist film was observed in the same manner as described above, and it was confirmed that coating unevenness did not occur. Next, the amount of the resist composition to be used was reduced to 50% by mass and 30% by mass, with respect to the control, and the same test as above was performed to investigate whether coating unevenness occurs.

The results were evaluated by the following standard and the results are shown in Table 3.

A: Even in a case where the amount of the resist composition to be used was reduced to any of 50% by mass and 30% by mass with respect to the control, coating unevenness did not occur.

B: Even in a case where the amount of the resist composition to be used was reduced to 50% by mass with respect to the control, coating unevenness did not occur, but in a case where the amount was reduced to 30% by mass, coating unevenness occurred.

C: In a case where the amount of the resist composition to be used was reduced to any of 30% by mass and 50% by mass, with respect to the control, coating unevenness occurs.

(Resist Composition 1)

Acid-decomposable resin (resin represented by the following formula (weight-average molecular weight (Mw): 7,500): the numerical values described in the respective repeating units mean % by mole): 100 parts by mass

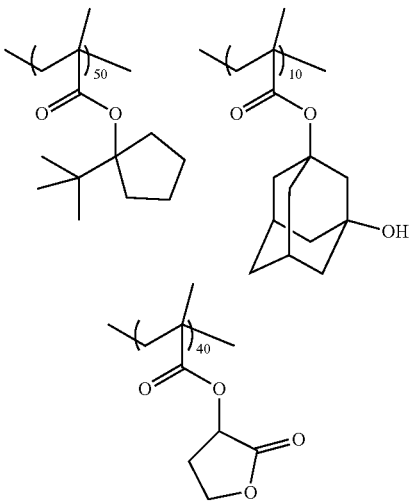

Photoacid generator shown below: 8 parts by mass

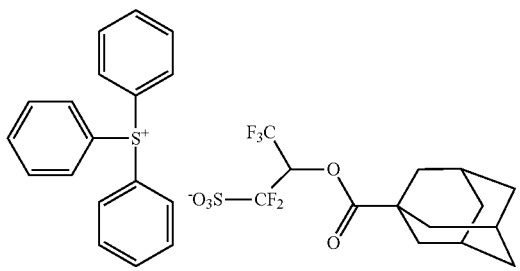

Quencher shown below: 5 parts by mass (the mass ratio is 1:3:3:2 in order from the left)

Furthermore, among the following quenchers, the quenchers of polymer types have a weight-average molecular weight (Mw) of 5,000. In addition, the numerical values described in the respective repeating units mean a molar ratio.

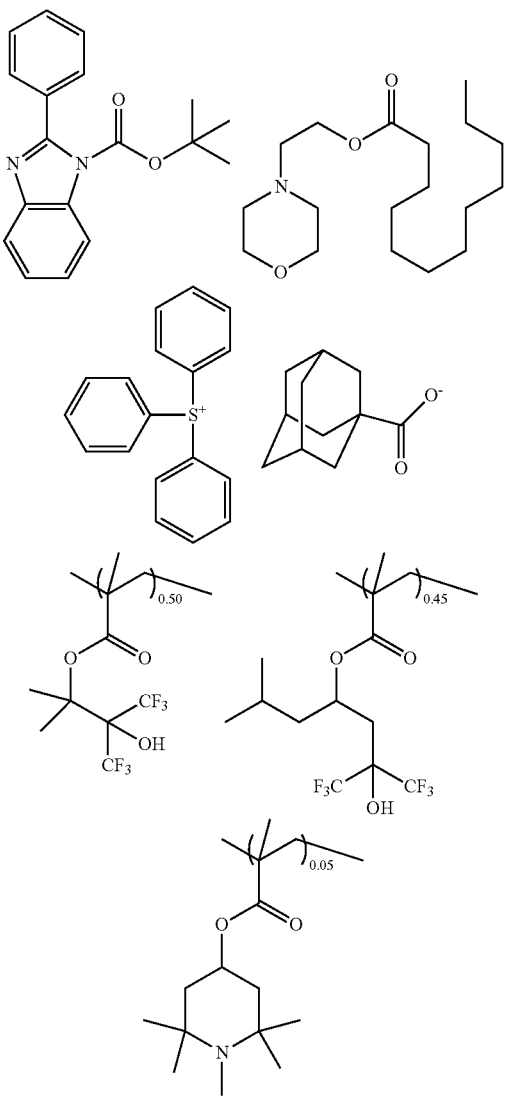

Hydrophobic resins shown below: 4 parts by mass (the mass ratio is 0.5:0.5 in order from the left.) Further, among the following hydrophobic resins, the hydrophobic resin on the left side has a weight-average molecular weight (Mw) of 7,000 and the hydrophobic resin on the right side has a weight-average molecular weight (Mw) of 8,000. In addition, in the respective hydrophobic resin, the numerical values described in the respective repeating units mean a molar ratio.

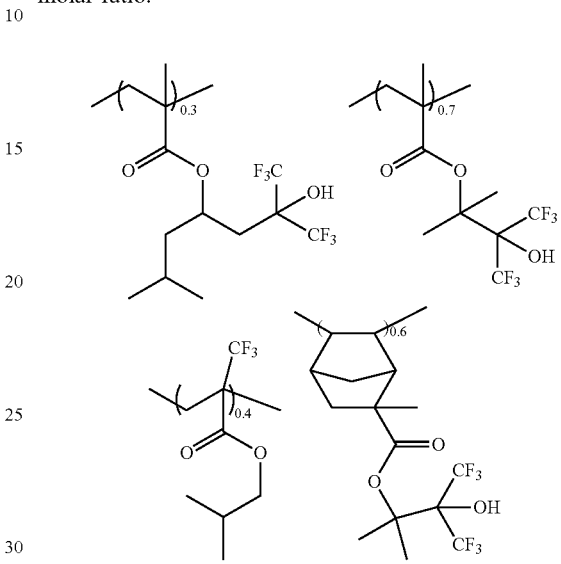

Solvent:
PGMEA: 3 parts by mass
CyHe: 600 parts by mass
γBL: 100 parts by mass

<Film Thickness Controlling Properties>

Each of the treatment liquids of Examples 1 to 3 and Comparative Examples 1 to 5 was added dropwise onto a silicon wafer with a diameter of about 30 cm (12 inches), comprising an antireflection film. Thereafter, the resist composition 1 used for the test on uniformity was directly applied thereonto such that the thickness of the obtained resist film became 8.5 nm. Further, a spin coater (trade name "LITHIUS", manufactured by Tokyo Electron Limited) was used for the application. The obtained resist film was baked at 90° C. For the resist film after baking, 59 points were map-measured using a measurement device for a film thickness, Lambda Ace, manufactured by Dainippon Screen Mfg. Co., Ltd., and the standard deviation (hereinafter also referred to as "σ") of the thickness of the resist film was determined. Next, 3σ was determined from the standard deviation.

The results were evaluated by the following standard and shown in Table 3.
A: 3σ was less than 0.15 nm.
B: 3σ was 0.15 nm or more and less than 0.2 nm.
C: 3σ was 0.2 nm or more.

TABLE 5

| Table 3 | Evaluation results of pre-wet performance | |
|---|---|---|
| | Uniformity | Film thickness controlling properties |
| Example 1 | A | A |
| Example 2 | A | A |

TABLE 5-continued

| Table 3 | Evaluation results of pre-wet performance | |
|---|---|---|
| | Uniformity | Film thickness controlling properties |
| Example 3 | A | A |
| Comparative Example 1 | C | C |
| Comparative Example 2 | B | C |
| Comparative Example 3 | B | C |
| Comparative Example 4 | B | C |
| Comparative Example 5 | B | C |

As shown in Table 3, it was shown that the treatment liquids of Examples can be suitably used as a pre-wet liquid of the resist film.

EXPLANATION OF REFERENCES 100, 200 production device
101 tank
102 supply port
103, 106, 107 valves
104 pump
105 filtering device
108 container
109 supply conduit
110 circulation conduit
111 discharge unit
112 washing liquid monitoring unit
113 conduit
201 distillation column
202, 203, 204 conduits
205, 206, 207 valves

What is claimed is:

1. A treatment liquid for a semiconductor device, comprising:
    at least one organic solvent selected from the group consisting of ethers, ketones, and lactones;
    water; and
    a metal component including at least one metal element selected from the group consisting of Na, K, Ca, Fe, Cu, Mg, Mn, Li, Al, Cr, Ni, Ti, and Zn,
    wherein the content of the water in the treatment liquid is 100 ppb by mass to 100 ppm by mass,
    the content of the metal component in the treatment liquid is 10 ppq by mass to 10 ppb by mass, and
    the treatment liquid satisfies at least one of the following conditions (A) and (B):
    condition (A): the organic solvent includes ethers, and the treatment liquid further includes alkenes, wherein the content of the alkenes in the treatment liquid is 0.1 ppb by mass to 100 ppb by mass,
    condition (B): the organic solvent includes lactones, and the treatment liquid further includes at least one acid component selected from an inorganic acid or an organic acid, wherein the content of the acid component in the treatment liquid is 0.1 ppb by mass to 100 ppb by mass.

2. The treatment liquid according to claim 1,
    wherein the metal component includes a particulate metal component, and
    the content of the particulate metal component in the treatment liquid is 1 ppq by mass to 1 ppb by mass.

3. The treatment liquid according to claim 2, which is used in at least one of a rinsing liquid or a pre-wet liquid.

4. The treatment liquid according to claim 3,
    wherein the ethers are at least one selected from the group consisting of diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate.

5. The treatment liquid according to claim 2,
    wherein the ethers are at least one selected from the group consisting of diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate.

6. The treatment liquid according to claim 2,
    wherein the ketones are at least one selected from the group consisting of methyl ethyl ketone, cyclohexanone, cyclopentanone, 2-heptanone, 3-heptanone, 4-heptanone, N-methyl-2-pyrrolidone, methyl propyl ketone, methyl-n-butyl ketone, and methyl isobutyl ketone.

7. The treatment liquid according to claim 1, which is used in at least one of a rinsing liquid or a pre-wet liquid.

8. The treatment liquid according to claim 7,
    wherein the ethers are at least one selected from the group consisting of diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate.

9. The treatment liquid according to claim 7,
    wherein the ketones are at least one selected from the group consisting of methyl ethyl ketone, cyclohexanone, cyclopentanone, 2-heptanone, 3-heptanone, 4-heptanone, N-methyl-2-pyrrolidone, methyl propyl ketone, methyl-n-butyl ketone, and methyl isobutyl ketone.

10. The treatment liquid according to claim 1,
    wherein the ethers are at least one selected from the group consisting of diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate.

11. The treatment liquid according to claim 10,
    wherein the ketones are at least one selected from the group consisting of methyl ethyl ketone, cyclohexanone, cyclopentanone, 2-heptanone, 3-heptanone, 4-heptanone, N-methyl-2-pyrrolidone, methyl propyl ketone, methyl-n-butyl ketone, and methyl isobutyl ketone.

12. The treatment liquid according to claim 1,
wherein the ketones are at least one selected from the group consisting of methyl ethyl ketone, cyclohexanone, cyclopentanone, 2-heptanone, 3-heptanone, 4-heptanone, N-methyl-2-pyrrolidone, methyl propyl ketone, methyl-n-butyl ketone, and methyl isobutyl ketone.

13. The treatment liquid according to claim 1,
wherein the lactones are at least one selected from the group consisting of β-propiolactone, γ-butyrolactone, γ-valerolactone, δ-valerolactone, γ-caprolactone, and ε-caprolactone.

14. The treatment liquid according to claim 1,
wherein the content of the water in the treatment liquid is 100 ppb by mass to 10 ppm by mass.

15. The treatment liquid according to claim 1,
wherein the content of the water in the treatment liquid is 100 ppb by mass to 1 ppm by mass.

16. The treatment liquid according to claim 1,
wherein the organic solvent includes at least ethers.

17. A treatment liquid housing body comprising:
a container; and
the treatment liquid according to claim 1 housed in the container.

18. The treatment liquid housing body according to claim 17,
wherein the inner wall of the container is formed of at least one material selected from a fluorine-based resin, quartz, or an electropolished metal material.

\* \* \* \* \*